(12) United States Patent
Wang et al.

(10) Patent No.: US 12,099,257 B2
(45) Date of Patent: Sep. 24, 2024

(54) OPTICAL PHOTOGRAPHING SYSTEM, IMAGE CAPTURING UNIT AND ELECTRONIC DEVICE

(71) Applicant: LARGAN PRECISION CO., LTD., Taichung (TW)

(72) Inventors: Jin Sen Wang, Taichung (TW); Kuo-Jui Wang, Taichung (TW); Kuan-Ting Yeh, Taichung (TW); Tzu-Chieh Kuo, Taichung (TW)

(73) Assignee: LARGAN PRECISION CO., LTD., Taichung (TW)

( * ) Notice: Subject to any disclaimer, the term of this patent is extended or adjusted under 35 U.S.C. 154(b) by 465 days.

(21) Appl. No.: 17/537,870

(22) Filed: Nov. 30, 2021

(65) Prior Publication Data

US 2023/0132957 A1 May 4, 2023

(30) Foreign Application Priority Data

Nov. 3, 2021 (TW) ................................ 110140912

(51) Int. Cl.
*G02B 9/64* (2006.01)
*G02B 13/00* (2006.01)
*H01L 27/146* (2006.01)

(52) U.S. Cl.
CPC ........... *G02B 9/64* (2013.01); *G02B 13/0045* (2013.01); *H01L 27/14627* (2013.01)

(58) Field of Classification Search
CPC .............................. G02B 13/0045; G02B 9/64
See application file for complete search history.

(56) References Cited

U.S. PATENT DOCUMENTS

| 2,596,799 | A | 5/1952 | Tillyer et al. |
| 10,151,901 | B1 | 12/2018 | Oinuma et al. |
| 10,254,515 | B1 | 4/2019 | Oinuma et al. |
| 2009/0226159 | A1 | 9/2009 | Sensui |
| 2011/0169974 | A1 | 7/2011 | Take et al. |
| 2016/0033742 | A1 | 2/2016 | Huang |
| 2016/0124191 | A1 | 5/2016 | Hashimoto |

(Continued)

FOREIGN PATENT DOCUMENTS

| CN | 109270663 A | 1/2019 |
| CN | 110412747 A | 11/2019 |

(Continued)

OTHER PUBLICATIONS

TW Office Action in Application No. 110140912 Dated Apr. 22, 2022.

*Primary Examiner* — Ephrem Z Mebrahtu
(74) *Attorney, Agent, or Firm* — Maschoff Brennan

(57) ABSTRACT

An optical photographing system includes seven lens elements which are, in order from an object side to an image side along an optical path: a first lens element, a second lens element, a third lens element, a fourth lens element, a fifth lens element, a sixth lens element and a seventh lens element. Each of the seven lens elements has an object-side surface facing toward the object side and an image-side surface facing toward the image side. The object-side surface of the sixth lens element is convex in a paraxial region thereof. At least one of the object-side surface and the image-side surface of at least one lens element of the optical photographing system has at least one inflection point.

22 Claims, 34 Drawing Sheets

(56) References Cited

U.S. PATENT DOCUMENTS

| | | |
|---|---|---|
| 2017/0003482 A1 | 1/2017 | Chen |
| 2017/0059827 A1 | 3/2017 | Kubota |
| 2018/0188493 A1 | 7/2018 | Huang |
| 2018/0348484 A1 | 12/2018 | Chen et al. |
| 2018/0364457 A1 | 12/2018 | Yao et al. |
| 2019/0025549 A1 | 1/2019 | Hsueh et al. |
| 2019/0025551 A1 | 1/2019 | Kuo |
| 2019/0094494 A1 | 3/2019 | Hsu et al. |
| 2019/0121069 A1 | 4/2019 | Oinuma et al. |
| 2019/0129140 A1 | 5/2019 | Oinuma et al. |
| 2019/0154972 A1 | 5/2019 | Zhang et al. |
| 2019/0154984 A1 | 5/2019 | Oinuma et al. |
| 2019/0179101 A1 | 6/2019 | Li et al. |
| 2019/0204551 A1 | 7/2019 | Oinuma et al. |
| 2019/0278063 A1 | 9/2019 | Sekine |
| 2019/0361196 A1 | 11/2019 | Chang et al. |
| 2019/0361202 A1 | 11/2019 | Chang et al. |
| 2020/0209561 A1 | 7/2020 | Ji et al. |
| 2020/0249434 A1 | 8/2020 | Lin et al. |
| 2020/0341242 A1 | 10/2020 | Tseng et al. |
| 2020/0371314 A1 | 11/2020 | Geng et al. |
| 2020/0379219 A1 | 12/2020 | Geng et al. |
| 2020/0409107 A1 | 12/2020 | Zhang et al. |
| 2021/0055515 A1 | 2/2021 | Dai et al. |
| 2021/0055516 A1 | 2/2021 | Dai et al. |
| 2021/0055517 A1* | 2/2021 | Li .......................... G02B 9/64 |
| 2021/0072514 A1* | 3/2021 | Jung ..................... G02B 7/021 |
| 2021/0088755 A1* | 3/2021 | Nitta ................. G02B 27/0025 |
| 2021/0149160 A1 | 5/2021 | Dong et al. |
| 2021/0199926 A1 | 7/2021 | Xu et al. |
| 2022/0066145 A1* | 3/2022 | Liao ................... G02B 13/0045 |
| 2022/0196982 A1 | 6/2022 | Tokuno et al. |
| 2022/0365316 A1* | 11/2022 | Jia ..................... G02B 13/0045 |
| 2022/0397742 A1* | 12/2022 | Zhang ..................... G02B 9/64 |

FOREIGN PATENT DOCUMENTS

| | | | | |
|---|---|---|---|---|
| CN | 110908093 A | | 3/2020 | |
| CN | 111208629 A | * | 5/2020 | ......... G02B 13/0045 |
| CN | 111552060 A | | 8/2020 | |
| CN | 111665612 A | | 9/2020 | |
| CN | 211454078 U | | 9/2020 | |
| CN | 211478744 U | | 9/2020 | |
| CN | 211786313 U | | 10/2020 | |
| CN | 112130280 A | | 12/2020 | |
| CN | 212391655 U | | 1/2021 | |
| CN | 112748543 A | | 5/2021 | |
| CN | 112925085 A | | 6/2021 | |
| CN | 213987000 U | | 8/2021 | |
| CN | 113985568 A | | 1/2022 | |
| WO | 2020191951 A1 | | 10/2020 | |
| WO | 2021142620 A1 | | 7/2021 | |
| WO | 2021184290 A1 | | 9/2021 | |

* cited by examiner

OPTICAL PHOTOGRAPHING SYSTEM, IMAGE CAPTURING UNIT AND ELECTRONIC DEVICE

RELATED APPLICATIONS

This application claims priority to Taiwan Application 110140912, filed on Nov. 3, 2021, which is incorporated by reference herein in its entirety.

BACKGROUND

Technical Field

The present disclosure relates to an optical photographing system, an image capturing unit and an electronic device, more particularly to an optical photographing system and an image capturing unit applicable to an electronic device.

Description of Related Art

With the development of semiconductor manufacturing technology, the performance of image sensors has improved, and the pixel size thereof has been scaled down. Therefore, featuring high image quality becomes one of the indispensable features of an optical system nowadays.

Furthermore, due to the rapid changes in technology, electronic devices equipped with optical systems are trending towards multi-functionality for various applications, and therefore the functionality requirements for the optical systems have been increasing. However, it is difficult for a conventional optical system to obtain a balance among the requirements such as high image quality, low sensitivity, a proper aperture size, miniaturization and a desirable field of view.

SUMMARY

According to one aspect of the present disclosure, an optical photographing system includes seven lens elements. The seven lens elements are, in order from an object side to an image side along an optical path, a first lens element, a second lens element, a third lens element, a fourth lens element, a fifth lens element, a sixth lens element and a seventh lens element. Each of the seven lens elements has an object-side surface facing toward the object side and an image-side surface facing toward the image side.

The object-side surface of the fourth lens element is concave in a paraxial region thereof, and the image-side surface of the fourth lens element is convex in a paraxial region thereof. The sixth lens element has positive refractive power, the object-side surface of the sixth lens element is convex in a paraxial region thereof, and the image-side surface of the sixth lens element is concave in a paraxial region thereof. The object-side surface of the seventh lens element is convex in a paraxial region thereof. At least one of the object-side surface and the image-side surface of at least one lens element of the optical photographing system has at least one inflection point.

When a central thickness of the fourth lens element is CT4, a central thickness of the fifth lens element is CT5, an axial distance between the fourth lens element and the fifth lens element is T45, an Abbe number of the second lens element is V2, an Abbe number of the third lens element is V3, an Abbe number of the sixth lens element is V6, and an Abbe number of the seventh lens element is V7, the following conditions are satisfied:

$4.0 < (CT4+CT5)/T45 < 90$; and $205.0 < V2+V3+V6+V7 < 260.0$.

According to one aspect of the present disclosure, an optical photographing system includes seven lens elements. The seven lens elements are, in order from an object side to an image side along an optical path, a first lens element, a second lens element, a third lens element, a fourth lens element, a fifth lens element, a sixth lens element and a seventh lens element. Each of the seven lens elements has an object-side surface facing toward the object side and an image-side surface facing toward the image side.

The object-side surface of the first lens element is convex in a paraxial region thereof. The object-side surface of the second lens element is convex in a paraxial region thereof. The image-side surface of the third lens element is convex in a paraxial region thereof. The object-side surface of the fourth lens element is concave in a paraxial region thereof, and the image-side surface of the fourth lens element is convex in a paraxial region thereof. The object-side surface of the fifth lens element is concave in a paraxial region thereof. The sixth lens element has positive refractive power, and the object-side surface of the sixth lens element is convex in a paraxial region thereof. The seventh lens element has negative refractive power, the object-side surface of the seventh lens element is convex in a paraxial region thereof, and the image-side surface of the seventh lens element is concave in a paraxial region thereof. At least one of the object-side surface and the image-side surface of at least one lens element of the optical photographing system has at least one inflection point.

When a central thickness of the fourth lens element is CT4, a central thickness of the fifth lens element is CT5, an axial distance between the fourth lens element and the fifth lens element is T45, a curvature radius of the object-side surface of the first lens element is R1, and a focal length of the optical photographing system is f, the following conditions are satisfied:

$4.0 < (CT4+CT5)/T45 < 90$; and $0.90 < |R1/f| < 40$.

According to one aspect of the present disclosure, an optical photographing system includes seven lens elements. The seven lens elements are, in order from an object side to an image side along an optical path, a first lens element, a second lens element, a third lens element, a fourth lens element, a fifth lens element, a sixth lens element and a seventh lens element. Each of the seven lens elements has an object-side surface facing toward the object side and an image-side surface facing toward the image side.

The second lens element has positive refractive power, and the object-side surface of the second lens element is convex in a paraxial region thereof. The fourth lens element has negative refractive power. The object-side surface of the sixth lens element is convex in a paraxial region thereof. The seventh lens element has negative refractive power. At least one of the object-side surface and the image-side surface of at least one lens element of the optical photographing system has at least one inflection point.

When a central thickness of the fourth lens element is CT4, a central thickness of the fifth lens element is CT5, an axial distance between the fourth lens element and the fifth lens element is T45, an Abbe number of the second lens element is V2, an Abbe number of the third lens element is V3, an Abbe number of the sixth lens element is V6, and an Abbe number of the seventh lens element is V7, the following conditions are satisfied:

0.70<(CT4+CT5)/T45<1.4; and 205.0<V2+V3+V6+V7<260.0.

According to another aspect of the present disclosure, an image capturing unit includes one of the aforementioned optical photographing systems and an image sensor, wherein the image sensor is disposed on an image surface of the optical photographing system.

According to another aspect of the present disclosure, an electronic device includes the aforementioned image capturing unit.

BRIEF DESCRIPTION OF THE DRAWINGS

The disclosure can be better understood by reading the following detailed description of the embodiments, with reference made to the accompanying drawings as follows.

DETAILED DESCRIPTION

Figure 1:
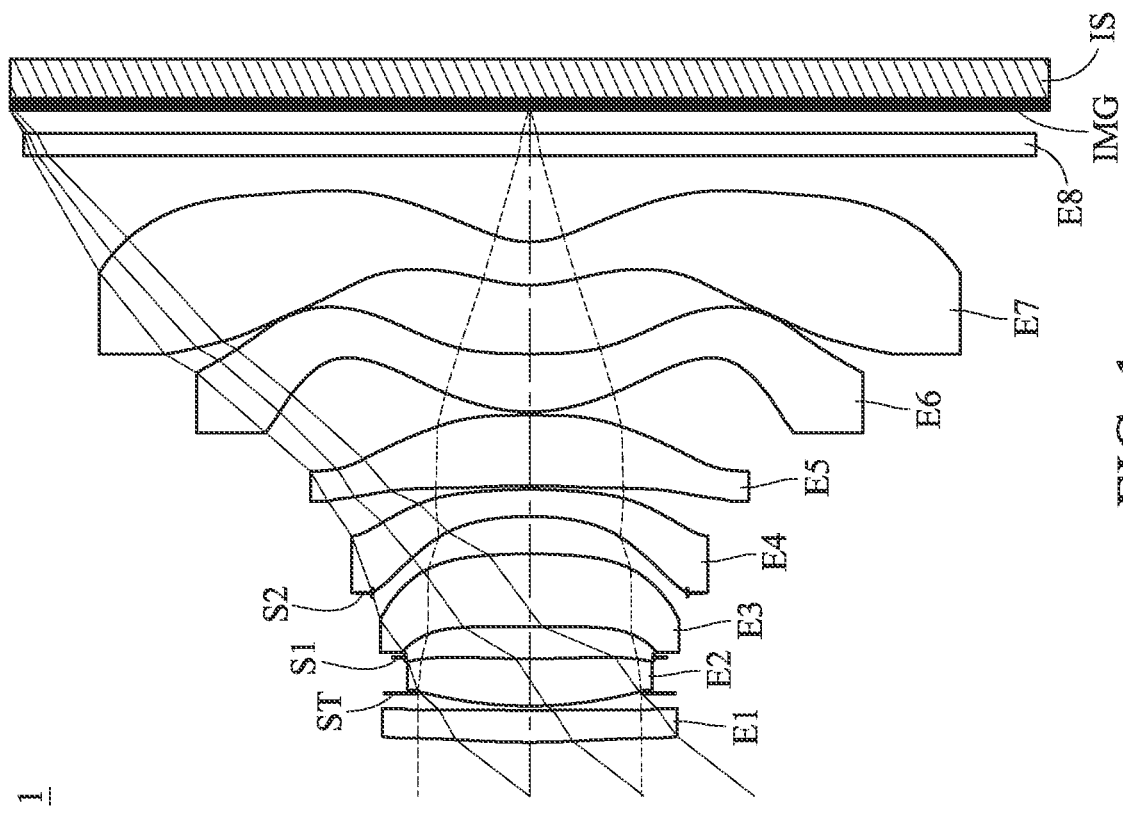
FIG. 1 is a schematic view of an image capturing unit according to the 1st embodiment of the present disclosure.

An optical photographing system includes seven lens elements. The seven lens elements are, in order from an object side to an image side along an optical path, a first lens element, a second lens element, a third lens element, a fourth lens element, a fifth lens element, a sixth lens element and a seventh lens element. Each of the seven lens elements has an object-side surface facing toward the object side and an image-side surface facing toward the image side.

The object-side surface of the first lens element can be convex in a paraxial region thereof. Therefore, it is favorable for adjusting the direction of incident light into the optical photographing system, thereby adjusting the field of view and the outer diameter at the object side thereof.

The second lens element can have positive refractive power. Therefore, it is favorable for properly distributing the refractive powers at the object side of the optical photographing system so as to obtain a balance between the size and image quality. The object-side surface of the second lens element can be convex in a paraxial region thereof. Therefore, it is favorable for adjusting the direction of light, thereby increasing aperture. The image-side surface of the second lens element can be concave in a paraxial region thereof. Therefore, it is favorable for adjusting the lens shape and the refractive power of the second lens element, thereby correcting aberrations such as astigmatism.

The third lens element can have positive refractive power. Therefore, it is favorable for miniaturizing the object side of the optical photographing system. The image-side surface of the third lens element can be convex in a paraxial region thereof. Therefore, it is favorable for adjusting the direction of light, thereby miniaturizing the object side of the optical photographing system and increasing the image surface.

The fourth lens element can have negative refractive power. Therefore, it is favorable for properly distributing the refractive powers between the object side and the image side of the optical photographing system so as to correct aberrations. The object-side surface of the fourth lens element can be concave in a paraxial region thereof. Therefore, it is favorable for adjusting the direction of light, thereby miniaturizing the object side of the optical photographing system. The image-side surface of the fourth lens element can be convex in a paraxial region thereof. Therefore, it is favorable for adjusting the direction of light, thereby increasing the image surface and image quality at the wide field of view.

The fifth lens element can have negative refractive power. Therefore, it is favorable for properly distributing the refractive powers at the image side of the optical photographing system so as to correct aberrations such as spherical aberration. The object-side surface of the fifth lens element can be concave in a paraxial region thereof. Therefore, it is favorable for adjusting the direction of light, thereby increasing the image surface and image quality at the wide field of view.

The sixth lens element can have positive refractive power. Therefore, it is favorable for miniaturizing the image side of the optical photographing system. The object-side surface of the sixth lens element is convex in a paraxial region thereof. Therefore, it is favorable for adjusting the lens shape and the refractive power of the sixth lens element, thereby reducing the size and correcting aberrations. The object-side surface of the sixth lens element can have at least one concave critical point in an off-axis region thereof. Therefore, it is favorable for adjusting the lens shape of the sixth lens element, thereby reducing surface reflection and correcting off-axis aberrations. The image-side surface of the sixth lens element can be concave in a paraxial region thereof. Therefore, it is favorable for reducing the total track length and correcting aberrations. The image-side surface of the sixth lens element can have at least one convex critical point in an off-axis region thereof. Therefore, it is favorable for adjusting the lens shape of the sixth lens element so as to correct off-axis aberrations such as field curvature. Moreover, when a vertical distance between a concave critical point on the object-side surface of the sixth lens element and an optical axis is Yc61, and a maximum effective radius of the object-side surface of the sixth lens element is Y61, at least one concave critical point on the object-side surface of the sixth lens element in the off-axis region can satisfy the following condition: 0.40<Yc61/Y61<0.85. Therefore, it is favorable for further adjusting the lens shape of the sixth lens element so as to correct aberrations. Moreover, when a vertical distance between a convex critical point on the image-side surface of the sixth lens element and the optical axis is Yc62, and a maximum effective radius of the image-side surface of the sixth lens element is Y62, at least one convex critical point on the image-side surface of the sixth lens element in the off-axis region can satisfy the following condition: 0.40<Yc62/Y62<0.85. Therefore, it is favorable for further adjusting the lens shape of the sixth lens element so as to correct aberrations. Please refer to FIG. 31, which shows a schematic view of Y61, Y62, Yc61, Yc62, the concave critical point C1 and the convex critical point C2 on the object-side surface and the image-side surface of the sixth lens element E6 according to the 1st embodiment of the present disclosure.

Figure 31:
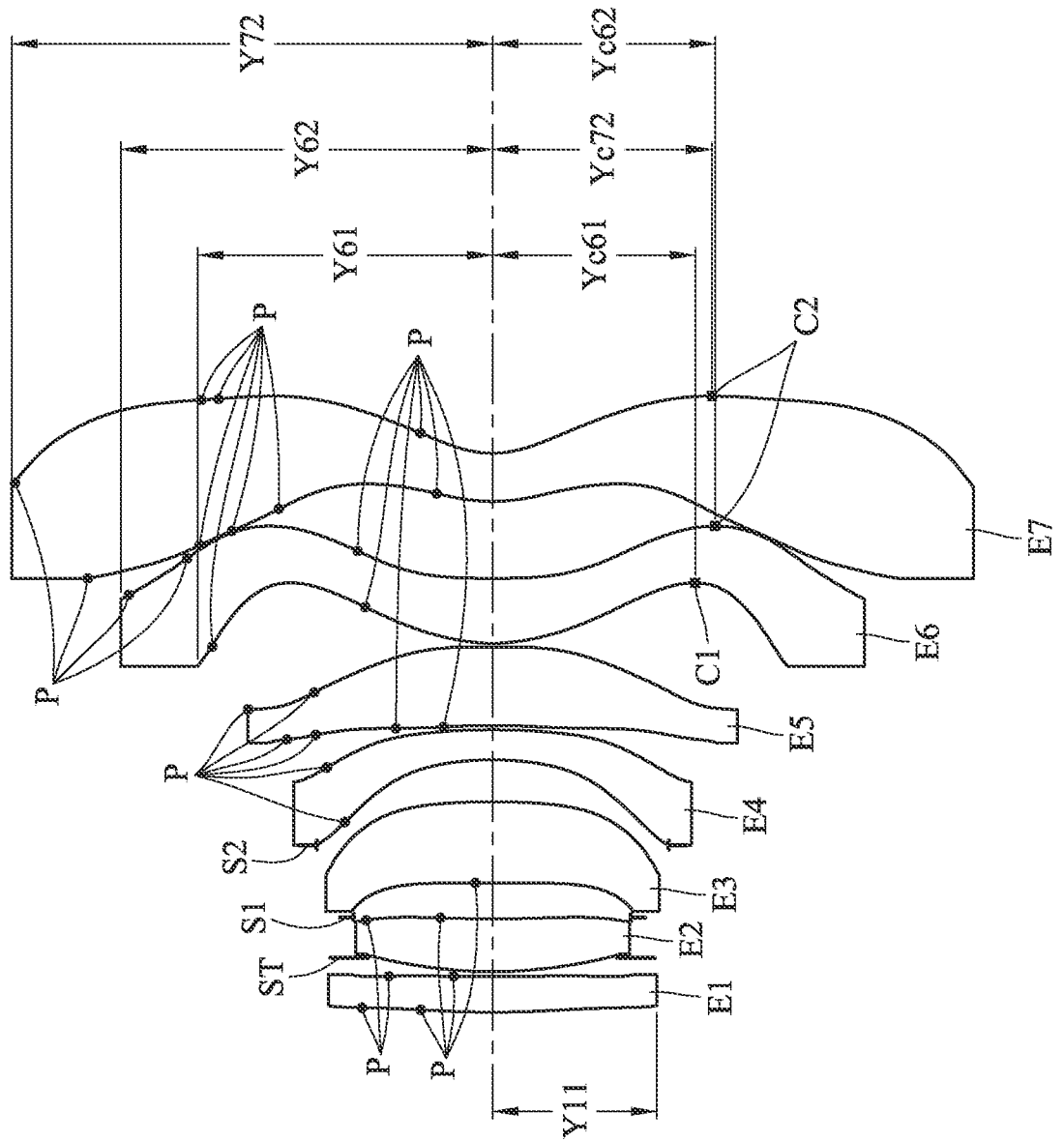
FIG. 31 shows a schematic view of Y11, Y61, Y62, Y72, Yc61, Yc62, Yc72 and inflection points and several critical points of lens elements according to the 1st embodiment of the present disclosure.

The seventh lens element can have negative refractive power. Therefore, it is favorable for correcting aberrations generated due to the miniaturization of the optical photographing system. The object-side surface of the seventh lens element can be convex in a paraxial region thereof. Therefore, it is favorable for adjusting the lens shape and the refractive power of the seventh lens element so as to correct aberrations. The image-side surface of the seventh lens element can be concave in a paraxial region thereof. Therefore, it is favorable for reducing the back focal length. The image-side surface of the seventh lens element can have at least one convex critical point in an off-axis region thereof. Therefore, it is favorable for adjusting the incident angle on the image surface so as to increase image quality and response efficiency of the image sensor. Moreover, when a vertical distance between a convex critical point on the image-side surface of the seventh lens element and the optical axis is Yc72, and a maximum effective radius of the image-side surface of the seventh lens element is Y72, at least one convex critical point on the image-side surface of the seventh lens element in the off-axis region can satisfy the following condition: 0.25<Yc72/Y72<0.65. Therefore, it is favorable for further increasing image quality. Please refer to FIG. 31, which shows a schematic view of Y72, Yc72 the convex critical point C2 on the image-side surface of the seventh lens element E7 according to the 1st embodiment of the present disclosure. The abovementioned critical points on the sixth and seventh lens elements in FIG. 31 are only exemplary. Each of lens surfaces in various embodiments of the present disclosure may also have one or more non-axial concave critical points or non-axial convex critical points.

According to the present disclosure, at least one of the object-side surface and the image-side surface of at least one lens element of the optical photographing system has at least one inflection point. Therefore, it is favorable for increasing the variety of the lens surface so as to correct aberrations and miniaturize the lens element. Moreover, at least one of the object-side surface and the image-side surface of each of at least two lens elements of the optical photographing system can have at least one inflection point. Moreover, at least one of the object-side surface and the image-side surface of each of at least three lens elements of the optical photographing system can have at least one inflection point. Please refer to FIG. 31, which shows a schematic view of inflection points P on the lens elements according to the 1st embodiment of the present disclosure.

According to the present disclosure, the optical photographing system can further include an aperture stop located between the first lens element and the second lens element. Therefore, it is favorable for miniaturizing the object side of the optical photographing system in the wide field of view configuration.

When a central thickness of the fourth lens element is CT4, a central thickness of the fifth lens element is CT5, and an axial distance between the fourth lens element and the fifth lens element is T45, the following condition is satisfied: 0.70<(CT4+CT5)/T45<90. Therefore, it is favorable for adjusting the distribution of the lens elements so as to feature a configuration with miniaturization, a wide field of view and a large image surface. Moreover, the following condition can also be satisfied: 1.0<(CT4+CT5)/T45. Moreover, the following condition can also be satisfied: 2.5<(CT4+CT5)/T45. Moreover, the following condition can also be satisfied: 4.0<(CT4+CT5)/T45. Moreover, the following condition can also be satisfied: 5.5<(CT4+CT5)/T45. Moreover, the following condition can also be satisfied: 7.0<(CT4+CT5)/T45. Moreover, the following condition can also be satisfied: (CT4+CT5)/T45<60. Moreover, the following condition can also be satisfied: (CT4+CT5)/T45<30. Moreover, the following condition can also be satisfied: (CT4+CT5)/T45<10. Moreover, the following condition can also be satisfied: (CT4+CT5)/T45<5.0. Moreover, the following condition can also be satisfied: (CT4+CT5)/T45<3.2. Moreover, the following condition can also be satisfied: (CT4+CT5)/T45<1.4. Moreover, the following condition can also be satisfied: 0.70<(CT4+CT5)/T45<1.4. Moreover, the following condition can also be satisfied: 1.0<(CT4+CT5)/T45<1.4. Moreover, the following condition can also be satisfied: 4.0<(CT4+CT5)/T45<90. Moreover, the following condition can also be satisfied: 5.5<(CT4+CT5)/T45<60.

When an Abbe number of the second lens element is V2, an Abbe number of the third lens element is V3, an Abbe number of the sixth lens element is V6, and an Abbe number of the seventh lens element is V7, the following condition can be satisfied: 205.0<V2+V3+V6+V7<260.0. Therefore, it is favorable for collaborating the lens materials so as to correct aberrations. Moreover, the following condition can also be satisfied: 210.0<V2+V3+V6+V7<240.0.

When a curvature radius of the object-side surface of the first lens element is R1, and a focal length of the optical photographing system is f, the following condition can be satisfied: 0.90<|R1/f|<40. Therefore, it is favorable for adjusting the lens shape and the refractive power of the first lens element, thereby increasing the field of view and reducing the outer diameter of the object side of the optical photographing system. Moreover, the following condition can also be satisfied: 1.0<|R1/f|<30. Moreover, the following condition can also be satisfied: 1.1<|R1/f|<20. Moreover, the following condition can also be satisfied: 1.2<|R1/f|<10.

When an axial distance between the object-side surface of the first lens element and the image surface is TL, and a maximum image height of the optical photographing system (which can be half of a diagonal length of an effective photosensitive area of an image sensor) is ImgH, the following condition can be satisfied: 1.0<TL/ImgH<1.6. Therefore, it is favorable for obtaining a proper balance between the reduction of the total track length and the increase of the image surface and increasing the field of view.

When half of a maximum field of view of the optical photographing system is HFOV, the following condition can be satisfied: 42.5 [deg.]<HFOV<70.0 [deg.]. Therefore, it is favorable for featuring a wide field of view of the optical photographing system and preventing aberrations such as distortion generated due to an overly large field of view. Moreover, the following condition can also be satisfied: 45.0 [deg.]<HFOV<60.0 [deg.].

When the focal length of the optical photographing system is f, and a composite focal length of the fourth lens element and the fifth lens element is f45, the following condition can be satisfied: −1.0<f/f45<−0.55. Therefore, it is favorable for collaborating the fourth lens element and the fifth lens element so as to obtain a proper balance between the field of view, the size distribution and the size of the image surface.

When the focal length of the optical photographing system is f, and a composite focal length of the sixth lens element and the seventh lens element is f67, the following condition can be satisfied: 0.36<f/f67<1.2. Therefore, it is favorable for collaborating the sixth lens element and the seventh lens element so as to miniaturize the image side of the optical photographing system.

When a focal length of the third lens element is f3, and a focal length of the fifth lens element is f5, the following condition can be satisfied: −2.2<f3/f5<−0.20. Therefore, it is favorable for adjusting the refractive power distribution of the lens elements so as to correct aberrations. Moreover, the following condition can also be satisfied: −1.9<f3/f5<−0.35.

When a central thickness of the first lens element is CT1, a central thickness of the second lens element is CT2, a focal length of the first lens element is f1, and a focal length of the second lens element is f2, the following condition can be satisfied: CT1/|f1|+CT2/|f2|<0.10. Therefore, it is favorable for collaborating the first lens element and the second lens element so as to increase the field of view and miniaturize the lens elements.

When a focal length of the sixth lens element is f6, a curvature radius of the object-side surface of the sixth lens element is R11, and a curvature radius of the image-side surface of the sixth lens element is R12, the following condition can be satisfied: 0<f6/R11+f6/R12<4.0. Therefore, it is favorable for adjusting the lens shape and the refractive power of the sixth lens element, thereby reducing the size and correcting aberrations.

When a central thickness of the third lens element is CT3, the central thickness of the fourth lens element is CT4, and an axial distance between the third lens element and the fourth lens element is T34, the following condition can be satisfied: 1.65<(CT3+CT4)/T34<25.0. Therefore, it is favorable for collaborating the third lens element and the fourth lens element so as to balance the size distribution between the object side and the image side of the optical photographing system. Moreover, the following condition can also be satisfied: 1.78 (CT3+CT4)/T34<3.00.

When the focal length of the fifth lens element is f5, and the focal length of the sixth lens element is f6, the following condition can be satisfied: −9.0<f5/f6<0. Therefore, it is favorable for collaborating the fifth lens element and the sixth lens element so as to correct aberrations. Moreover, the following condition can also be satisfied: −7.5<f5/f6<−1.7. Moreover, the following condition can also be satisfied: −6.0<f5/f6≤−3.44.

When the focal length of the fifth lens element is f5, and a focal length of the seventh lens element is f7, the following condition can be satisfied: 0.25<f5/f7<9.0. Therefore, it is favorable for properly distributing the refractive powers at the image side of the optical photographing system, thereby reducing the sensitivity of single lens element so as to increase assembly yield rate. Moreover, the following condition can also be satisfied: 1.6<f5/f7<7.0.

When an Abbe number of the fourth lens element is V4, and a refractive index of the fourth lens element is N4, the following condition can be satisfied: 5.5<V4/N4<12. Therefore, it is favorable for adjusting the material of the fourth lens element so as to correct aberrations such as chromatic aberration.

When an f-number of the optical photographing system is Fno, the following condition can be satisfied: 1.2<Fno<2.0. Therefore, it is favorable for obtaining a proper balance between required illuminance and the required depth of field.

When a maximum effective radius of the object-side surface of the first lens element is Y11, and the maximum effective radius of the image-side surface of the seventh lens element is Y72, the following condition can be satisfied: 1.6<Y72/Y11<3.5. Therefore, it is favorable for adjusting the direction of light, thereby obtaining a proper balance between the field of view, the size distribution and the size of the image surface. Please refer to FIG. 31, which shows a schematic view of Y11 and Y72 according to the 1st embodiment of the present disclosure.

When the central thickness of the fifth lens element is CT5, and an axial distance between the sixth lens element and the seventh lens element is T67, the following condition can be satisfied: 0.55<CT5/T67<1.5. Therefore, it is favorable for properly distributing the lens elements at the image side of the optical photographing system so as to miniaturize the image side thereof.

According to the present disclosure, the aforementioned features and conditions can be utilized in numerous combinations so as to achieve corresponding effects.

According to the present disclosure, the lens elements of the optical photographing system can be made of either glass or plastic material. When the lens elements are made of glass material, the refractive power distribution of the optical photographing system may be more flexible, and the influence on imaging caused by external environment temperature change may be reduced. The glass lens element can either be made by grinding or molding. When the lens elements are made of plastic material, the manufacturing costs can be effectively reduced. Furthermore, surfaces of each lens element can be arranged to be spherical or aspheric. Spherical lens elements are simple in manufacture. Aspheric lens element design allows more control variables for eliminating aberrations thereof and reducing the required number of lens elements, and the total track length of the optical photographing system can therefore be effectively shortened. Additionally, the aspheric surfaces may be formed by plastic injection molding or glass molding.

According to the present disclosure, when a lens surface is aspheric, it means that the lens surface has an aspheric shape throughout its optically effective area, or a portion(s) thereof.

According to the present disclosure, one or more of the lens elements' material may optionally include an additive which generates light absorption and interference effects and alters the lens elements' transmittance in a specific range of wavelength for a reduction in unwanted stray light or color deviation. For example, the additive may optionally filter out light in the wavelength range of 600 nm to 800 nm to reduce excessive red light and/or near infrared light; or may optionally filter out light in the wavelength range of 350 nm to 450 nm to reduce excessive blue light and/or near ultraviolet light from interfering the final image. The additive may be homogeneously mixed with a plastic material to be used in manufacturing a mixed-material lens element by injection molding. Moreover, the additive may be coated on the lens surfaces to provide the abovementioned effects.

According to the present disclosure, each of an object-side surface and an image-side surface has a paraxial region and an off-axis region. The paraxial region refers to the region of the surface where light rays travel close to the optical axis, and the off-axis region refers to the region of the surface away from the paraxial region. Particularly, unless otherwise stated, when the lens element has a convex surface, it indicates that the surface is convex in the paraxial region thereof; when the lens element has a concave surface, it indicates that the surface is concave in the paraxial region thereof. Moreover, when a region of refractive power or focus of a lens element is not defined, it indicates that the region of refractive power or focus of the lens element is in the paraxial region thereof.

According to the present disclosure, an inflection point is a point on the surface of the lens element at which the surface changes from concave to convex, or vice versa. A critical point is a non-axial point of the lens surface where its tangent is perpendicular to the optical axis.

According to the present disclosure, the image surface of the optical photographing system, based on the corresponding image sensor, can be flat or curved, especially a curved surface being concave facing towards the object side of the optical photographing system.

According to the present disclosure, an image correction unit, such as a field flattener, can be optionally disposed between the lens element closest to the image side of the optical photographing system along the optical path and the image surface for correction of aberrations such as field curvature. The optical properties of the image correction unit, such as curvature, thickness, index of refraction, position and surface shape (convex or concave surface with spherical, aspheric, diffractive or Fresnel types), can be adjusted according to the design of the image capturing unit. In general, a preferable image correction unit is, for example, a thin transparent element having a concave object-side surface and a planar image-side surface, and the thin transparent element is disposed near the image surface.

Figure 32:
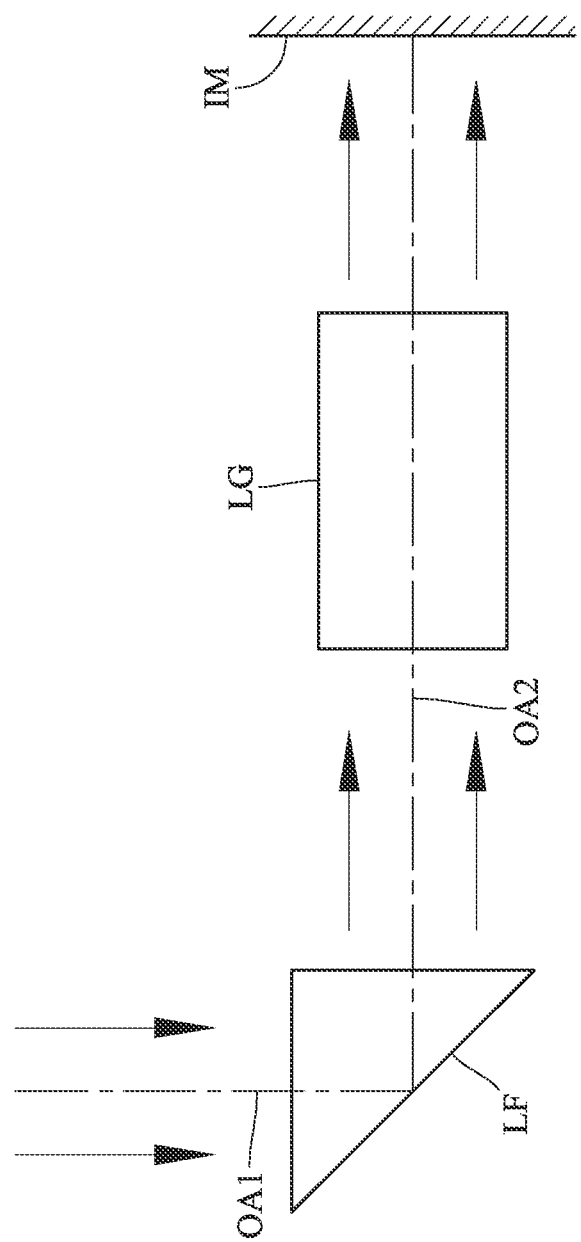
FIG. 32 shows a schematic view of a configuration of a light-folding element in an optical photographing system according to one embodiment of the present disclosure.
Figure 33:
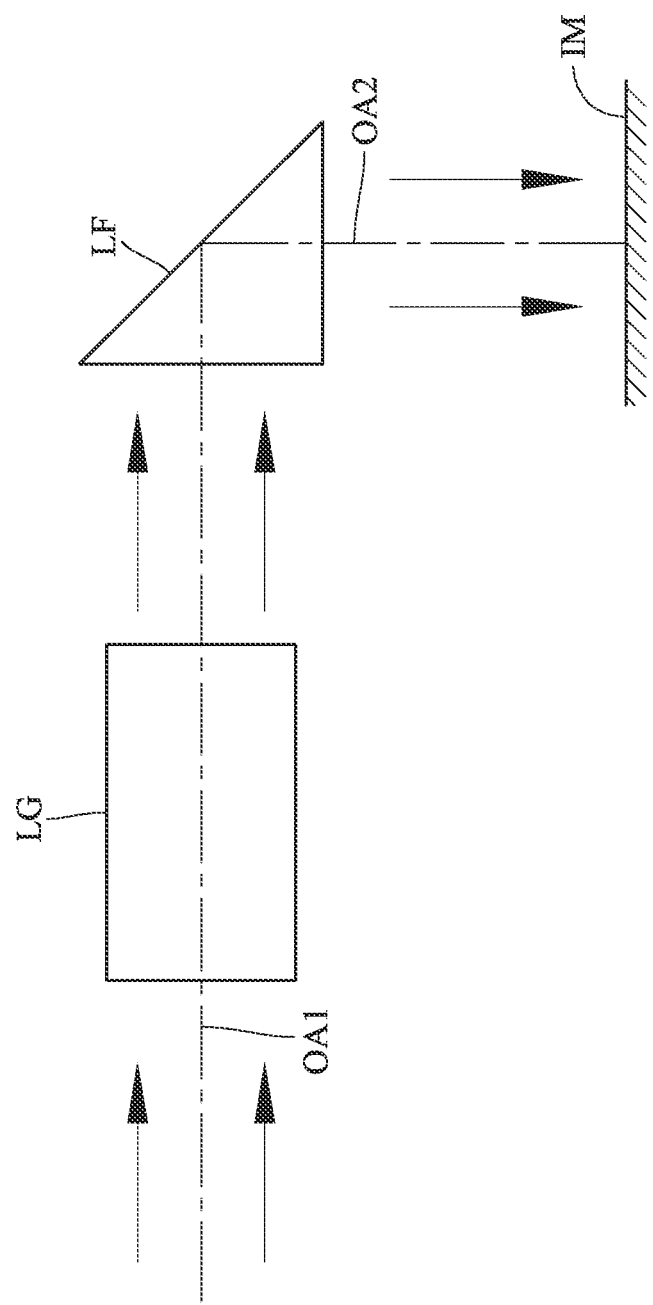
FIG. 33 shows a schematic view of another configuration of a light-folding element in an optical photographing system according to one embodiment of the present disclosure.
Figure 34:
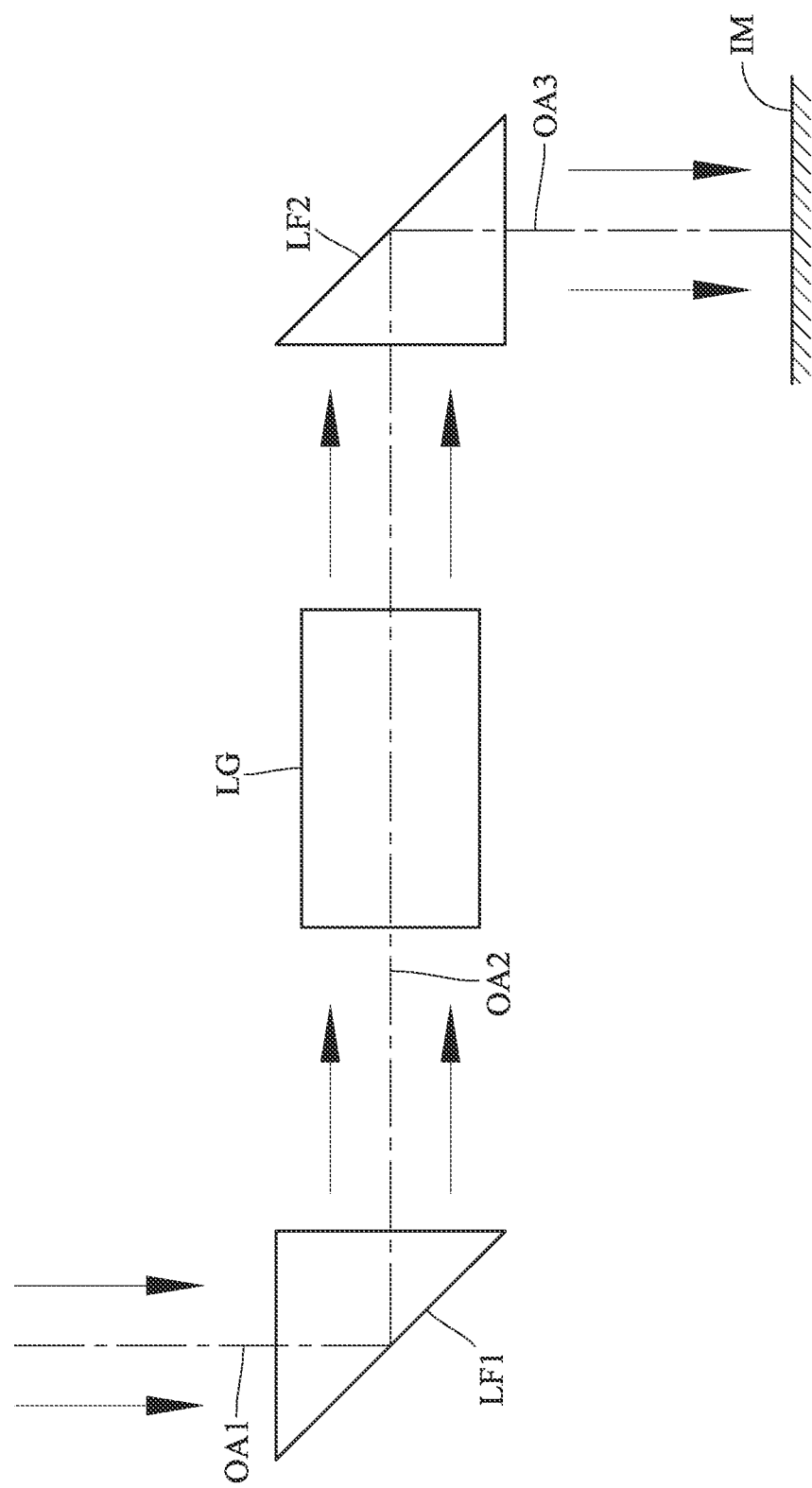
FIG. 34 shows a schematic view of a configuration of two light-folding elements in an optical photographing system according to one embodiment of the present disclosure.

According to the present disclosure, at least one light-folding element, such as a prism or a mirror, can be optionally disposed between an imaged object and the image surface on the imaging optical path, such that the optical photographing system can be more flexible in space arrangement, and therefore the dimensions of an electronic device is not restricted by the total track length of the optical photographing system. Specifically, please refer to FIG. 32 and FIG. 33. FIG. 32 shows a schematic view of a configuration of a light-folding element in an optical photographing system according to one embodiment of the present disclosure, and FIG. 33 shows a schematic view of another configuration of a light-folding element in an optical photographing system according to one embodiment of the present disclosure. In FIG. 32 and FIG. 33, the optical photographing system can have, in order from an imaged object (not shown in the figures) to an image surface IM along an optical path, a first optical axis OA1, a light-folding element LF and a second optical axis OA2. The light-folding element LF can be disposed between the imaged object and a lens group LG of the optical photographing system as shown in FIG. 32 or disposed between a lens group LG of the optical photographing system and the image surface IM as shown in FIG. 33. Furthermore, please refer to FIG. 34, which shows a schematic view of a configuration of two light-folding elements in an optical photographing system according to one embodiment of the present disclosure. In FIG. 34, the optical photographing system can have, in order from an imaged object (not shown in the figure) to an image surface IM along an optical path, a first optical axis OA1, a first light-folding element LF1, a second optical axis OA2, a second light-folding element LF2 and a third optical axis OA3. The first light-folding element LF1 is disposed between the imaged object and a lens group LG of the optical photographing system, the second light-folding element LF2 is disposed between the lens group LG of the optical photographing system and the image surface IM, and the travelling direction of light on the first optical axis OA1 can be the same direction as the travelling direction of light on the third optical axis OA3 as shown in FIG. 34. The optical photographing system can be optionally provided with three or more light-folding elements, and the present disclosure is not limited to the type, amount and position of the light-folding elements of the embodiments disclosed in the aforementioned figures.

According to the present disclosure, the optical photographing system can include at least one stop, such as an aperture stop, a glare stop or a field stop. Said glare stop or said field stop is set for eliminating the stray light and thereby improving image quality thereof.

According to the present disclosure, an aperture stop can be configured as a front stop or a middle stop. A front stop disposed between an imaged object and the first lens element can provide a longer distance between an exit pupil of the optical photographing system and the image surface to produce a telecentric effect, and thereby improves the image-sensing efficiency of an image sensor (for example, CCD or CMOS). A middle stop disposed between the first lens element and the image surface is favorable for enlarging the viewing angle of the optical photographing system and thereby provides a wider field of view for the same.

According to the present disclosure, the optical photographing system can include an aperture control unit. The aperture control unit may be a mechanical component or a light modulator, which can control the size and shape of the aperture through electricity or electrical signals. The mechanical component can include a movable member, such as a blade assembly or a light shielding sheet. The light modulator can include a shielding element, such as a filter, an electrochromic material or a liquid-crystal layer. The aperture control unit controls the amount of incident light or exposure time to enhance the capability of image quality adjustment. In addition, the aperture control unit can be the aperture stop of the present disclosure, which changes the f-number to obtain different image effects, such as the depth of field or lens speed.

According to the above description of the present disclosure, the following specific embodiments are provided for further explanation.

1st Embodiment

Figure 2:
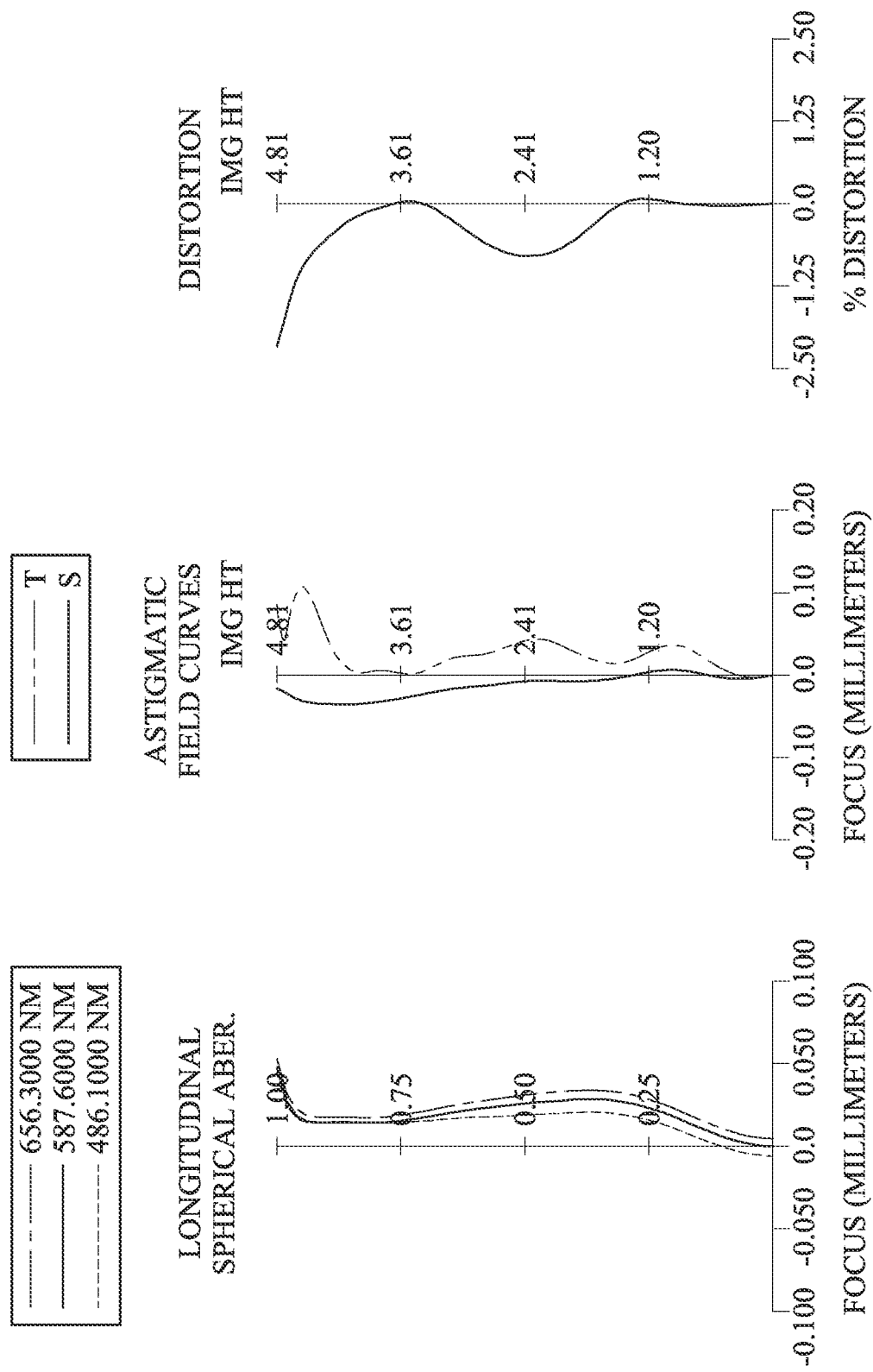
FIG. 2 shows spherical aberration curves, astigmatic field curves and a distortion curve of the image capturing unit according to the 1st embodiment.

FIG. 1 is a schematic view of an image capturing unit according to the 1st embodiment of the present disclosure. FIG. 2 shows, in order from left to right, spherical aberration curves, astigmatic field curves and a distortion curve of the image capturing unit according to the 1st embodiment. In FIG. 1, the image capturing unit 1 includes the optical photographing system (its reference numeral is omitted) of the present disclosure and an image sensor IS. The optical photographing system includes, in order from an object side to an image side along an optical axis, a first lens element E1, an aperture stop ST, a second lens element E2, a stop S1, a third lens element E3, a stop S2, a fourth lens element E4, a fifth lens element E5, a sixth lens element E6, a seventh lens element E7, a filter E8 and an image surface IMG. The optical photographing system includes seven lens elements (E1, E2, E3, E4, E5, E6 and E7) with no additional lens element disposed between each of the adjacent seven lens elements.

The first lens element E1 with positive refractive power has an object-side surface being convex in a paraxial region thereof and an image-side surface being concave in a paraxial region thereof. The first lens element E1 is made of plastic material and has the object-side surface and the image-side surface being both aspheric. The object-side surface of the first lens element E1 has two inflection points. The image-side surface of the first lens element E1 has two inflection points.

The second lens element E2 with positive refractive power has an object-side surface being convex in a paraxial region thereof and an image-side surface being concave in a paraxial region thereof. The second lens element E2 is made of plastic material and has the object-side surface and the image-side surface being both aspheric. The image-side surface of the second lens element E2 has two inflection points.

The third lens element E3 with positive refractive power has an object-side surface being convex in a paraxial region thereof and an image-side surface being convex in a paraxial region thereof. The third lens element E3 is made of plastic material and has the object-side surface and the image-side surface being both aspheric. The object-side surface of the third lens element E3 has one inflection point.

The fourth lens element E4 with negative refractive power has an object-side surface being concave in a paraxial region thereof and an image-side surface being convex in a paraxial region thereof. The fourth lens element E4 is made of plastic material and has the object-side surface and the image-side surface being both aspheric. The object-side surface of the fourth lens element E4 has one inflection point. The image-side surface of the fourth lens element E4 has one inflection point.

The fifth lens element E5 with negative refractive power has an object-side surface being concave in a paraxial region thereof and an image-side surface being convex in a paraxial region thereof. The fifth lens element E5 is made of plastic material and has the object-side surface and the image-side surface being both aspheric. The object-side surface of the fifth lens element E5 has four inflection points. The image-side surface of the fifth lens element E5 has two inflection points.

The sixth lens element E6 with positive refractive power has an object-side surface being convex in a paraxial region thereof and an image-side surface being concave in a paraxial region thereof. The sixth lens element E6 is made of plastic material and has the object-side surface and the image-side surface being both aspheric. The object-side surface of the sixth lens element E6 has two inflection points. The image-side surface of the sixth lens element E6 has three inflection points. The object-side surface of the sixth lens element E6 has at least one concave critical point in an off-axis region thereof. The image-side surface of the sixth lens element E6 has at least one convex critical point in an off-axis region thereof.

The seventh lens element E7 with negative refractive power has an object-side surface being convex in a paraxial region thereof and an image-side surface being concave in a paraxial region thereof. The seventh lens element E7 is made of plastic material and has the object-side surface and the image-side surface being both aspheric. The object-side surface of the seventh lens element E7 has five inflection points. The image-side surface of the seventh lens element E7 has four inflection points. The image-side surface of the seventh lens element E7 has at least one convex critical point in an off-axis region thereof.

The filter E8 is made of glass material and located between the seventh lens element E7 and the image surface IMG, and will not affect the focal length of the optical photographing system. The image sensor IS is disposed on or near the image surface IMG of the optical photographing system.

The equation of the aspheric surface profiles of the aforementioned lens elements of the 1st embodiment is expressed as follows:

$$X(Y) = (Y^2/R)/(1 + sqrt(1 - (1+k) \times (Y/R)^2)) + \sum_i (Ai) \times (Y^i),$$

where,

X is the displacement in parallel with an optical axis from an axial vertex on the aspheric surface to a point at a distance of Y from the optical axis on the aspheric surface;

Y is the vertical distance from the point on the aspheric surface to the optical axis;

R is the curvature radius;

k is the conic coefficient; and

Ai is the i-th aspheric coefficient, and in the embodiments, i may be, but is not limited to, 4, 6, 8, 10, 12, 14, 16, 18, 20, 22, 24, 26, 28 and 30.

In the optical photographing system of the image capturing unit according to the 1st embodiment, when a focal length of the optical photographing system is f, an f-number of the optical photographing system is Fno, and half of a maximum field of view of the optical photographing system is HFOV, these parameters have the following values: f=3.77 millimeters (mm), Fno=1.82, HFOV=52.4 degrees (deg.).

When an Abbe number of the second lens element E2 is V2, an Abbe number of the third lens element E3 is V3, an Abbe number of the sixth lens element E6 is V6, and an Abbe number of the seventh lens element E7 is V7, the following condition is satisfied: V2+V3+V6+V7=224.1.

When an Abbe number of the fourth lens element E4 is V4, and a refractive index of the fourth lens element E4 is N4, the following condition is satisfied: V4/N4=10.90.

When a central thickness of the third lens element E3 is CT3, a central thickness of the fourth lens element E4 is CT4, and an axial distance between the third lens element E3 and the fourth lens element E4 is T34, the following condition is satisfied: (CT3+CT4)/T34=2.65. In this embodiment, an axial distance between two adjacent lens elements is a distance in a paraxial region between two adjacent lens surfaces of the two adjacent lens elements.

When the central thickness of the fourth lens element E4 is CT4, a central thickness of the fifth lens element E5 is CT5, and an axial distance between the fourth lens element E4 and the fifth lens element E5 is T45, the following condition is satisfied: (CT4+CT5)/T45=25.83.

When a central thickness of the first lens element E1 is CT1, a central thickness of the second lens element E2 is CT2, a focal length of the first lens element E1 is f1, and a focal length of the second lens element E2 is f2, the following condition is satisfied: CT1/|f1|+CT2/|f2|=0.06.

When the central thickness of the fifth lens element E5 is CT5, and an axial distance between the sixth lens element E6 and the seventh lens element E7 is T67, the following condition is satisfied: CT5/T67=1.03.

When an axial distance between the object-side surface of the first lens element E1 and the image surface IMG is TL, and a maximum image height of the optical photographing system is ImgH, the following condition is satisfied: TL/ImgH=1.22.

When a curvature radius of the object-side surface of the first lens element E1 is R1, and the focal length of the optical photographing system is f, the following condition is satisfied: |R1/f|=2.01.

When the focal length of the optical photographing system is f, and a composite focal length of the fourth lens element E4 and the fifth lens element E5 is f45, the following condition is satisfied: f/f45=−0.80.

When the focal length of the optical photographing system is f, and a composite focal length of the sixth lens element E6 and the seventh lens element E7 is f67, the following condition is satisfied: f/f67=0.98.

When a focal length of the third lens element E3 is f3, and a focal length of the fifth lens element E5 is f5, the following condition is satisfied: f3/f5=−0.74.

When the focal length of the fifth lens element E5 is f5, and a focal length of the sixth lens element E6 is f6, the following condition is satisfied: f5/f6=−4.75.

When the focal length of the fifth lens element E5 is f5, and a focal length of the seventh lens element E7 is f7, the following condition is satisfied: f5/f7=2.75.

When the focal length of the sixth lens element E6 is f6, a curvature radius of the object-side surface of the sixth lens element E6 is R11, and a curvature radius of the image-side surface of the sixth lens element E6 is R12, the following condition is satisfied: f6/R11+f6/R12=2.34.

When a maximum effective radius of the object-side surface of the first lens element E1 is Y11, and a maximum effective radius of the image-side surface of the seventh lens element E7 is Y72, the following condition is satisfied: Y72/Y11=2.92.

When a vertical distance between a concave critical point on the object-side surface of the sixth lens element E6 and an optical axis is Yc61, and a maximum effective radius of the object-side surface of the sixth lens element E6 is Y61, the following condition is satisfied: Yc61/Y61=0.69.

When a vertical distance between a convex critical point on the image-side surface of the sixth lens element E6 and the optical axis is Yc62, and a maximum effective radius of the image-side surface of the sixth lens element E6 is Y62, the following condition is satisfied: Yc62/Y62=0.60.

When a vertical distance between a convex critical point on the image-side surface of the seventh lens element E7 and the optical axis is Yc72, and the maximum effective radius of the image-side surface of the seventh lens element E7 is Y72, the following condition is satisfied: Yc72/Y72=0.46.

The detailed optical data of the 1st embodiment are shown in Table 1 and the aspheric surface data are shown in Table 2 below.

TABLE 1

1st Embodiment
f = 3.77 mm, Fno = 1.82, HFOV = 52.4 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 7.5932 | (ASP) | 0.296 | Plastic | 1.545 | 56.1 | 26.02 |
| 2 | | 16.1244 | (ASP) | 0.157 | | | | |
| 3 | Ape. Stop | Plano | | −0.116 | | | | |
| 4 | Lens 2 | 3.5453 | (ASP) | 0.439 | Plastic | 1.545 | 56.1 | 9.82 |
| 5 | | 10.0418 | (ASP) | 0.012 | | | | |
| 6 | Stop | Plano | | 0.286 | | | | |
| 7 | Lens 3 | 69.7009 | (ASP) | 0.675 | Plastic | 1.545 | 56.1 | 10.79 |
| 8 | | −6.3997 | (ASP) | −0.360 | | | | |

TABLE 1-continued

1st Embodiment
f = 3.77 mm, Fno = 1.82, HFOV = 52.4 deg.

| Surface # | | Curvature Radius | | Thickness | Material | Index | Abbe # | Focal Length |
|---|---|---|---|---|---|---|---|---|
| 9 | Stop | Plano | | 0.709 | | | | |
| 10 | Lens 4 | −2.5759 | (ASP) | 0.250 | Plastic | 1.686 | 18.4 | −7.11 |
| 11 | | −5.6712 | (ASP) | 0.035 | | | | |
| 12 | Lens 5 | −7.0979 | (ASP) | 0.654 | Plastic | 1.566 | 37.4 | −14.54 |
| 13 | | −53.4123 | (ASP) | 0.030 | | | | |
| 14 | Lens 6 | 1.4743 | (ASP) | 0.540 | Plastic | 1.544 | 56.0 | 3.06 |
| 15 | | 11.2957 | (ASP) | 0.638 | | | | |
| 16 | Lens 7 | 1.2775 | (ASP) | 0.400 | Plastic | 1.544 | 56.0 | −5.29 |
| 17 | | 0.7871 | (ASP) | 0.800 | | | | |
| 18 | Filter | Plano | | 0.210 | Glass | 1.517 | 64.2 | — |
| 19 | | Plano | | 0.212 | | | | |
| 20 | Image | Plano | | — | | | | |

Note:
Reference wavelength is 587.6 nm (d-line).
An effective radius of the stop S1 (Surface 6) is 1.150 mm.
An effective radius of the stop S2 (Surface 9) is 1.460 mm.

TABLE 2

Aspheric Coefficients

| Surface # | 1 | 2 | 4 | 5 |
|---|---|---|---|---|
| k = | 0.00000E+00 | 0.00000E+00 | 0.00000E+00 | 0.00000E+00 |
| A4 = | −3.17780468E−02 | −5.82065610E−02 | −5.07789889E−02 | −2.99779176E−02 |
| A6 = | 9.05418944E−03 | 3.80393393E−02 | 1.24212406E−01 | −3.28256305E−02 |
| A8 = | −3.13407092E−02 | −6.89330733E−03 | −3.11586084E−01 | −1.28659913E−02 |
| A10 = | 4.75616822E−02 | −3.74417081E−02 | 5.30227416E−01 | 7.32533120E−02 |
| A12 = | −3.55584385E−02 | 6.93577481E−02 | −5.40374754E−01 | −1.06233757E−01 |
| A14 = | 1.43357153E−02 | −4.72759939E−02 | 2.99752635E−01 | 6.70346776E−02 |
| A16 = | −2.32598543E−03 | 1.27937424E−02 | −6.74448166E−02 | −1.33743980E−02 |

| Surface # | 7 | 8 | 10 | 11 |
|---|---|---|---|---|
| k = | 0.00000E+00 | 4.50803E+00 | −1.96936E+00 | −4.48340E+01 |
| A4 = | −6.16962169E−02 | −3.80104857E−02 | −6.57804553E−02 | −1.26613562E−01 |
| A6 = | 2.28299043E−04 | −8.25240079E−02 | −1.15239145E−01 | 5.49175182E−01 |
| A8 = | −1.21442388E−01 | 6.34051785E−02 | 1.22626861E−01 | −1.28963932E+00 |
| A10 = | 2.22224207E−01 | −7.07299123E−02 | −3.26938499E−01 | 1.49206701E+00 |
| A12 = | −2.66756931E−01 | 5.35378430E−02 | 6.12716939E−01 | −1.00565447E+00 |
| A14 = | 1.66813171E−01 | −1.94786478E−02 | −5.49216982E−01 | 4.18333327E−01 |
| A16 = | −4.20008789E−02 | 2.39963421E−03 | 2.54983215E−01 | −1.06347226E−01 |
| A18 = | — | — | −5.95375965E−02 | 1.52050976E−02 |
| A20 = | — | — | 5.52736270E−03 | −9.37420199E−04 |

| Surface # | 12 | 13 | 14 | 15 |
|---|---|---|---|---|
| k = | 1.00363E+00 | 0.00000E+00 | −3.81118E+00 | 6.47749E+00 |
| A4 = | −6.59572582E−02 | −3.89454800E−01 | −8.42407983E−02 | 2.26152744E−01 |
| A6 = | 6.45063435E−01 | 5.32378586E−01 | 2.70278066E−01 | −1.20313212E−01 |
| A8 = | −1.32099808E+00 | −7.30927600E−01 | −3.73203317E−01 | 3.62196638E−02 |
| A10 = | 1.36809708E+00 | 1.02582251E+00 | 3.37516275E−01 | −3.39876201E−02 |
| A12 = | −7.56379279E−01 | −1.14467891E+00 | −2.31155652E−01 | 3.15081346E−02 |
| A14 = | 1.12368926E−01 | 9.13419915E−01 | 1.18693843E−01 | −1.65532423E−02 |
| A16 = | 1.53054283E−01 | −5.11844190E−01 | −4.41305094E−02 | 5.36229157E−03 |
| A18 = | −1.34854353E−01 | 2.00677105E−01 | 1.15911054E−02 | −1.14030018E−03 |
| A20 = | 5.76772902E−02 | −5.45024936E−02 | −2.10938999E−03 | 1.62919588E−04 |
| A22 = | −1.51745932E−02 | 1.00100587E−02 | 2.58893383E−04 | −1.55284351E−05 |
| A24 = | 2.49173159E−03 | −1.18322896E−03 | −2.03836911E−05 | 9.48035415E−07 |
| A26 = | −2.35127218E−04 | 8.10877173E−05 | 9.27509164E−07 | −3.35526864E−08 |
| A28 = | 9.75043994E−06 | −2.44466105E−06 | −1.85122532E−08 | 5.23679031E−10 |

| Surface # | 16 | 17 |
|---|---|---|
| k = | −3.11960E+00 | −2.35033E+00 |
| A4 = | −2.93841014E−01 | −2.78099159E−01 |
| A6 = | 1.63659914E−01 | 2.52044901E−01 |
| A8 = | −5.74651645E−03 | −1.50793571E−01 |
| A10 = | −5.82524465E−02 | 6.03230733E−02 |
| A12 = | 4.09979789E−02 | −1.68073355E−02 |
| A14 = | −1.47773673E−02 | 3.37042909E−03 |
| A16 = | 3.36022224E−03 | −4.95325901E−04 |

TABLE 2-continued

| Aspheric Coefficients | | |
|---|---|---|
| A18 = | −5.17353848E−04 | 5.36640925E−05 |
| A20 = | 5.54699953E−05 | −4.26774371E−06 |
| A22 = | −4.15823801E−06 | 2.45399113E−07 |
| A24 = | 2.14110888E−07 | −9.90156910E−09 |
| A26 = | −7.22418466E−09 | 2.65267709E−10 |
| A28 = | 1.43918212E−10 | −4.22783945E−12 |
| A30 = | −1.28351491E−12 | 3.02724970E−14 |

In Table 1, the curvature radius, the thickness and the focal length are shown in millimeters (mm). Surface numbers 0-20 represent the surfaces sequentially arranged from the object side to the image side along the optical axis. In Table 2, k represents the conic coefficient of the equation of the aspheric surface profiles. A4-A30 represent the aspheric coefficients ranging from the 4th order to the 30th order. The tables presented below for each embodiment are the corresponding schematic parameter and aberration curves, and the definitions of the tables are the same as Table 1 and Table 2 of the 1st embodiment. Therefore, an explanation in this regard will not be provided again.

2nd Embodiment

Figure 3:
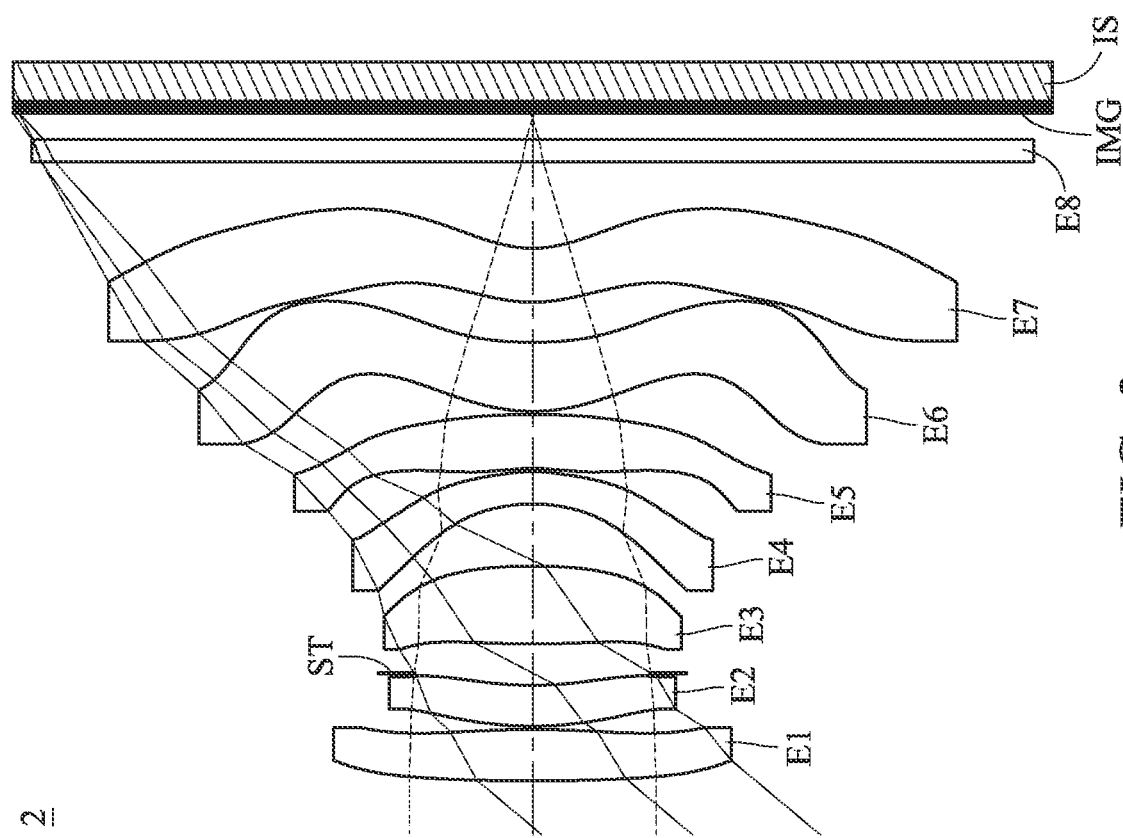
FIG. 3 is a schematic view of an image capturing unit according to the 2nd embodiment of the present disclosure.
Figure 4:
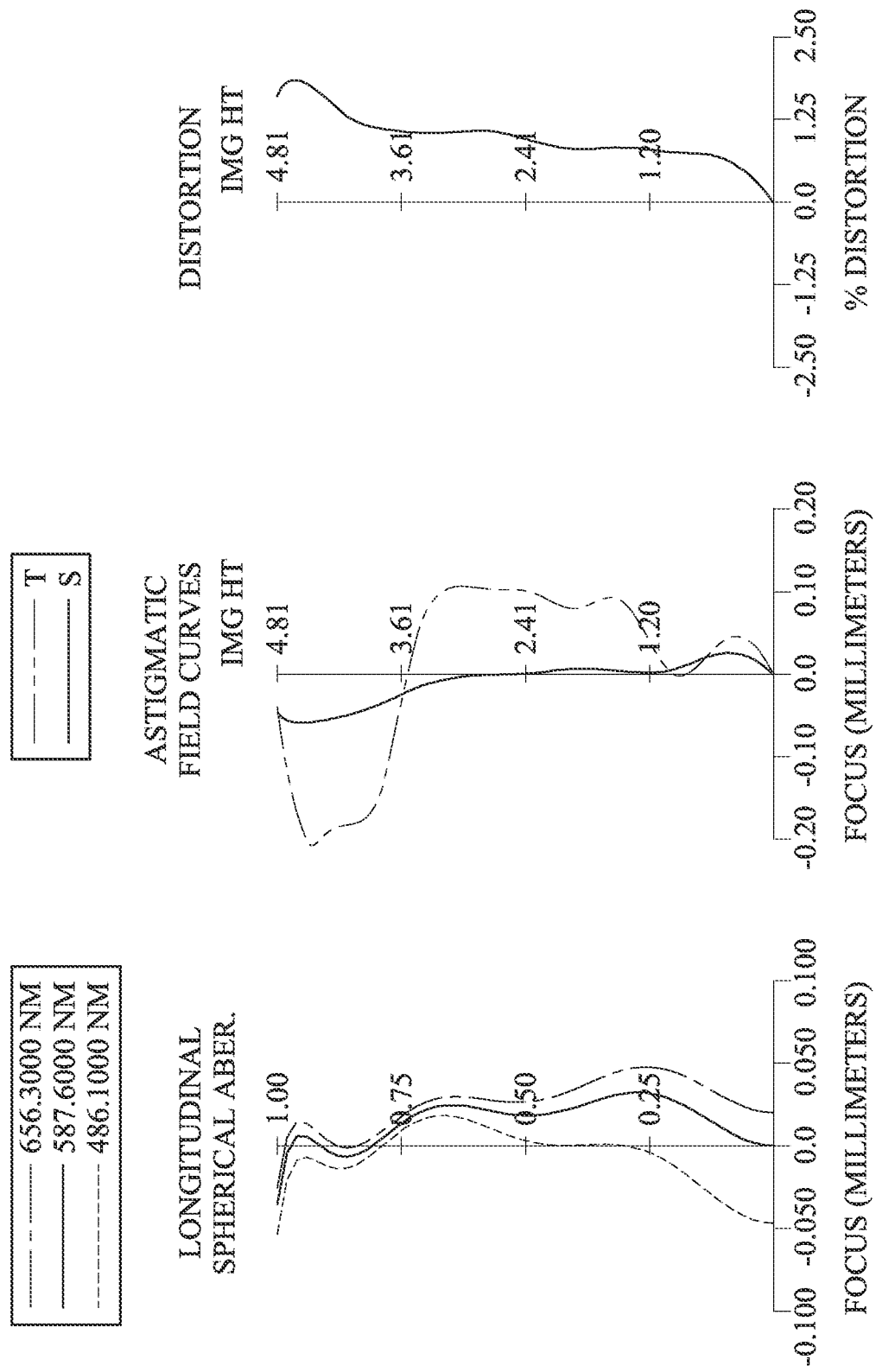
FIG. 4 shows spherical aberration curves, astigmatic field curves and a distortion curve of the image capturing unit according to the 2nd embodiment.

FIG. 3 is a schematic view of an image capturing unit according to the 2nd embodiment of the present disclosure. FIG. 4 shows, in order from left to right, spherical aberration curves, astigmatic field curves and a distortion curve of the image capturing unit according to the 2nd embodiment. In FIG. 3, the image capturing unit 2 includes the optical photographing system (its reference numeral is omitted) of the present disclosure and an image sensor IS. The optical photographing system includes, in order from an object side to an image side along an optical axis, a first lens element E1, a second lens element E2, an aperture stop ST, a third lens element E3, a fourth lens element E4, a fifth lens element E5, a sixth lens element E6, a seventh lens element E7, a filter E8 and an image surface IMG. The optical photographing system includes seven lens elements (E1, E2, E3, E4, E5, E6 and E7) with no additional lens element disposed between each of the adjacent seven lens elements.

The first lens element E1 with positive refractive power has an object-side surface being convex in a paraxial region thereof and an image-side surface being convex in a paraxial region thereof. The first lens element E1 is made of plastic material and has the object-side surface and the image-side surface being both aspheric. The image-side surface of the first lens element E1 has one inflection point.

The second lens element E2 with negative refractive power has an object-side surface being convex in a paraxial region thereof and an image-side surface being concave in a paraxial region thereof. The second lens element E2 is made of plastic material and has the object-side surface and the image-side surface being both aspheric. The object-side surface of the second lens element E2 has one inflection point. The image-side surface of the second lens element E2 has one inflection point.

The third lens element E3 with positive refractive power has an object-side surface being convex in a paraxial region thereof and an image-side surface being convex in a paraxial region thereof. The third lens element E3 is made of plastic material and has the object-side surface and the image-side surface being both aspheric. The object-side surface of the third lens element E3 has two inflection points. The image-side surface of the third lens element E3 has one inflection point.

The fourth lens element E4 with positive refractive power has an object-side surface being concave in a paraxial region thereof and an image-side surface being convex in a paraxial region thereof. The fourth lens element E4 is made of plastic material and has the object-side surface and the image-side surface being both aspheric. The object-side surface of the fourth lens element E4 has two inflection points. The image-side surface of the fourth lens element E4 has three inflection points.

The fifth lens element E5 with negative refractive power has an object-side surface being concave in a paraxial region thereof and an image-side surface being convex in a paraxial region thereof. The fifth lens element E5 is made of plastic material and has the object-side surface and the image-side surface being both aspheric. The object-side surface of the fifth lens element E5 has three inflection points. The image-side surface of the fifth lens element E5 has one inflection point.

The sixth lens element E6 with positive refractive power has an object-side surface being convex in a paraxial region thereof and an image-side surface being concave in a paraxial region thereof. The sixth lens element E6 is made of plastic material and has the object-side surface and the image-side surface being both aspheric. The object-side surface of the sixth lens element E6 has two inflection points. The image-side surface of the sixth lens element E6 has two inflection points. The object-side surface of the sixth lens element E6 has at least one concave critical point in an off-axis region thereof. The image-side surface of the sixth lens element E6 has at least one convex critical point in an off-axis region thereof.

The seventh lens element E7 with negative refractive power has an object-side surface being convex in a paraxial region thereof and an image-side surface being concave in a paraxial region thereof. The seventh lens element E7 is made of plastic material and has the object-side surface and the image-side surface being both aspheric. The object-side surface of the seventh lens element E7 has four inflection points. The image-side surface of the seventh lens element E7 has one inflection point. The image-side surface of the seventh lens element E7 has at least one convex critical point in an off-axis region thereof.

The filter E8 is made of glass material and located between the seventh lens element E7 and the image surface IMG, and will not affect the focal length of the optical photographing system. The image sensor IS is disposed on or near the image surface IMG of the optical photographing system.

The detailed optical data of the 2nd embodiment are shown in Table 3 and the aspheric surface data are shown in Table 4 below.

TABLE 3

2nd Embodiment
f = 3.96 mm, Fno = 1.73, HFOV = 50.0 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | 16.7211 (ASP) | 0.478 | Plastic | 1.545 | 56.1 | 9.86 |
| 2 | | −7.8378 (ASP) | 0.030 | | | | |
| 3 | Lens 2 | 3.3323 (ASP) | 0.379 | Plastic | 1.545 | 56.1 | −237.72 |
| 4 | | 3.1184 (ASP) | 0.113 | | | | |
| 5 | Ape. Stop | Plano | 0.272 | | | | |
| 6 | Lens 3 | 9.5614 (ASP) | 0.722 | Plastic | 1.545 | 56.1 | 5.87 |
| 7 | | −4.6741 (ASP) | 0.575 | | | | |
| 8 | Lens 4 | −1.5672 (ASP) | 0.300 | Plastic | 1.686 | 18.4 | 10.07 |
| 9 | | −1.3769 (ASP) | 0.030 | | | | |
| 10 | Lens 5 | −1.6878 (ASP) | 0.500 | Plastic | 1.566 | 37.4 | −3.69 |
| 11 | | −9.7697 (ASP) | 0.030 | | | | |
| 12 | Lens 6 | 1.7320 (ASP) | 0.641 | Plastic | 1.562 | 44.6 | 4.78 |
| 13 | | 4.2262 (ASP) | 0.371 | | | | |
| 14 | Lens 7 | 1.4458 (ASP) | 0.500 | Plastic | 1.534 | 56.0 | −12.81 |
| 15 | | 1.0499 (ASP) | 0.800 | | | | |
| 16 | Filter | Plano | 0.210 | Glass | 1.517 | 64.2 | — |
| 17 | | Plano | 0.241 | | | | |
| 18 | Image | Plano | — | | | | |

Note:
Reference wavelength is 587.6 nm (d-line).

TABLE 4

Aspheric Coefficients

| Surface # | 1 | 2 | 3 | 4 |
|---|---|---|---|---|
| k = | 2.35797E+01 | −3.06857E+01 | −4.76421E+00 | −6.98713E+00 |
| A4 = | −9.93299057E−03 | 1.22052182E−02 | −5.81520742E−03 | −5.52832732E−02 |
| A6 = | 7.69538841E−03 | 3.02360206E−02 | 1.49124575E−02 | 2.95825115E−02 |
| A8 = | −1.28856857E−04 | −3.94446917E−02 | −7.07585061E−03 | −3.98187328E−02 |
| A10 = | −4.23618134E−04 | 3.03269105E−02 | −1.79595562E−02 | 8.66836191E−03 |
| A12 = | −5.07677823E−05 | −1.40842438E−02 | 1.04834548E−02 | 2.68663415E−03 |
| A14 = | 7.17647062E−05 | 3.59937244E−03 | −1.49282048E−03 | — |
| A16 = | −1.09632971E−05 | −3.83008589E−04 | — | — |

| Surface # | 6 | 7 | 8 | 9 |
|---|---|---|---|---|
| k = | −6.89267E+01 | 2.82499E+00 | −2.24074E+00 | −1.77274E+01 |
| A4 = | −4.70517697E−02 | −4.25621623E−02 | −1.91821286E−01 | 1.95335504E−01 |
| A6 = | 1.67041725E−01 | 6.89120011E−03 | −7.04708195E−01 | −7.16195209E−01 |
| A8 = | −5.35301210E−01 | −6.67379268E−02 | 2.13750987E+00 | 9.04698359E−01 |
| A10 = | 8.19899010E−01 | 8.09778371E−02 | −3.78828980E+00 | −7.43070980E−01 |
| A12 = | −6.96238316E−01 | −4.90895911E−02 | 4.17537479E+00 | 4.29283985E−01 |
| A14 = | 3.00384380E−01 | 1.36934247E−02 | −2.81866096E+00 | −1.62089776E−01 |
| A16 = | −5.02456695E−02 | −1.10633346E−03 | 1.12899926E+00 | 3.56645670E−02 |
| A18 = | — | — | −2.45968741E−01 | −3.81427554E−03 |
| A20 = | — | — | 2.24201486E−02 | 1.22096529E−04 |

| Surface # | 10 | 11 | 12 | 13 |
|---|---|---|---|---|
| k = | −2.22382E+01 | 6.11506E+00 | −5.58823E+00 | −1.83483E+01 |
| A4 = | 6.07534702E−01 | −1.41999146E−01 | 6.43000259E−02 | 2.04486515E−01 |
| A6 = | −1.24254353E+00 | 2.59870750E−01 | −5.78926903E−02 | −1.91433739E−01 |
| A8 = | 1.60990173E+00 | −2.59804629E−01 | −2.18178273E−03 | 9.12099246E−02 |
| A10 = | −1.48888476E+00 | 1.60859843E−01 | 1.84263137E−02 | −2.70792261E−02 |
| A12 = | 9.85305178E−01 | −6.56921916E−02 | −1.03244186E−02 | 5.00582589E−03 |
| A14 = | −4.59139917E−01 | 1.74240828E−02 | 2.90214689E−03 | −5.07561312E−04 |
| A16 = | 1.45840313E−01 | −2.84426396E−03 | −4.73668277E−04 | 9.24989995E−06 |
| A18 = | −2.98337215E−02 | 2.57601829E−04 | 4.60526596E−05 | 4.11480046E−06 |
| A20 = | 3.51956001E−03 | −9.87413218E−06 | −2.56468640E−06 | −4.98390125E−07 |
| A22 = | −1.80885249E−04 | — | 7.15968367E−08 | 2.43232826E−08 |
| A24 = | — | — | −6.67380395E−10 | −4.52644549E−10 |

| Surface # | 14 | 15 |
|---|---|---|
| k = | −1.76551E+00 | −2.49800E+00 |
| A4 = | −2.08332836E−01 | −1.65231763E−01 |
| A6 = | 8.18221437E−02 | 9.68935800E−02 |
| A8 = | −2.49105389E−02 | −4.85275720E−02 |

TABLE 4-continued

| Aspheric Coefficients | | |
|---|---|---|
| A10 = | 5.82430045E−03 | 1.89360924E−02 |
| A12 = | −5.84326268E−04 | −5.40620679E−03 |
| A14 = | −1.25827358E−04 | 1.11451981E−03 |
| A16 = | 5.66455764E−05 | −1.66523966E−04 |
| A18 = | −1.00769214E−05 | 1.81205195E−05 |
| A20 = | 1.07525149E−06 | −1.43499458E−06 |
| A22 = | −7.47353831E−08 | 8.18211945E−08 |
| A24 = | 3.41958162E−09 | −3.27250897E−09 |
| A26 = | −9.94971759E−11 | 8.71275849E−11 |
| A28 = | 1.66793753E−12 | −1.38640005E−12 |
| A30 = | −1.22312741E−14 | 9.97072241E−15 |

In the 2nd embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 2nd embodiment, so an explanation in this regard will not be provided again.

Moreover, these parameters can be calculated from Table 3 and Table 4 as the following values and satisfy the following conditions:

| 2nd Embodiment | | | |
|---|---|---|---|
| f [mm] | 3.96 | f/f45 | −0.77 |
| Fno | 1.73 | f/f67 | 0.72 |
| HFOV [deg.] | 50.0 | f3/f5 | −1.59 |
| V2 + V3 + V6 + V7 | 212.7 | f5/f6 | −0.77 |
| V4/N4 | 10.90 | f5/f7 | 0.29 |
| (CT3 + CT4)/T34 | 1.78 | f6/R11 + f6/R12 | 3.89 |
| (CT4 + CT5)/T45 | 26.67 | Y72/Y11 | 2.13 |
| CT1/|f1| + CT2/|f2| | 0.05 | Yc61/Y61 | 0.56 |
| CT5/T67 | 1.35 | Yc62/Y62 | 0.62 |
| TL/ImgH | 1.29 | Yc72/Y72 | 0.42 |
| |R1/f| | 4.22 | — | — |

3rd Embodiment

Figure 5:
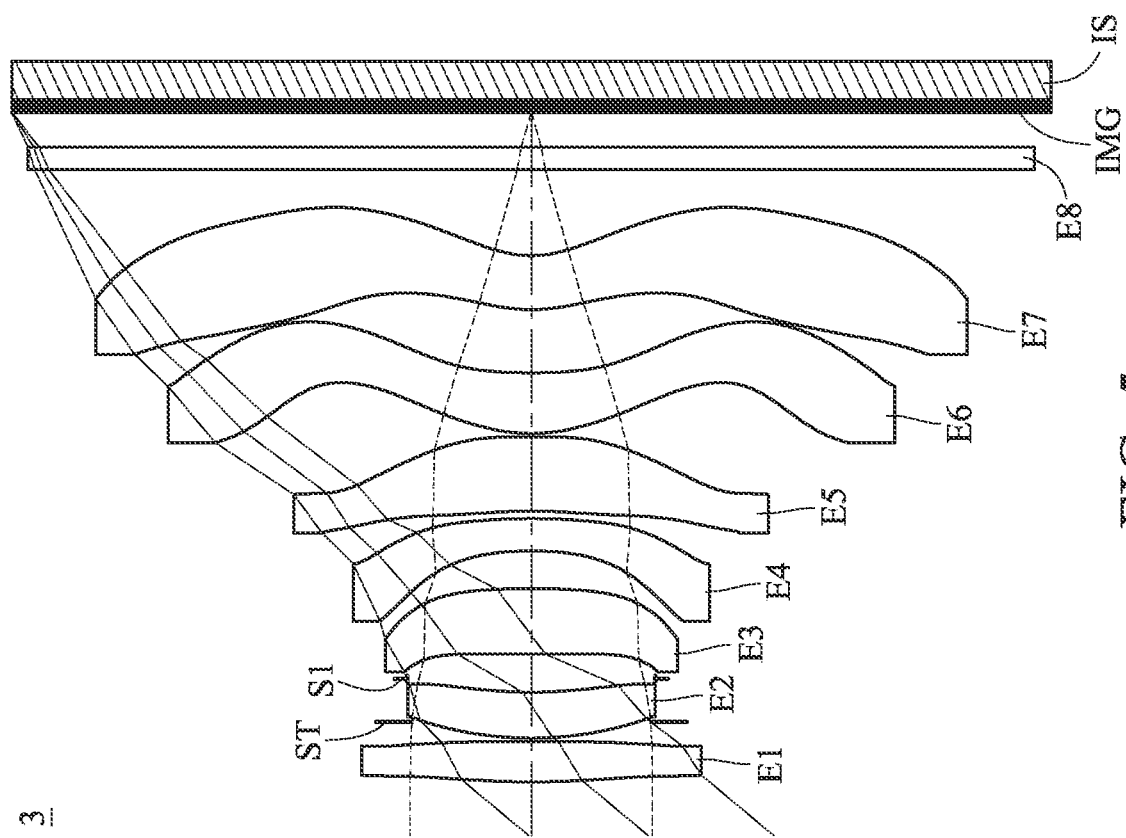
FIG. 5 is a schematic view of an image capturing unit according to the 3rd embodiment of the present disclosure.
Figure 6:
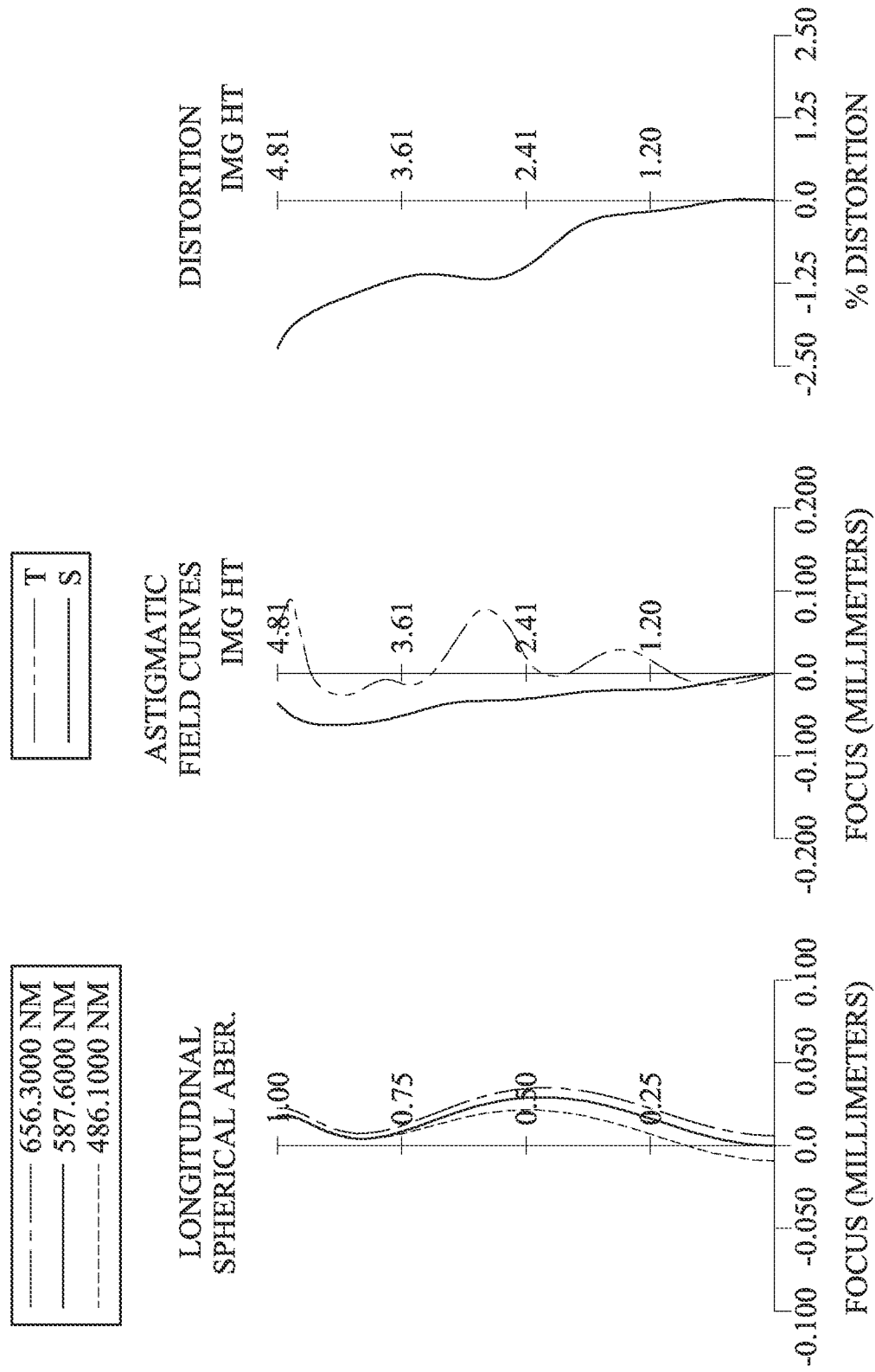
FIG. 6 shows spherical aberration curves, astigmatic field curves and a distortion curve of the image capturing unit according to the 3rd embodiment.

FIG. 5 is a schematic view of an image capturing unit according to the 3rd embodiment of the present disclosure. FIG. 6 shows, in order from left to right, spherical aberration curves, astigmatic field curves and a distortion curve of the image capturing unit according to the 3rd embodiment. In FIG. 5, the image capturing unit 3 includes the optical photographing system (its reference numeral is omitted) of the present disclosure and an image sensor IS. The optical photographing system includes, in order from an object side to an image side along an optical axis, a first lens element E1, an aperture stop ST, a second lens element E2, a stop S1, a third lens element E3, a fourth lens element E4, a fifth lens element E5, a sixth lens element E6, a seventh lens element E7, a filter E8 and an image surface IMG. The optical photographing system includes seven lens elements (E1, E2, E3, E4, E5, E6 and E7) with no additional lens element disposed between each of the adjacent seven lens elements.

The first lens element E1 with positive refractive power has an object-side surface being convex in a paraxial region thereof and an image-side surface being convex in a paraxial region thereof. The first lens element E1 is made of plastic material and has the object-side surface and the image-side surface being both aspheric. The object-side surface of the first lens element E1 has two inflection points. The image-side surface of the first lens element E1 has one inflection point.

The second lens element E2 with positive refractive power has an object-side surface being convex in a paraxial region thereof and an image-side surface being concave in a paraxial region thereof. The second lens element E2 is made of plastic material and has the object-side surface and the image-side surface being both aspheric. The image-side surface of the second lens element E2 has one inflection point.

The third lens element E3 with positive refractive power has an object-side surface being convex in a paraxial region thereof and an image-side surface being convex in a paraxial region thereof. The third lens element E3 is made of plastic material and has the object-side surface and the image-side surface being both aspheric. The object-side surface of the third lens element E3 has one inflection point.

The fourth lens element E4 with negative refractive power has an object-side surface being concave in a paraxial region thereof and an image-side surface being convex in a paraxial region thereof. The fourth lens element E4 is made of plastic material and has the object-side surface and the image-side surface being both aspheric. The object-side surface of the fourth lens element E4 has one inflection point. The image-side surface of the fourth lens element E4 has one inflection point.

The fifth lens element E5 with negative refractive power has an object-side surface being concave in a paraxial region thereof and an image-side surface being convex in a paraxial region thereof. The fifth lens element E5 is made of plastic material and has the object-side surface and the image-side surface being both aspheric. The object-side surface of the fifth lens element E5 has four inflection points. The image-side surface of the fifth lens element E5 has two inflection point.

The sixth lens element E6 with positive refractive power has an object-side surface being convex in a paraxial region thereof and an image-side surface being concave in a paraxial region thereof. The sixth lens element E6 is made of plastic material and has the object-side surface and the image-side surface being both aspheric. The object-side surface of the sixth lens element E6 has two inflection points. The image-side surface of the sixth lens element E6 has two inflection points. The object-side surface of the sixth lens element E6 has at least one concave critical point in an off-axis region thereof. The image-side surface of the sixth lens element E6 has at least one convex critical point in an off-axis region thereof.

The seventh lens element E7 with negative refractive power has an object-side surface being convex in a paraxial region thereof and an image-side surface being concave in a paraxial region thereof. The seventh lens element E7 is made of plastic material and has the object-side surface and the image-side surface being both aspheric. The object-side surface of the seventh lens element E7 has four inflection points. The image-side surface of the seventh lens element E7 has one inflection point. The image-side surface of the seventh lens element E7 has at least one convex critical point in an off-axis region thereof.

The filter E8 is made of glass material and located between the seventh lens element E7 and the image surface IMG, and will not affect the focal length of the optical photographing system. The image sensor IS is disposed on or near the image surface IMG of the optical photographing system.

The detailed optical data of the 3rd embodiment are shown in Table 5 and the aspheric surface data are shown in Table 6 below.

TABLE 5

3rd Embodiment
f = 4.11 mm, Fno = 1.83, HFOV = 50.1 deg.

| Surface # |          | Curvature Radius | Thickness | Material | Index | Abbe # | Focal Length |
|---|---|---|---|---|---|---|---|
| 0  | Object    | Plano           | Infinity |         |       |      |       |
| 1  | Lens 1    | 7.3609 (ASP)    | 0.376    | Plastic | 1.545 | 56.1 | 11.33 |
| 2  |           | −37.6563 (ASP)  | 0.180    |         |       |      |       |
| 3  | Ape. Stop | Plano           | −0.150   |         |       |      |       |
| 4  | Lens 2    | 3.3594 (ASP)    | 0.427    | Plastic | 1.544 | 56.0 | 24.50 |
| 5  |           | 4.2905 (ASP)    | 0.122    |         |       |      |       |
| 6  | Stop      | Plano           | 0.232    |         |       |      |       |
| 7  | Lens 3    | 22.2731 (ASP)   | 0.608    | Plastic | 1.544 | 56.0 | 10.87 |
| 8  |           | −7.9763 (ASP)   | 0.350    |         |       |      |       |
| 9  | Lens 4    | −2.9482 (ASP)   | 0.300    | Plastic | 1.686 | 18.4 | −8.43 |
| 10 |           | −6.2587 (ASP)   | 0.069    |         |       |      |       |
| 11 | Lens 5    | −4.9671 (ASP)   | 0.691    | Plastic | 1.566 | 37.4 | −11.78|
| 12 |           | −20.4315 (ASP)  | 0.030    |         |       |      |       |
| 13 | Lens 6    | 1.5383 (ASP)    | 0.564    | Plastic | 1.544 | 56.0 | 3.43  |
| 14 |           | 7.6718 (ASP)    | 0.586    |         |       |      |       |
| 15 | Lens 7    | 1.5312 (ASP)    | 0.500    | Plastic | 1.534 | 56.0 | −6.83 |
| 16 |           | 0.9562 (ASP)    | 0.800    |         |       |      |       |
| 17 | Filter    | Plano           | 0.210    | Glass   | 1.517 | 64.2 | —     |
| 18 |           | Plano           | 0.321    |         |       |      |       |
| 19 | Image     | Plano           | —        |         |       |      |       |

Note:
Reference wavelength is 587.6 nm (d-line).
An effective radius of the stop S1 (Surface 6) is 1.150 mm.

TABLE 6

Aspheric Coefficients

| Surface # | 1 | 2 | 4 | 5 |
|---|---|---|---|---|
| k =   | −8.10496E+01    | 2.23840E+01     | −3.45642E+00    | −1.60878E−01    |
| A4 =  | 3.06258568E−03  | −5.12508760E−03 | 1.40297942E−02  | −1.90231113E−02 |
| A6 =  | −1.97077471E−02 | −3.13739453E−02 | 2.72265030E−03  | −3.61125451E−02 |
| A8 =  | 1.72265836E−02  | 7.18000852E−02  | −6.18406493E−03 | 3.81906269E−02  |
| A10 = | −1.23209027E−02 | −8.53933960E−02 | 6.68206717E−03  | −3.69776046E−02 |
| A12 = | 6.15955692E−03  | 5.73143821E−02  | −4.00388145E−03 | 1.45284409E−02  |
| A14 = | −1.66958145E−03 | −1.99768335E−02 | 1.03834609E−03  | −1.70777526E−03 |
| A16 = | 1.90713497E−04  | 2.84782572E−03  | —               | —               |

| Surface # | 7 | 8 | 9 | 10 |
|---|---|---|---|---|
| k =   | −4.84556E+01    | −8.66276E+00    | −7.11316E−01    | −8.95679E+01    |
| A4 =  | −4.72202203E−02 | −5.55634709E−02 | −8.58917703E−02 | −9.69999707E−02 |
| A6 =  | 3.03575289E−04  | −6.17041419E−03 | −1.55649638E−01 | 2.45000533E−01  |
| A8 =  | −5.33636371E−02 | −6.40781742E−02 | 5.76870958E−01  | −4.46240466E−01 |
| A10 = | 4.89773492E−02  | 7.46998962E−02  | −1.36609319E+00 | 3.61639459E−01  |
| A12 = | −3.76375811E−02 | −4.47624154E−02 | 1.84950795E+00  | −1.37226337E−01 |
| A14 = | 1.06184276E−02  | 1.31135056E−02  | −1.42332030E+00 | 1.58837775E−02  |
| A16 = | —               | −1.33050871E−03 | 6.20785019E−01  | 4.59472918E−03  |
| A18 = | —               | —               | −1.42706049E−01 | −1.50199108E−03 |
| A20 = | —               | —               | 1.33984661E−02  | 1.18117312E−04  |

| Surface # | 11 | 12 | 13 | 14 |
|---|---|---|---|---|
| k =   | −1.36693E+00    | 2.56370E+01     | −3.48891E+00    | 1.57305E−01     |
| A4 =  | 3.47424742E−02  | −3.08693866E−01 | −5.85012025E−02 | 2.14277357E−01  |
| A6 =  | 2.00109223E−01  | 2.75434568E−01  | 1.18722462E−01  | −1.51357241E−01 |
| A8 =  | −3.91651006E−01 | −1.52992160E−01 | −1.22751292E−01 | 4.76770267E−02  |
| A10 = | 3.36458921E−01  | 6.82171462E−02  | 7.01068939E−02  | −4.80719146E−03 |
| A12 = | −1.67127606E−01 | −2.80153782E−02 | −2.56790523E−02 | −2.11486437E−03 |
| A14 = | 5.06922146E−02  | 9.13766865E−03  | 6.37045060E−03  | 1.03915249E−03  |
| A16 = | −9.20216336E−03 | −1.81954155E−03 | −1.09871723E−03 | −2.27956473E−04 |
| A18 = | 9.13392002E−04  | 1.49945190E−04  | 1.32771603E−04  | 3.03210081E−05  |

TABLE 6-continued

| Aspheric Coefficients | | | | |
|---|---|---|---|---|
| A20 = | −3.79785960E−05 | 9.65802799E−06 | −1.10845413E−05 | −2.57119526E−06 |
| A22 = | — | −2.70274233E−06 | 6.10739345E−07 | 1.36049681E−07 |
| A24 = | — | 1.42261288E−07 | −1.99931598E−08 | −4.09908667E−09 |
| A26 = | — | — | 2.94163708E−10 | 5.37257647E−11 |

| Surface # | 15 | 16 |
|---|---|---|
| k = | −2.21230E+00 | −2.78269E+00 |
| A4 = | −2.42942070E−01 | −1.61854576E−01 |
| A6 = | 1.39950588E−01 | 1.14921091E−01 |
| A8 = | −4.67728816E−02 | −6.00882931E−02 |
| A10 = | 2.48515680E−03 | 2.24896187E−02 |
| A12 = | 4.62929809E−03 | −6.15943099E−03 |
| A14 = | −2.11690672E−03 | 1.25163205E−03 |
| A16 = | 4.96675813E−04 | −1.89076315E−04 |
| A18 = | −7.47607352E−05 | 2.11483942E−05 |
| A20 = | 7.68759560E−06 | −1.73601534E−06 |
| A22 = | −5.48579758E−07 | 1.02880461E−07 |
| A24 = | 2.68115869E−08 | −4.27295855E−09 |
| A26 = | −8.57868213E−10 | 1.17797786E−10 |
| A28 = | 1.62053134E−11 | −1.93360567E−12 |
| A30 = | −1.37087964E−13 | 1.42889905E−14 |

In the 3rd embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 3rd embodiment, so an explanation in this regard will not be provided again.

Moreover, these parameters can be calculated from Table 5 and Table 6 as the following values and satisfy the following conditions:

| 3rd Embodiment | | | |
|---|---|---|---|
| f [mm] | 4.11 | f/f45 | −0.85 |
| Fno | 1.83 | f/f67 | 1.00 |
| HFOV [deg.] | 50.1 | f3/f5 | −0.92 |
| V2 + V3 + V6 + V7 | 223.9 | f5/f6 | −3.44 |
| V4/N4 | 10.90 | f5/f7 | 1.72 |
| (CT3 + CT4)/T34 | 2.59 | f6/R11 + f6/R12 | 2.67 |
| (CT4 + CT5)/T45 | 14.36 | Y72/Y11 | 2.56 |
| CT1/|f1| + CT2/|f2| | 0.05 | Yc61/Y61 | 0.60 |
| CT5/T67 | 1.18 | Yc62/Y62 | 0.61 |
| TL/ImgH | 1.29 | Yc72/Y72 | 0.45 |
| |R1/f| | 1.79 | — | — |

4th Embodiment

Figure 7:
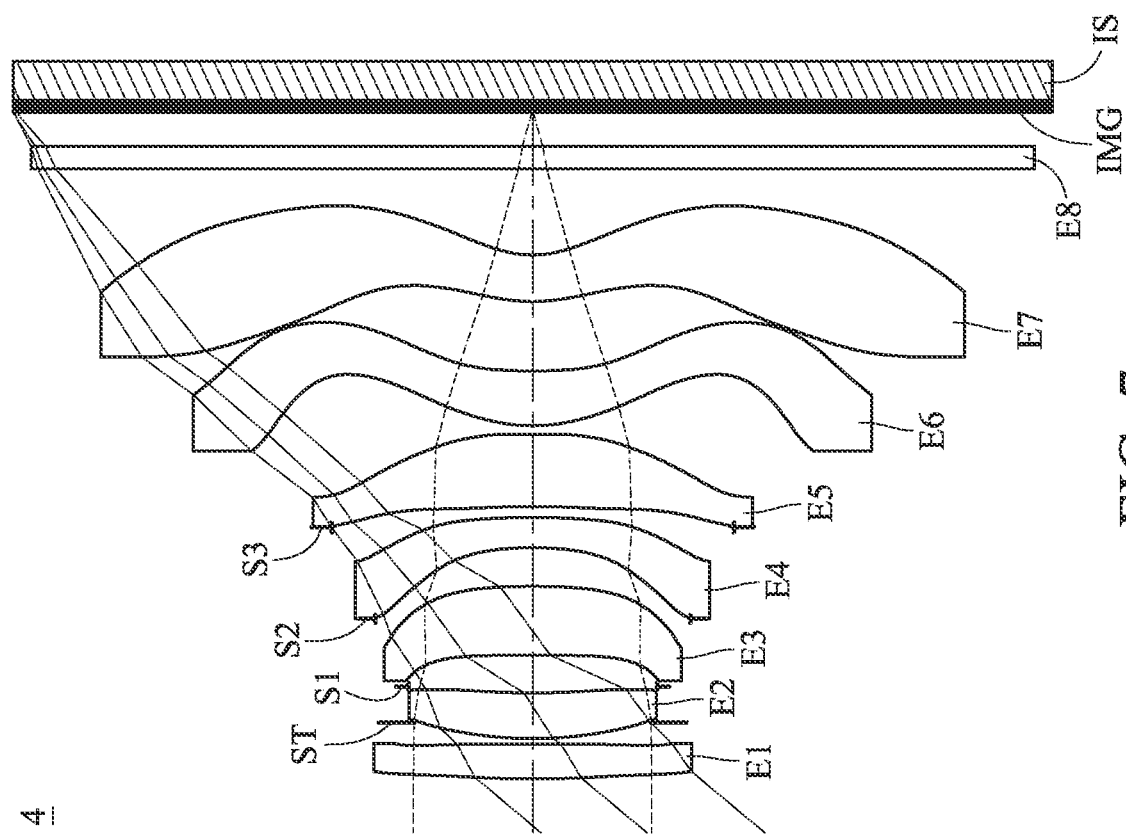
FIG. 7 is a schematic view of an image capturing unit according to the 4th embodiment of the present disclosure.
Figure 8:
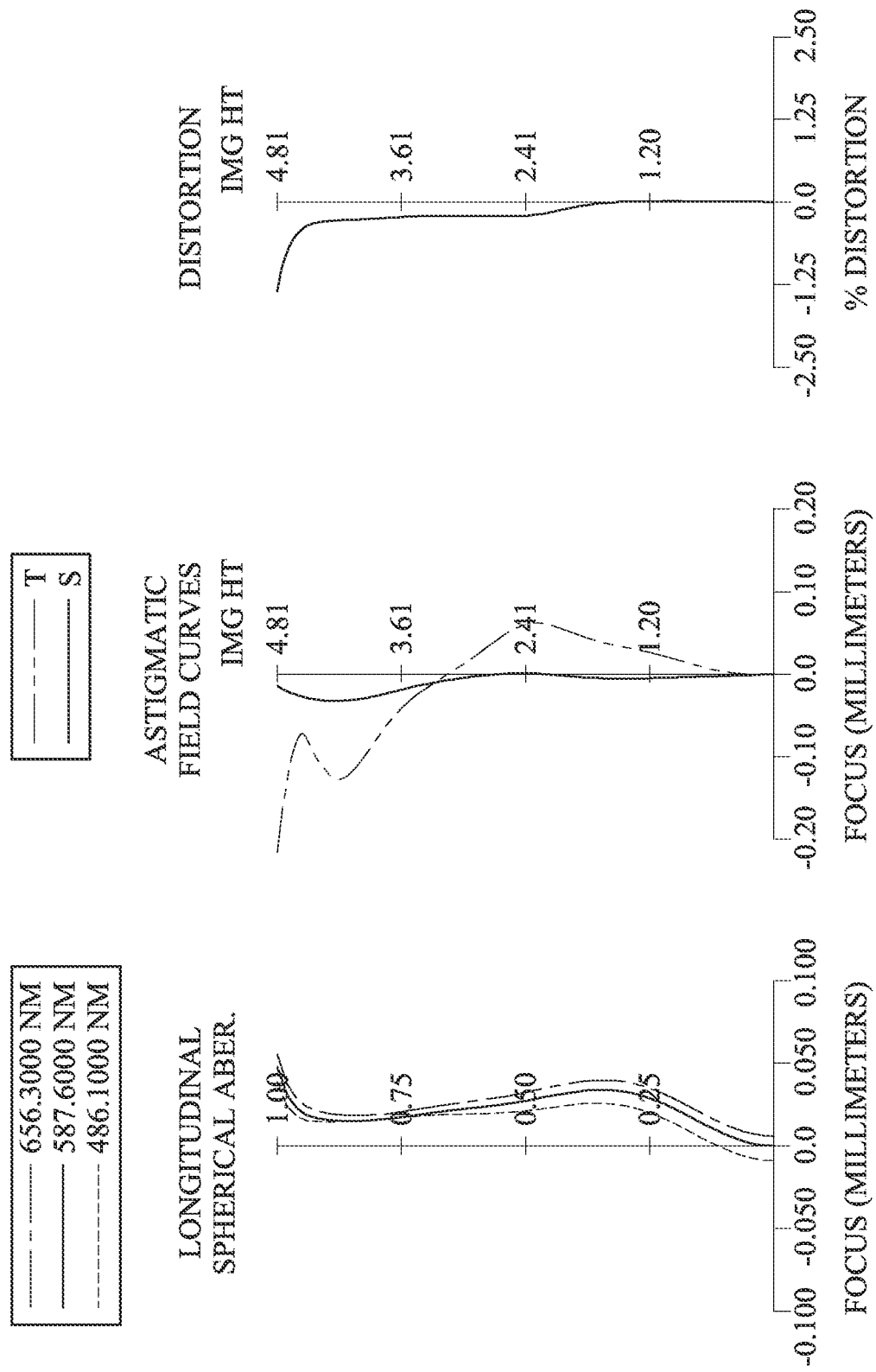
FIG. 8 shows spherical aberration curves, astigmatic field curves and a distortion curve of the image capturing unit according to the 4th embodiment.

FIG. 7 is a schematic view of an image capturing unit according to the 4th embodiment of the present disclosure. FIG. 8 shows, in order from left to right, spherical aberration curves, astigmatic field curves and a distortion curve of the image capturing unit according to the 4th embodiment. In FIG. 7, the image capturing unit 4 includes the optical photographing system (its reference numeral is omitted) of the present disclosure and an image sensor IS. The optical photographing system includes, in order from an object side to an image side along an optical axis, a first lens element E1, an aperture stop ST, a second lens element E2, a stop S1, a third lens element E3, a stop S2, a fourth lens element E4, a stop S3, a fifth lens element E5, a sixth lens element E6, a seventh lens element E7, a filter E8 and an image surface IMG. The optical photographing system includes seven lens elements (E1, E2, E3, E4, E5, E6 and E7) with no additional lens element disposed between each of the adjacent seven lens elements.

The first lens element E1 with positive refractive power has an object-side surface being convex in a paraxial region thereof and an image-side surface being concave in a paraxial region thereof. The first lens element E1 is made of plastic material and has the object-side surface and the image-side surface being both aspheric. The object-side surface of the first lens element E1 has two inflection points. The image-side surface of the first lens element E1 has two inflection points.

The second lens element E2 with positive refractive power has an object-side surface being convex in a paraxial region thereof and an image-side surface being concave in a paraxial region thereof. The second lens element E2 is made of plastic material and has the object-side surface and the image-side surface being both aspheric. The image-side surface of the second lens element E2 has two inflection points.

The third lens element E3 with positive refractive power has an object-side surface being convex in a paraxial region thereof and an image-side surface being convex in a paraxial region thereof. The third lens element E3 is made of plastic material and has the object-side surface and the image-side surface being both aspheric. The object-side surface of the third lens element E3 has one inflection point.

The fourth lens element E4 with negative refractive power has an object-side surface being concave in a paraxial region thereof and an image-side surface being convex in a paraxial region thereof. The fourth lens element E4 is made of plastic material and has the object-side surface and the image-side surface being both aspheric. The object-side surface of the fourth lens element E4 has one inflection point. The image-side surface of the fourth lens element E4 has one inflection point.

The fifth lens element E5 with negative refractive power has an object-side surface being concave in a paraxial region thereof and an image-side surface being convex in a paraxial region thereof. The fifth lens element E5 is made of plastic material and has the object-side surface and the image-side surface being both aspheric. The object-side surface of the fifth lens element E5 has four inflection points. The image-side surface of the fifth lens element E5 has one inflection point.

The sixth lens element E6 with positive refractive power has an object-side surface being convex in a paraxial region thereof and an image-side surface being concave in a paraxial region thereof. The sixth lens element E6 is made of plastic material and has the object-side surface and the image-side surface being both aspheric. The object-side surface of the sixth lens element E6 has two inflection points. The image-side surface of the sixth lens element E6 has two inflection points. The object-side surface of the sixth lens element E6 has at least one concave critical point in an off-axis region thereof. The image-side surface of the sixth lens element E6 has at least one convex critical point in an off-axis region thereof.

The seventh lens element E7 with negative refractive power has an object-side surface being convex in a paraxial region thereof and an image-side surface being concave in a paraxial region thereof. The seventh lens element E7 is made of plastic material and has the object-side surface and the image-side surface being both aspheric. The object-side surface of the seventh lens element E7 has two inflection points. The image-side surface of the seventh lens element E7 has one inflection point. The image-side surface of the seventh lens element E7 has at least one convex critical point in an off-axis region thereof.

The filter E8 is made of glass material and located between the seventh lens element E7 and the image surface IMG, and will not affect the focal length of the optical photographing system. The image sensor IS is disposed on or near the image surface IMG of the optical photographing system.

The detailed optical data of the 4th embodiment are shown in Table 7 and the aspheric surface data are shown in Table 8 below.

TABLE 7

4th Embodiment
f = 4.07 mm, Fno = 1.84, HFOV = 50.1 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | 8.3314 (ASP) | 0.324 | Plastic | 1.545 | 56.1 | 18.39 |
| 2 | | 48.7332 (ASP) | 0.199 | | | | |
| 3 | Ape. Stop | Plano | −0.149 | | | | |
| 4 | Lens 2 | 3.3212 (ASP) | 0.424 | Plastic | 1.545 | 56.1 | 12.21 |
| 5 | | 6.3334 (ASP) | 0.062 | | | | |
| 6 | Stop | Plano | 0.287 | | | | |
| 7 | Lens 3 | 2791.4871 (ASP) | 0.640 | Plastic | 1.545 | 56.1 | 12.04 |
| 8 | | −6.5740 (ASP) | −0.302 | | | | |
| 9 | Stop | Plano | 0.661 | | | | |
| 10 | Lens 4 | −2.9891 (ASP) | 0.280 | Plastic | 1.686 | 18.4 | −8.13 |
| 11 | | −6.6829 (ASP) | −0.093 | | | | |
| 12 | Stop | Plano | 0.195 | | | | |
| 13 | Lens 5 | −7.3449 (ASP) | 0.671 | Plastic | 1.566 | 37.4 | −16.85 |
| 14 | | −32.9946 (ASP) | 0.077 | | | | |
| 15 | Lens 6 | 1.5457 (ASP) | 0.510 | Plastic | 1.545 | 56.1 | 3.32 |
| 16 | | 9.4342 (ASP) | 0.642 | | | | |
| 17 | Lens 7 | 1.5533 (ASP) | 0.431 | Plastic | 1.534 | 56.0 | −5.39 |
| 18 | | 0.9114 (ASP) | 0.800 | | | | |
| 19 | Filter | Plano | 0.210 | Glass | 1.517 | 64.2 | — |
| 20 | | Plano | 0.312 | | | | |
| 21 | Image | Plano | — | | | | |

Note:
Reference wavelength is 587.6 nm (d-line).
An effective radius of the stop S1 (Surface 6) is 1.150 mm.
An effective radius of the stop S2 (Surface 9) is 1.460 mm.
An effective radius of the stop S3 (Surface 12) is 1.863 mm.

TABLE 8

Aspheric Coefficients

| Surface # | 1 | 2 | 4 | 5 |
|---|---|---|---|---|
| k = | 0.00000E+00 | 0.00000E+00 | 0.00000E+00 | 0.00000E+00 |
| A4 = | −2.67761216E−02 | −8.34917091E−02 | −7.63241342E−02 | −3.68280076E−02 |
| A6 = | 1.51123710E−02 | 1.78542657E−01 | 1.88839995E−01 | −3.92281029E−02 |
| A8 = | −3.16538457E−02 | −2.90019557E−01 | −3.38815749E−01 | 8.86309739E−02 |
| A10 = | 3.69479966E−02 | 3.04756490E−01 | 4.09129374E−01 | −1.44455541E−01 |
| A12 = | −2.29528736E−02 | −1.87521233E−01 | −3.03306521E−01 | 1.34544999E−01 |
| A14 = | 7.79027998E−03 | 6.23147708E−02 | 1.27223130E−01 | −6.47799021E−02 |
| A16 = | −1.08387032E−03 | −8.26618744E−03 | −2.20650401E−02 | 1.36874707E−02 |

| Surface # | 7 | 8 | 10 | 11 |
|---|---|---|---|---|
| k = | 0.00000E+00 | 6.80186E+00 | −1.93140E+00 | −5.49984E+01 |
| A4 = | −7.75190984E−02 | −5.27107750E−02 | −4.61517850E−02 | −1.35193145E−02 |
| A6 = | 7.89253013E−02 | −7.56037047E−02 | −2.80137741E−01 | 6.70909599E−02 |
| A8 = | −3.19946248E−01 | 7.93379468E−02 | 4.93568566E−01 | −3.58391816E−01 |
| A10 = | 5.33223065E−01 | −8.70719654E−02 | −8.47449874E−01 | 4.25475407E−01 |
| A12 = | −5.25758195E−01 | 7.04580809E−02 | 1.18488193E+00 | −2.19195954E−01 |

TABLE 8-continued

| Aspheric Coefficients | | | | |
|---|---|---|---|---|
| A14 = | 2.77155422E−01 | −3.19020463E−02 | −1.00166920E+00 | 4.26779915E−02 |
| A16 = | −6.24618415E−02 | 5.57241003E−03 | 4.76958921E−01 | 5.28861589E−03 |
| A18 = | — | — | −1.18382045E−01 | −3.45851965E−03 |
| A20 = | — | — | 1.19330083E−02 | 3.98772594E−04 |

| Surface # | 13 | 14 | 15 | 16 |
|---|---|---|---|---|
| k = | 9.05210E+00 | 0.00000E+00 | −3.87172E+00 | 5.58038E+00 |
| A4 = | −1.54360367E−02 | −3.98091859E−01 | −4.41863912E−02 | 2.89690579E−01 |
| A6 = | 3.96940291E−01 | 5.23035352E−01 | 1.72854353E−01 | −2.37273776E−01 |
| A8 = | −8.32197285E−01 | −4.85860558E−01 | −2.31298055E−01 | 1.03290356E−01 |
| A10 = | 9.07361236E−01 | 3.42509213E−01 | 1.67939003E−01 | −3.21012698E−02 |
| A12 = | −6.64511397E−01 | −1.66027399E−01 | −8.17311529E−02 | 8.37553647E−03 |
| A14 = | 3.83015693E−01 | 2.86932866E−02 | 2.84175322E−02 | −1.99495965E−03 |
| A16 = | −1.95527417E−01 | 2.75137481E−02 | −7.08024836E−03 | 4.09393085E−04 |
| A18 = | 8.88428682E−02 | −2.57810135E−02 | 1.21612099E−03 | −6.47109205E−05 |
| A20 = | −3.26775816E−02 | 1.08967736E−02 | −1.31082832E−04 | 7.25295844E−06 |
| A22 = | 8.77223564E−03 | −2.71773472E−03 | 6.53946214E−06 | −5.42541579E−07 |
| A24 = | −1.56809276E−03 | 4.08219455E−04 | 2.02243797E−07 | 2.51958553E−08 |
| A26 = | 1.65051425E−04 | −3.41888862E−05 | −4.28044503E−08 | −6.37263689E−10 |
| A28 = | −7.70037169E−06 | 1.22806099E−06 | 1.58229455E−09 | 6.31616845E−12 |

| Surface # | 17 | 18 |
|---|---|---|
| k = | −2.90346E+00 | −2.58813E+00 |
| A4 = | −1.97307150E−01 | −1.67425111E−01 |
| A6 = | 8.80152752E−02 | 1.11439307E−01 |
| A8 = | −1.52672141E−02 | −5.58951604E−02 |
| A10 = | −1.12897729E−02 | 2.00996781E−02 |
| A12 = | 9.28544369E−03 | −5.22775542E−03 |
| A14 = | −3.30844705E−03 | 1.00391627E−03 |
| A16 = | 7.21776947E−04 | −1.44246962E−04 |
| A18 = | −1.05841863E−04 | 1.55624936E−05 |
| A20 = | 1.08104791E−05 | −1.25312979E−06 |
| A22 = | −7.74721317E−07 | 7.40626729E−08 |
| A24 = | 3.83367375E−08 | −3.11341810E−09 |
| A26 = | −1.25096960E−09 | 8.79736514E−11 |
| A28 = | 2.42718823E−11 | −1.49568028E−12 |
| A30 = | −2.12426130E−13 | 1.15474514E−14 |

In the 4th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 4th embodiment, so an explanation in this regard will not be provided again.

Moreover, these parameters can be calculated from Table 7 and Table 8 as the following values and satisfy the following conditions:

| 4th Embodiment | | | |
|---|---|---|---|
| f [mm] | 4.07 | f/f45 | −0.75 |
| Fno | 1.84 | f/f67 | 0.91 |
| HFOV [deg.] | 50.1 | f3/f5 | −0.71 |
| V2 + V3 + V6 + V7 | 224.2 | f5/f6 | −5.08 |
| V4/N4 | 10.90 | f5/f7 | 3.13 |
| (CT3 + CT4)/T34 | 2.56 | f6/R11 + f6/R12 | 2.50 |
| (CT4 + CT5)/T45 | 9.32 | Y72/Y11 | 2.72 |
| CT1/|f1| + CT2/|f2| | 0.05 | Yc61/Y61 | 0.66 |
| CT5/T67 | 1.05 | Yc62/Y62 | 0.62 |
| TL/ImgH | 1.28 | Yc72/Y72 | 0.45 |
| |R1/f| | 2.05 | — | — |

5th Embodiment

Figure 9:
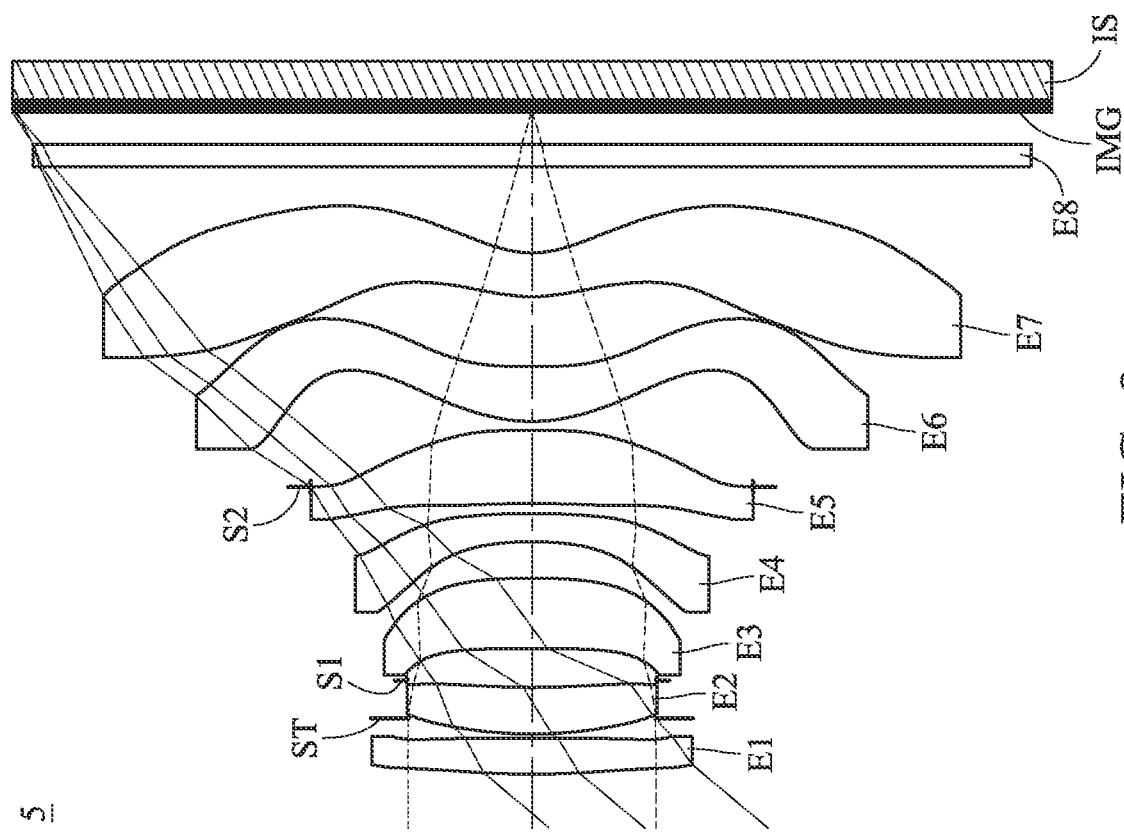
FIG. 9 is a schematic view of an image capturing unit according to the 5th embodiment of the present disclosure.
Figure 10:
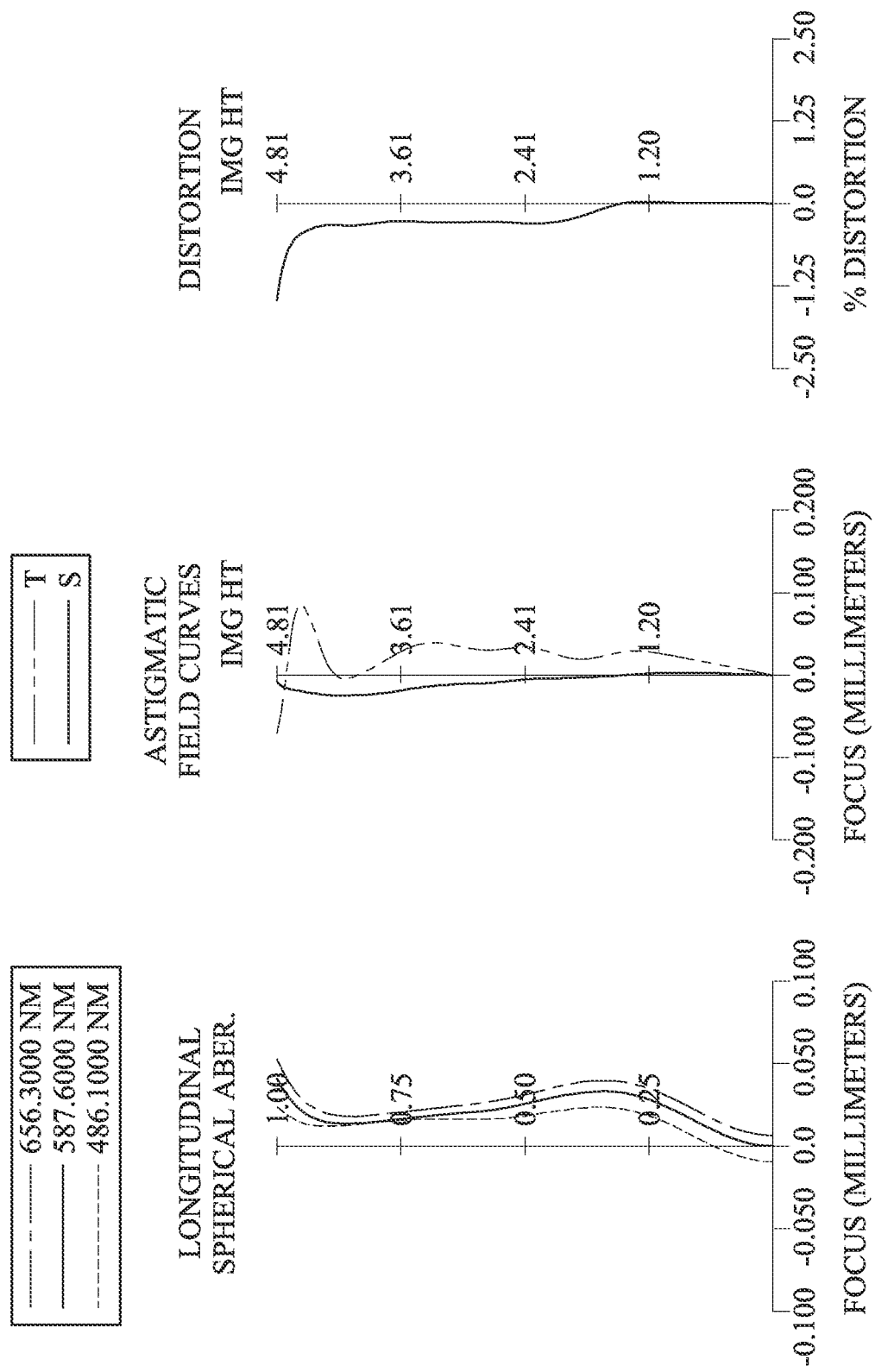
FIG. 10 shows spherical aberration curves, astigmatic field curves and a distortion curve of the image capturing unit according to the 5th embodiment.

FIG. 9 is a schematic view of an image capturing unit according to the 5th embodiment of the present disclosure. FIG. 10 shows, in order from left to right, spherical aberration curves, astigmatic field curves and a distortion curve of the image capturing unit according to the 5th embodiment. In FIG. 9, the image capturing unit 5 includes the optical photographing system (its reference numeral is omitted) of the present disclosure and an image sensor IS. The optical photographing system includes, in order from an object side to an image side along an optical axis, a first lens element E1, an aperture stop ST, a second lens element E2, a stop S1, a third lens element E3, a fourth lens element E4, a fifth lens element E5, a stop S2, a sixth lens element E6, a seventh lens element E7, a filter E8 and an image surface IMG. The optical photographing system includes seven lens elements (E1, E2, E3, E4, E5, E6 and E7) with no additional lens element disposed between each of the adjacent seven lens elements.

The first lens element E1 with positive refractive power has an object-side surface being convex in a paraxial region thereof and an image-side surface being concave in a paraxial region thereof. The first lens element E1 is made of plastic material and has the object-side surface and the image-side surface being both aspheric. The object-side surface of the first lens element E1 has two inflection points. The image-side surface of the first lens element E1 has two inflection points.

The second lens element E2 with positive refractive power has an object-side surface being convex in a paraxial region thereof and an image-side surface being concave in a paraxial region thereof. The second lens element E2 is made of glass material and has the object-side surface and the image-side surface being both aspheric. The image-side surface of the second lens element E2 has two inflection points.

The third lens element E3 with positive refractive power has an object-side surface being concave in a paraxial region thereof and an image-side surface being convex in a paraxial region thereof. The third lens element E3 is made of plastic material and has the object-side surface and the image-side surface being both aspheric.

The fourth lens element E4 with negative refractive power has an object-side surface being concave in a paraxial region thereof and an image-side surface being convex in a paraxial region thereof. The fourth lens element E4 is made of plastic material and has the object-side surface and the image-side surface being both aspheric. The object-side surface of the fourth lens element E4 has one inflection point. The image-side surface of the fourth lens element E4 has one inflection point.

The fifth lens element E5 with negative refractive power has an object-side surface being concave in a paraxial region thereof and an image-side surface being concave in a paraxial region thereof. The fifth lens element E5 is made of plastic material and has the object-side surface and the image-side surface being both aspheric. The object-side surface of the fifth lens element E5 has four inflection points. The image-side surface of the fifth lens element E5 has two inflection points.

The sixth lens element E6 with positive refractive power has an object-side surface being convex in a paraxial region thereof and an image-side surface being concave in a paraxial region thereof. The sixth lens element E6 is made of plastic material and has the object-side surface and the image-side surface being both aspheric. The object-side surface of the sixth lens element E6 has two inflection points. The image-side surface of the sixth lens element E6 has four inflection points. The object-side surface of the sixth lens element E6 has at least one concave critical point in an off-axis region thereof. The image-side surface of the sixth lens element E6 has at least one convex critical point in an off-axis region thereof.

The seventh lens element E7 with negative refractive power has an object-side surface being convex in a paraxial region thereof and an image-side surface being concave in a paraxial region thereof. The seventh lens element E7 is made of plastic material and has the object-side surface and the image-side surface being both aspheric. The object-side surface of the seventh lens element E7 has six inflection points. The image-side surface of the seventh lens element E7 has one inflection point. The image-side surface of the seventh lens element E7 has at least one convex critical point in an off-axis region thereof.

The filter E8 is made of glass material and located between the seventh lens element E7 and the image surface IMG, and will not affect the focal length of the optical photographing system. The image sensor IS is disposed on or near the image surface IMG of the optical photographing system.

The detailed optical data of the 5th embodiment are shown in Table 9 and the aspheric surface data are shown in Table 10 below.

TABLE 9

5th Embodiment
f = 4.09 mm, Fno = 1.78, HFOV = 50.0 deg.

| Surface # |  | Curvature Radius | Thickness | Material | Index | Abbe # | Focal Length |
|---|---|---|---|---|---|---|---|
| 0 | Object | Plano | Infinity | | | | |
| 1 | Lens 1 | 7.0464 (ASP) | 0.331 | Plastic | 1.545 | 56.1 | 17.56 |
| 2 |  | 26.2758 (ASP) | 0.184 | | | | |
| 3 | Ape. Stop | Plano | −0.143 | | | | |
| 4 | Lens 2 | 3.5375 (ASP) | 0.433 | Glass | 1.589 | 61.2 | 11.74 |
| 5 |  | 6.9130 (ASP) | 0.061 | | | | |
| 6 | Stop | Plano | 0.299 | | | | |
| 7 | Lens 3 | −54.5503 (ASP) | 0.654 | Plastic | 1.545 | 56.1 | 12.24 |
| 8 |  | −5.9696 (ASP) | 0.338 | | | | |
| 9 | Lens 4 | −2.9758 (ASP) | 0.262 | Plastic | 1.669 | 19.5 | −8.18 |
| 10 |  | −6.7539 (ASP) | 0.094 | | | | |
| 11 | Lens 5 | −7.7738 (ASP) | 0.676 | Plastic | 1.566 | 37.4 | −13.19 |
| 12 |  | 193.4236 (ASP) | −0.520 | | | | |
| 13 | Stop | Plano | 0.602 | | | | |
| 14 | Lens 6 | 1.4662 (ASP) | 0.509 | Plastic | 1.544 | 56.0 | 3.12 |
| 15 |  | 9.4457 (ASP) | 0.650 | | | | |
| 16 | Lens 7 | 1.5793 (ASP) | 0.405 | Plastic | 1.534 | 56.0 | −4.95 |
| 17 |  | 0.9005 (ASP) | 0.800 | | | | |
| 18 | Filter | Plano | 0.210 | Glass | 1.517 | 64.2 | — |
| 19 |  | Plano | 0.296 | | | | |
| 20 | Image | Plano | — | | | | |

Note:
Reference wavelength is 587.6 nm (d-line).
An effective radius of the stop S1 (Surface 6) is 1.155 mm.
An effective radius of the stop S2 (Surface 13) is 2.050 mm.

TABLE 10

Aspheric Coefficients

| Surface # | 1 | 2 | 4 | 5 |
|---|---|---|---|---|
| k = | 0.00000E+00 | 0.00000E+00 | 0.00000E+00 | 0.00000E+00 |
| A4 = | -2.46089761E-02 | -6.50734833E-02 | -5.96892155E-02 | -3.14832984E-02 |
| A6 = | 1.03511606E-02 | 8.19856716E-02 | 1.09860203E-01 | -3.45349298E-02 |
| A8 = | -3.36055625E-02 | -9.81240312E-02 | -1.61663647E-01 | 8.26990214E-02 |
| A10 = | 4.20434693E-02 | 8.58325274E-02 | 1.67746623E-01 | -1.51355290E-01 |
| A12 = | -2.56326613E-02 | -3.89874462E-02 | -9.77967644E-02 | 1.57799096E-01 |
| A14 = | 8.29073443E-03 | 7.04472831E-03 | 2.80604965E-02 | -8.47105966E-02 |
| A16 = | -1.09783460E-03 | 4.07573749E-04 | -1.87459208E-03 | 1.91218949E-02 |

| Surface # | 7 | 8 | 9 | 10 |
|---|---|---|---|---|
| k = | 0.00000E+00 | 6.16592E+00 | -1.86819E+00 | -7.04884E+01 |
| A4 = | -5.70222511E-02 | -5.00031879E-02 | -6.81254171E-02 | -5.68146304E-02 |
| A6 = | -2.16950469E-02 | -7.94829702E-02 | -1.73697657E-01 | 2.66794107E-01 |
| A8 = | -7.77854917E-03 | 9.10000872E-02 | 2.47215381E-01 | -7.77379066E-01 |
| A10 = | -6.17251494E-03 | -1.08111668E-01 | -4.53427618E-01 | 9.58566160E-01 |
| A12 = | 1.67065907E-03 | 8.77395973E-02 | 7.29537724E-01 | -6.54871000E-01 |
| A14 = | 4.47139113E-03 | -3.82621812E-02 | -6.53761680E-01 | 2.69108547E-01 |
| A16 = | -4.66646288E-03 | 6.44179598E-03 | 3.16706302E-01 | -6.63796104E-02 |
| A18 = | — | — | -7.85727346E-02 | 9.08409108E-03 |
| A20 = | — | — | 7.85129722E-03 | -5.30680928E-04 |

| Surface # | 11 | 12 | 14 | 15 |
|---|---|---|---|---|
| k = | 6.74769E+00 | 0.00000E+00 | -3.86928E+00 | 5.54131E+00 |
| A4 = | -3.01071469E-02 | -4.16258718E-01 | -6.59551763E-02 | 2.87426783E-01 |
| A6 = | 5.12073921E-01 | 5.54743914E-01 | 2.31708620E-01 | -2.39067044E-01 |
| A8 = | -1.13640885E+00 | -4.96922268E-01 | -3.33192214E-01 | 1.20046330E-01 |
| A10 = | 1.35832145E+00 | 2.62825645E-01 | 2.88800450E-01 | -5.48811842E-02 |
| A12 = | -1.05418355E+00 | 2.51378340E-02 | -1.79582351E-01 | 2.35733870E-02 |
| A14 = | 5.48463814E-01 | -1.93601188E-01 | 8.24884773E-02 | -8.13606413E-03 |
| A16 = | -1.77069676E-01 | 1.88123586E-01 | -2.76572654E-02 | 2.04274456E-03 |
| A18 = | 2.09700458E-02 | -1.03370879E-01 | 6.64435447E-03 | -3.61059660E-04 |
| A20 = | 9.56619799E-03 | 3.64907216E-02 | -1.12049916E-03 | 4.42234241E-05 |
| A22 = | -5.48957036E-03 | -8.42125416E-03 | 1.28731626E-04 | -3.66379844E-06 |
| A24 = | 1.27914383E-03 | 1.22991806E-03 | -9.55325759E-06 | 1.95469252E-07 |
| A26 = | -1.51269711E-04 | -1.03257782E-04 | 4.11240652E-07 | -6.04858239E-09 |
| A28 = | 7.42107750E-06 | 3.79907204E-06 | -7.76767261E-09 | 8.23161307E-11 |

| Surface # | 16 | 17 |
|---|---|---|
| k = | -2.90451E+00 | -2.69626E+00 |
| A4 = | -2.23375336E-01 | -1.82947372E-01 |
| A6 = | 1.03486287E-01 | 1.31394913E-01 |
| A8 = | -3.96713227E-03 | -6.64814363E-02 |
| A10 = | -3.04102647E-02 | 2.23998719E-02 |
| A12 = | 2.05759697E-02 | -5.02762712E-03 |
| A14 = | -7.16190311E-03 | 7.48099332E-04 |
| A16 = | 1.58225988E-03 | -6.99861943E-05 |
| A18 = | -2.38291094E-04 | 3.18055312E-06 |
| A20 = | 2.51728153E-05 | 9.64655371E-08 |
| A22 = | -1.87336356E-06 | -2.54561780E-08 |
| A24 = | 9.65105363E-08 | 1.82543849E-09 |
| A26 = | -3.28408699E-09 | -7.03852096E-11 |
| A28 = | 6.65248016E-11 | 1.47127189E-12 |
| A30 = | -6.08359539E-13 | -1.31402445E-14 |

In the 5th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 5th embodiment, so an explanation in this regard will not be provided again.

Moreover, these parameters can be calculated from Table 9 and Table 10 as the following values and satisfy the following conditions:

| 5th Embodiment | | | |
|---|---|---|---|
| f [mm] | 4.09 | f/f45 | -0.83 |
| Fno | 1.78 | f/f67 | 0.96 |
| HFOV [deg.] | 50.0 | f3/f5 | -0.93 |
| V2 + V3 + V6 + V7 | 229.3 | f5/f6 | -4.23 |
| V4/N4 | 11.65 | f5/f7 | 2.66 |
| (CT3 + CT4)/T34 | 2.71 | f6/R11 + f6/R12 | 2.46 |
| (CT4 + CT5)/T45 | 9.98 | Y72/Y11 | 2.67 |
| CT1/|f1| + CT2/|f2| | 0.06 | Yc61/Y61 | 0.65 |

-continued

| 5th Embodiment | | | | |
|---|---|---|---|---|
| CT5/T67 | 1.04 | Yc62/Y62 | 0.61 | |
| TL/ImgH | 1.28 | Yc72/Y72 | 0.44 | |
| \|R1/f\| | 1.72 | — | — | |

6th Embodiment

Figure 11:
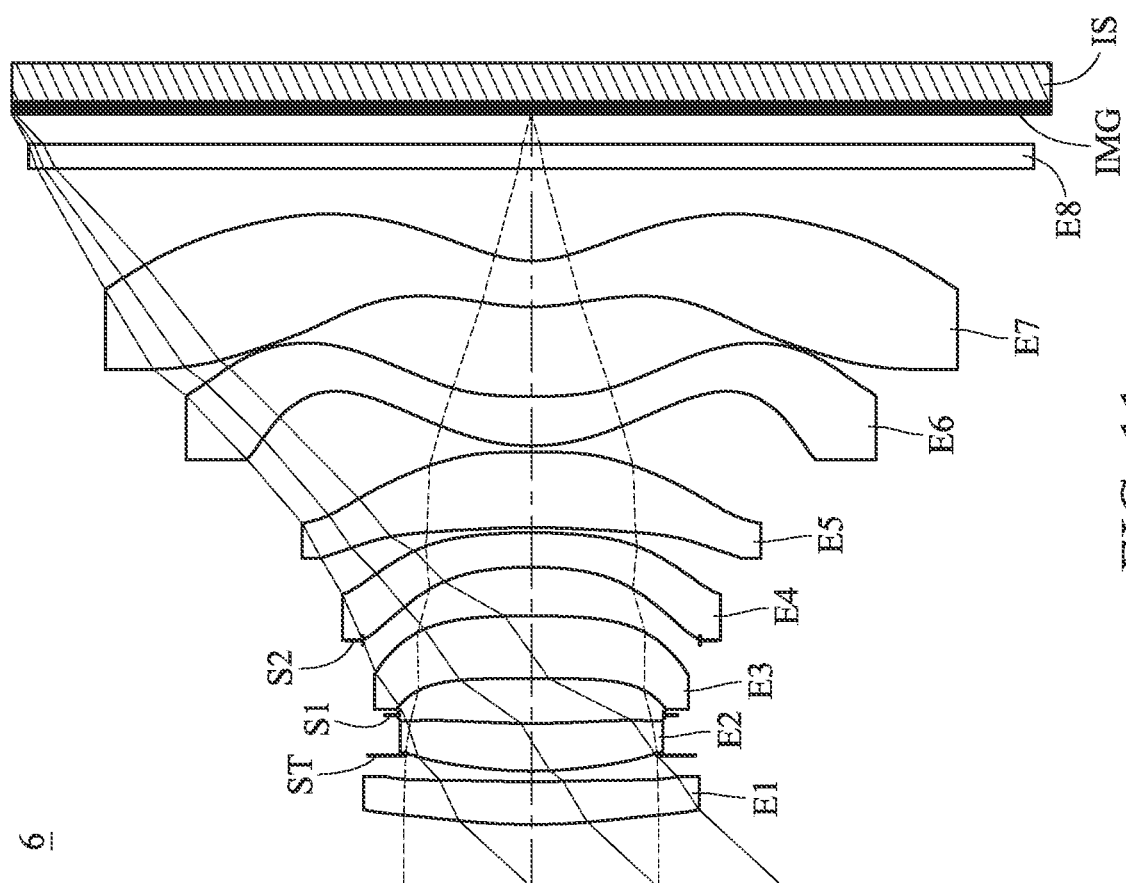
FIG. 11 is a schematic view of an image capturing unit according to the 6th embodiment of the present disclosure.
Figure 12:
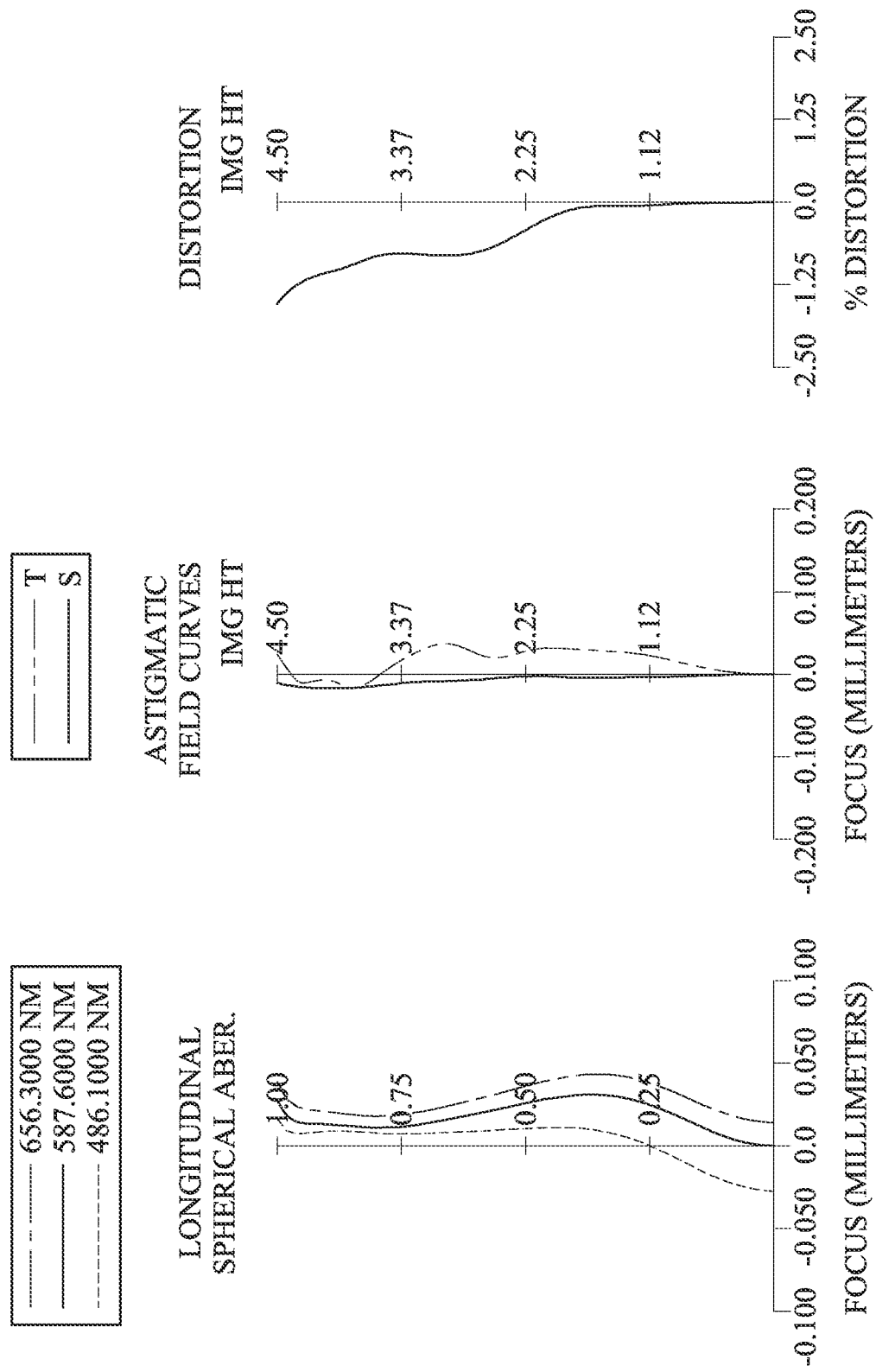
FIG. 12 shows spherical aberration curves, astigmatic field curves and a distortion curve of the image capturing unit according to the 6th embodiment.

FIG. 11 is a schematic view of an image capturing unit according to the 6th embodiment of the present disclosure. FIG. 12 shows, in order from left to right, spherical aberration curves, astigmatic field curves and a distortion curve of the image capturing unit according to the 6th embodiment. In FIG. 11, the image capturing unit 6 includes the optical photographing system (its reference numeral is omitted) of the present disclosure and an image sensor IS. The optical photographing system includes, in order from an object side to an image side along an optical axis, a first lens element E1, an aperture stop ST, a second lens element E2, a stop S1, a third lens element E3, a stop S2, a fourth lens element E4, a fifth lens element E5, a sixth lens element E6, a seventh lens element E7, a filter E8 and an image surface IMG. The optical photographing system includes seven lens elements (E1, E2, E3, E4, E5, E6 and E7) with no additional lens element disposed between each of the adjacent seven lens elements.

The first lens element E1 with positive refractive power has an object-side surface being convex in a paraxial region thereof and an image-side surface being concave in a paraxial region thereof. The first lens element E1 is made of plastic material and has the object-side surface and the image-side surface being both aspheric. The object-side surface of the first lens element E1 has two inflection points. The image-side surface of the first lens element E1 has two inflection points.

The second lens element E2 with positive refractive power has an object-side surface being convex in a paraxial region thereof and an image-side surface being concave in a paraxial region thereof. The second lens element E2 is made of plastic material and has the object-side surface and the image-side surface being both aspheric. The image-side surface of the second lens element E2 has two inflection points.

The third lens element E3 with positive refractive power has an object-side surface being concave in a paraxial region thereof and an image-side surface being convex in a paraxial region thereof. The third lens element E3 is made of plastic material and has the object-side surface and the image-side surface being both aspheric.

The fourth lens element E4 with negative refractive power has an object-side surface being concave in a paraxial region thereof and an image-side surface being convex in a paraxial region thereof. The fourth lens element E4 is made of plastic material and has the object-side surface and the image-side surface being both aspheric. The object-side surface of the fourth lens element E4 has one inflection point. The image-side surface of the fourth lens element E4 has one inflection point.

The fifth lens element E5 with negative refractive power has an object-side surface being concave in a paraxial region thereof and an image-side surface being convex in a paraxial region thereof. The fifth lens element E5 is made of plastic material and has the object-side surface and the image-side surface being both aspheric. The object-side surface of the fifth lens element E5 has two inflection points. The image-side surface of the fifth lens element E5 has one inflection point.

The sixth lens element E6 with positive refractive power has an object-side surface being convex in a paraxial region thereof and an image-side surface being concave in a paraxial region thereof. The sixth lens element E6 is made of plastic material and has the object-side surface and the image-side surface being both aspheric. The object-side surface of the sixth lens element E6 has two inflection points. The image-side surface of the sixth lens element E6 has two inflection points. The object-side surface of the sixth lens element E6 has at least one concave critical point in an off-axis region thereof. The image-side surface of the sixth lens element E6 has at least one convex critical point in an off-axis region thereof.

The seventh lens element E7 with negative refractive power has an object-side surface being convex in a paraxial region thereof and an image-side surface being concave in a paraxial region thereof. The seventh lens element E7 is made of plastic material and has the object-side surface and the image-side surface being both aspheric. The object-side surface of the seventh lens element E7 has two inflection points. The image-side surface of the seventh lens element E7 has one inflection point. The image-side surface of the seventh lens element E7 has at least one convex critical point in an off-axis region thereof.

The filter E8 is made of glass material and located between the seventh lens element E7 and the image surface IMG, and will not affect the focal length of the optical photographing system. The image sensor IS is disposed on or near the image surface IMG of the optical photographing system.

The detailed optical data of the 6th embodiment are shown in Table 11 and the aspheric surface data are shown in Table 12 below.

TABLE 11

6th Embodiment
f = 4.18 mm, Fno = 1.89, HFOV = 47.5 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | 5.3693 (ASP) | 0.372 | Plastic | 1.545 | 56.1 | 17.86 |
| 2 | | 11.6799 (ASP) | 0.225 | | | | |
| 3 | Ape. Stop | Plano | −0.134 | | | | |
| 4 | Lens 2 | 3.5334 (ASP) | 0.414 | Plastic | 1.545 | 56.1 | 11.81 |
| 5 | | 7.5139 (ASP) | 0.073 | | | | |
| 6 | Stop | Plano | 0.315 | | | | |
| 7 | Lens 3 | −261.0966 (ASP) | 0.545 | Plastic | 1.529 | 58.0 | 17.60 |
| 8 | | −8.9949 (ASP) | −0.214 | | | | |
| 9 | Stop | Plano | 0.636 | | | | |

TABLE 11-continued

6th Embodiment
f = 4.18 mm, Fno = 1.89, HFOV = 47.5 deg.

| Surface # | | Curvature Radius | | Thickness | Material | Index | Abbe # | Focal Length |
|---|---|---|---|---|---|---|---|---|
| 10 | Lens 4 | −3.1292 | (ASP) | 0.299 | Plastic | 1.705 | 14.0 | −12.85 |
| 11 | | −4.9698 | (ASP) | 0.045 | | | | |
| 12 | Lens 5 | −6.2305 | (ASP) | 0.655 | Plastic | 1.562 | 44.6 | −15.25 |
| 13 | | −23.6836 | (ASP) | 0.052 | | | | |
| 14 | Lens 6 | 1.5960 | (ASP) | 0.430 | Plastic | 1.566 | 37.4 | 3.33 |
| 15 | | 9.3620 | (ASP) | 0.776 | | | | |
| 16 | Lens 7 | 1.8652 | (ASP) | 0.400 | Plastic | 1.534 | 56.0 | −4.46 |
| 17 | | 0.9684 | (ASP) | 0.800 | | | | |
| 18 | Filter | Plano | | 0.210 | Glass | 1.517 | 64.2 | — |
| 19 | | Plano | | 0.262 | | | | |
| 20 | Image | Plano | | — | | | | |

Note:
Reference wavelength is 587.6 nm (d-line).
An effective radius of the stop S1 (Surface 6) is 1.150 mm.
An effective radius of the stop S2 (Surface 9) is 1.460 mm.

TABLE 12

Aspheric Coefficients

| Surface # | 1 | 2 | 4 | 5 |
|---|---|---|---|---|
| k = | 0.00000E+00 | 0.00000E+00 | 0.00000E+00 | 0.00000E+00 |
| A4 = | −2.39280173E−02 | −6.18084716E−02 | −5.57973370E−02 | −3.50900423E−02 |
| A6 = | 6.74412980E−03 | 6.38526050E−02 | 8.15277581E−02 | −3.46265854E−02 |
| A8 = | −1.71070040E−02 | −6.55316124E−02 | −1.13448019E−01 | 9.11412536E−02 |
| A10 = | 2.16578681E−02 | 6.23661420E−02 | 1.43989614E−01 | −1.61982868E−01 |
| A12 = | −1.44331204E−02 | −3.77118902E−02 | −1.13379032E−01 | 1.67430729E−01 |
| A14 = | 5.29511906E−03 | 1.29241555E−02 | 4.97763588E−02 | −9.17114819E−02 |
| A16 = | −7.85548899E−04 | −1.51757110E−03 | −8.10529384E−03 | 2.17712538E−02 |

| Surface # | 7 | 8 | 10 | 11 |
|---|---|---|---|---|
| k = | 0.00000E+00 | 1.50415E+01 | −2.63086E+00 | −9.37004E+00 |
| A4 = | −8.28637263E−02 | −5.49899464E−02 | −6.29848451E−02 | 1.43779108E−04 |
| A6 = | 2.49940014E−02 | −8.37185049E−02 | −2.49106366E−01 | −1.23621996E−01 |
| A8 = | −1.46280083E−01 | 1.29398405E−01 | 5.93390987E−01 | 1.09096388E−01 |
| A10 = | 2.19567778E−01 | −1.76348585E−01 | −9.50153959E−01 | −9.34447491E−02 |
| A12 = | −2.21678423E−01 | 1.35934798E−01 | 9.89157311E−01 | 8.04845429E−02 |
| A14 = | 1.23692549E−01 | −5.27980632E−02 | −6.23832797E−01 | −4.52277528E−02 |
| A16 = | −3.00628789E−02 | 7.95852262E−03 | 2.29573914E−01 | 1.45030483E−02 |
| A18 = | — | — | −4.51348803E−02 | −2.42864502E−03 |
| A20 = | — | — | 3.63999314E−03 | 1.66169201E−04 |

| Surface # | 12 | 13 | 14 | 15 |
|---|---|---|---|---|
| k = | 8.34677E+00 | 0.00000E+00 | −3.75339E+00 | 5.81802E+00 |
| A4 = | 4.80514149E−02 | −3.86105541E−01 | −3.19821494E−02 | 3.28375145E−01 |
| A6 = | 8.28661447E−02 | 4.95341415E−01 | 1.69856880E−01 | −3.15739665E−01 |
| A8 = | −2.63156959E−01 | −4.18913313E−01 | −2.84120819E−01 | 1.72510669E−01 |
| A10 = | 2.71998705E−01 | 1.81850843E−01 | 2.61065409E−01 | −6.79892219E−02 |
| A12 = | −6.06347857E−02 | 8.65640803E−02 | −1.61839460E−01 | 2.12456436E−02 |
| A14 = | −1.73397699E−01 | −2.16949886E−01 | 7.17595639E−02 | −5.53935640E−03 |
| A16 = | 2.40478066E−01 | 1.83269177E−01 | −2.30348019E−02 | 1.19058361E−03 |
| A18 = | −1.64576246E−01 | −9.30562047E−02 | 5.29754879E−03 | −1.99696195E−04 |
| A20 = | 7.02226883E−02 | 3.10629405E−02 | −8.51932472E−04 | 2.46343072E−05 |
| A22 = | −1.94126125E−02 | −6.87486032E−03 | 9.20611795E−05 | −2.11739811E−06 |
| A24 = | 3.38503169E−03 | 9.72179860E−04 | −6.24648328E−06 | 1.18914189E−07 |
| A26 = | −3.38581761E−04 | −7.95257797E−05 | 2.33439417E−07 | −3.90516954E−09 |
| A28 = | 1.48031206E−05 | 2.86145961E−06 | −3.46221123E−09 | 5.67589732E−11 |

| Surface # | 16 | 17 |
|---|---|---|
| k = | −2.41333E+00 | −2.91229E+00 |
| A4 = | −2.44398436E−01 | −1.74915961E−01 |
| A6 = | 1.13907009E−01 | 1.27037465E−01 |
| A8 = | −4.39972938E−03 | −6.64598113E−02 |
| A10 = | −3.58270419E−02 | 2.44343644E−02 |
| A12 = | 2.55484517E−02 | −6.46862854E−03 |
| A14 = | −9.41815989E−03 | 1.25837514E−03 |
| A16 = | 2.20938945E−03 | −1.81176728E−04 |
| A18 = | −3.53861417E−04 | 1.92494474E−05 |

TABLE 12-continued

| | Aspheric Coefficients | |
|---|---|---|
| A20 = | 3.97900478E−05 | −1.49261901E−06 |
| A22 = | −3.15311490E−06 | 8.27362129E−08 |
| A24 = | 1.72952728E−07 | −3.16320130E−09 |
| A26 = | −6.26309046E−09 | 7.83109344E−11 |
| A28 = | 1.34901567E−10 | −1.11035451E−12 |
| A30 = | −1.31030000E−12 | 6.64094567E−15 |

In the 6th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 6th embodiment, so an explanation in this regard will not be provided again.

Moreover, these parameters can be calculated from Table 11 and Table 12 as the following values and satisfy the following conditions:

| 6th Embodiment | | | |
|---|---|---|---|
| f [mm] | 4.18 | f/f45 | −0.61 |
| Fno | 1.89 | f/f67 | 0.81 |
| HFOV [deg.] | 47.5 | f3/f5 | −1.15 |
| V2 + V3 + V6 + V7 | 207.5 | f5/f6 | −4.58 |
| V4/N4 | 8.24 | f5/f7 | 3.42 |
| (CT3 + CT4)/T34 | 2.00 | f6/R11 + f6/R12 | 2.44 |
| (CT4 + CT5)/T45 | 21.20 | Y72/Y11 | 2.54 |
| CT1/|f1| + CT2/|f2| | 0.06 | Yc61/Y61 | 0.69 |
| CT5/T67 | 0.84 | Yc62/Y62 | 0.65 |
| TL/ImgH | 1.37 | Yc72/Y72 | 0.48 |
| |R1/f| | 1.29 | — | — |

7th Embodiment

Figure 13:
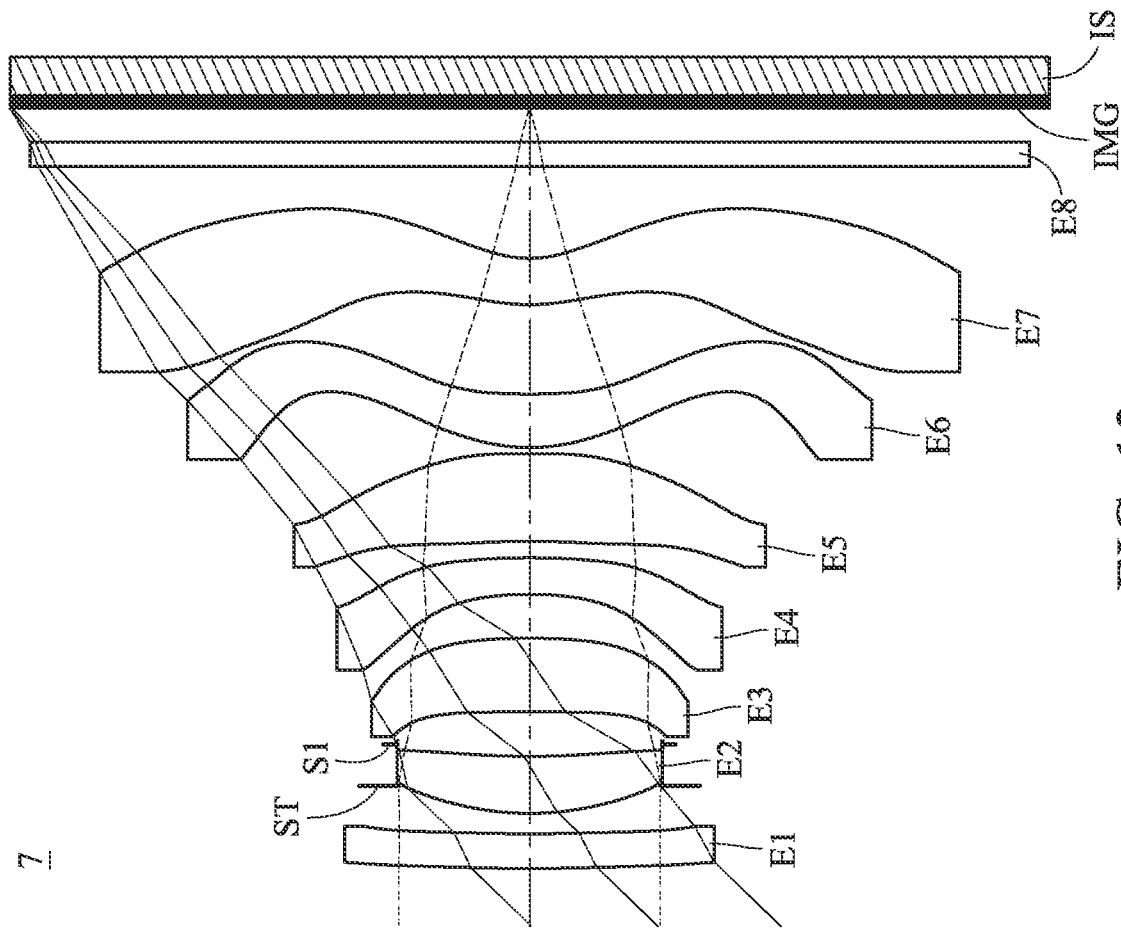
FIG. 13 is a schematic view of an image capturing unit according to the 7th embodiment of the present disclosure.
Figure 14:
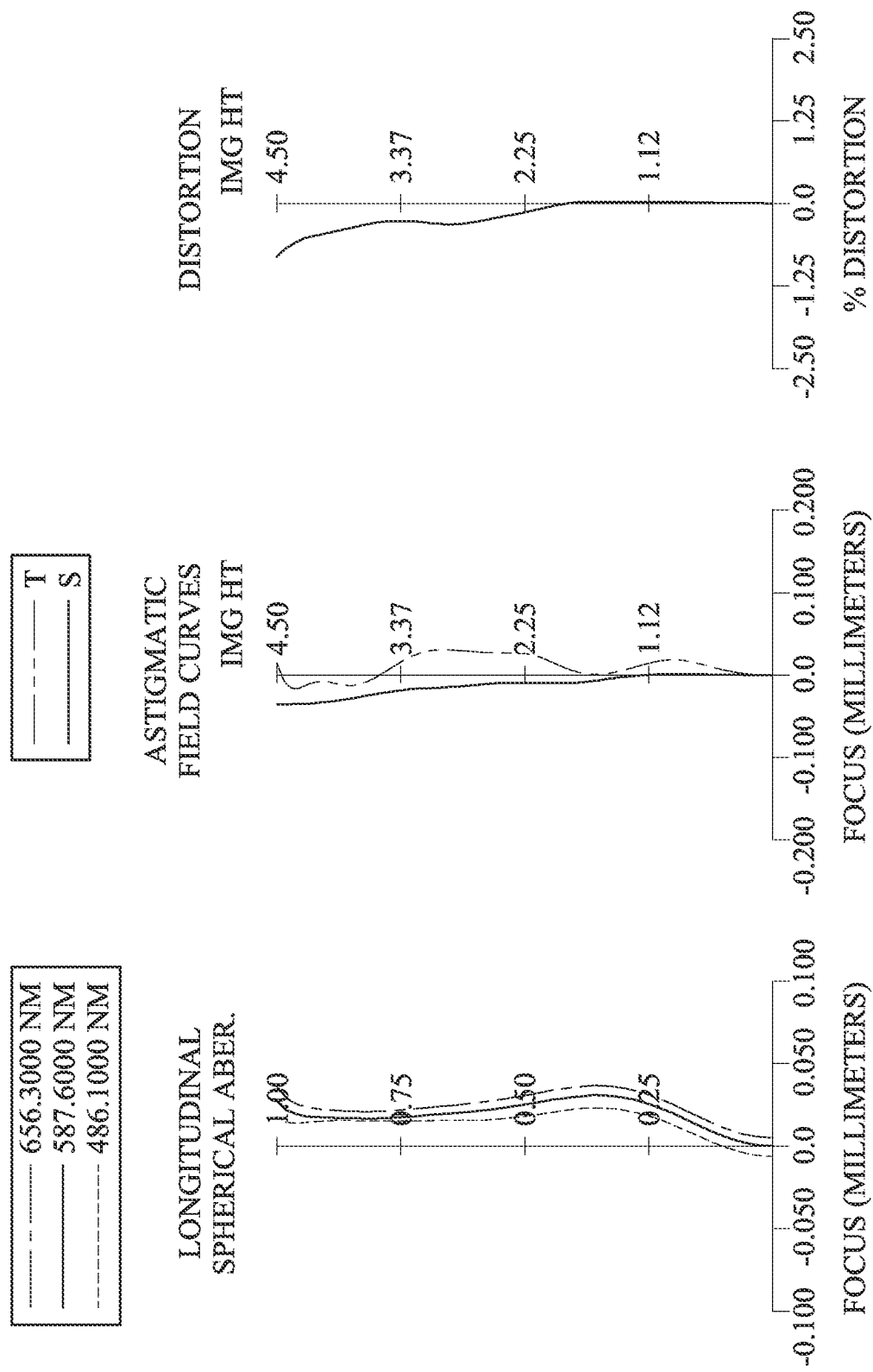
FIG. 14 shows spherical aberration curves, astigmatic field curves and a distortion curve of the image capturing unit according to the 7th embodiment.

FIG. 13 is a schematic view of an image capturing unit according to the 7th embodiment of the present disclosure. FIG. 14 shows, in order from left to right, spherical aberration curves, astigmatic field curves and a distortion curve of the image capturing unit according to the 7th embodiment. In FIG. 13, the image capturing unit 7 includes the optical photographing system (its reference numeral is omitted) of the present disclosure and an image sensor IS. The optical photographing system includes, in order from an object side to an image side along an optical axis, a first lens element E1, an aperture stop ST, a second lens element E2, a stop S1, a third lens element E3, a fourth lens element E4, a fifth lens element E5, a sixth lens element E6, a seventh lens element E7, a filter E8 and an image surface IMG. The optical photographing system includes seven lens elements (E1, E2, E3, E4, E5, E6 and E7) with no additional lens element disposed between each of the adjacent seven lens elements.

The first lens element E1 with negative refractive power has an object-side surface being convex in a paraxial region thereof and an image-side surface being concave in a paraxial region thereof. The first lens element E1 is made of plastic material and has the object-side surface and the image-side surface being both aspheric. The object-side surface of the first lens element E1 has one inflection point. The image-side surface of the first lens element E1 has two inflection points.

The second lens element E2 with positive refractive power has an object-side surface being convex in a paraxial region thereof and an image-side surface being concave in a paraxial region thereof. The second lens element E2 is made of plastic material and has the object-side surface and the image-side surface being both aspheric. The image-side surface of the second lens element E2 has two inflection points.

The third lens element E3 with positive refractive power has an object-side surface being planar in a paraxial region thereof and an image-side surface being convex in a paraxial region thereof. The third lens element E3 is made of plastic material and has the object-side surface and the image-side surface being both aspheric.

The fourth lens element E4 with negative refractive power has an object-side surface being concave in a paraxial region thereof and an image-side surface being convex in a paraxial region thereof. The fourth lens element E4 is made of plastic material and has the object-side surface and the image-side surface being both aspheric. The object-side surface of the fourth lens element E4 has one inflection point. The image-side surface of the fourth lens element E4 has one inflection point.

The fifth lens element E5 with negative refractive power has an object-side surface being concave in a paraxial region thereof and an image-side surface being convex in a paraxial region thereof. The fifth lens element E5 is made of plastic material and has the object-side surface and the image-side surface being both aspheric. The object-side surface of the fifth lens element E5 has four inflection points. The image-side surface of the fifth lens element E5 has one inflection point.

The sixth lens element E6 with positive refractive power has an object-side surface being convex in a paraxial region thereof and an image-side surface being concave in a paraxial region thereof. The sixth lens element E6 is made of plastic material and has the object-side surface and the image-side surface being both aspheric. The object-side surface of the sixth lens element E6 has two inflection points. The image-side surface of the sixth lens element E6 has two inflection points. The object-side surface of the sixth lens element E6 has at least one concave critical point in an off-axis region thereof. The image-side surface of the sixth lens element E6 has at least one convex critical point in an off-axis region thereof.

The seventh lens element E7 with negative refractive power has an object-side surface being convex in a paraxial region thereof and an image-side surface being concave in a paraxial region thereof. The seventh lens element E7 is made of plastic material and has the object-side surface and the image-side surface being both aspheric. The object-side surface of the seventh lens element E7 has four inflection points. The image-side surface of the seventh lens element E7 has one inflection point. The image-side surface of the seventh lens element E7 has at least one convex critical point in an off-axis region thereof.

The filter E8 is made of glass material and located between the seventh lens element E7 and the image surface IMG, and will not affect the focal length of the optical photographing system. The image sensor IS is disposed on or near the image surface IMG of the optical photographing system.

The detailed optical data of the 7th embodiment are shown in Table 13 and the aspheric surface data are shown in Table 14 below.

TABLE 13

7th Embodiment
f = 4.35 mm, Fno = 1.92, HFOV = 46.1 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | 15.1554 (ASP) | 0.300 | Plastic | 1.614 | 25.6 | −81.09 |
| 2 | | 11.5321 (ASP) | 0.416 | | | | |
| 3 | Ape. Stop | Plano | −0.239 | | | | |
| 4 | Lens 2 | 2.3996 (ASP) | 0.495 | Plastic | 1.545 | 56.1 | 6.67 |
| 5 | | 6.5393 (ASP) | 0.104 | | | | |
| 6 | Stop | Plano | 0.281 | | | | |
| 7 | Lens 3 | ∞ (ASP) | 0.639 | Plastic | 1.545 | 56.1 | 11.38 |
| 8 | | −6.2036 (ASP) | 0.381 | | | | |
| 9 | Lens 4 | −3.0195 (ASP) | 0.317 | Plastic | 1.686 | 18.4 | −8.29 |
| 10 | | −6.7073 (ASP) | 0.142 | | | | |
| 11 | Lens 5 | −6.9703 (ASP) | 0.761 | Plastic | 1.566 | 37.4 | −17.10 |
| 12 | | −25.8944 (ASP) | 0.052 | | | | |
| 13 | Lens 6 | 1.5649 (ASP) | 0.465 | Plastic | 1.534 | 56.0 | 3.46 |
| 14 | | 9.2038 (ASP) | 0.775 | | | | |
| 15 | Lens 7 | 1.7281 (ASP) | 0.400 | Plastic | 1.534 | 56.0 | −4.69 |
| 16 | | 0.9400 (ASP) | 0.800 | | | | |
| 17 | Filter | Plano | 0.210 | Glass | 1.517 | 64.2 | — |
| 18 | | Plano | 0.293 | | | | |
| 19 | Image | Plano | — | | | | |

Note:
Reference wavelength is 587.6 nm (d-line).
An effective radius of the stop S1 (Surface 6) is 1.150 mm.

TABLE 14

Aspheric Coefficients

| Surface # | 1 | 2 | 4 | 5 |
|---|---|---|---|---|
| k = | 0.00000E+00 | 0.00000E+00 | 0.00000E+00 | 0.00000E+00 |
| A4 = | −2.22776752E−02 | −5.83546480E−02 | −5.97336536E−02 | −2.37376912E−02 |
| A6 = | 2.06592063E−02 | 7.27375456E−02 | 8.98603802E−02 | −4.86536915E−02 |
| A8 = | −1.86402056E−02 | −6.97161930E−02 | −1.34873744E−01 | 1.30021807E−01 |
| A10 = | 1.38411709E−02 | 5.50079991E−02 | 1.63874826E−01 | −1.92283994E−01 |
| A12 = | −6.38587171E−03 | −2.85719381E−02 | −1.21049276E−01 | 1.69042086E−01 |
| A14 = | 1.60522690E−03 | 8.44748782E−03 | 4.90423543E−02 | −7.93811590E−02 |
| A16 = | −1.68569912E−04 | −1.05704997E−03 | −7.87698505E−03 | 1.58592911E−02 |

| Surface # | 7 | 8 | 9 | 10 |
|---|---|---|---|---|
| k = | 0.00000E+00 | 3.77128E+00 | −1.85969E+00 | −4.29001E+01 |
| A4 = | −5.51749294E−02 | −6.54243405E−02 | −1.03329636E−01 | −4.44013378E−02 |
| A6 = | −3.98009458E−02 | −4.13766646E−02 | −1.69427507E−03 | 1.15553754E−01 |
| A8 = | 6.18477181E−02 | 2.17434398E−02 | −1.45918303E−01 | −3.57904618E−01 |
| A10 = | −1.17836422E−01 | −1.39324761E−02 | 1.43642870E−01 | 4.12227122E−01 |
| A12 = | 1.16060661E−01 | 1.56935717E−02 | 1.36125483E−01 | −2.46058326E−01 |
| A14 = | −6.08930088E−02 | −1.09994938E−02 | −2.89406634E−01 | 8.17655445E−02 |
| A16 = | 1.11997599E−02 | 2.49699562E−03 | 1.86018227E−01 | −1.42812732E−02 |
| A18 = | — | — | −5.38059614E−02 | 1.01563319E−03 |
| A20 = | — | — | 5.96139175E−03 | 1.17329017E−06 |

| Surface # | 11 | 12 | 13 | 14 |
|---|---|---|---|---|
| k = | 8.97406E+00 | 0.00000E+00 | −3.83684E+00 | 5.60912E+00 |
| A4 = | 3.90044069E−02 | −3.32318923E−01 | −3.83607190E−02 | 2.83231601E−01 |
| A6 = | 9.27128090E−02 | 3.62290631E−02 | 1.63051770E−01 | −2.25650920E−01 |
| A8 = | −4.64178802E−02 | −1.83024803E−01 | −2.24791951E−01 | 9.10058845E−02 |
| A10 = | −3.69708657E−01 | −1.02575631E−01 | 1.66158212E−01 | −2.60556465E−02 |
| A12 = | 8.48684396E−01 | 3.10457571E−01 | −8.20319461E−02 | 7.41823890E−03 |
| A14 = | −9.75350700E−01 | −3.26390376E−01 | 2.90184859E−02 | −2.35460735E−03 |
| A16 = | 7.18727487E−01 | 2.09852841E−01 | −7.39607312E−03 | 6.38735545E−04 |

TABLE 14-continued

| Aspheric Coefficients | | | | |
|---|---|---|---|---|
| A18 = | −3.62482993E−01 | −9.01922058E−02 | 1.30650641E−03 | −1.23339964E−04 |
| A20 = | 1.26751185E−01 | 2.64025267E−02 | −1.46341695E−04 | 1.60513453E−05 |
| A22 = | −3.02191881E−02 | −5.19686562E−03 | 8.05485051E−06 | −1.36889666E−06 |
| A24 = | 4.68160834E−03 | 6.57661933E−04 | 1.18936782E−07 | 7.29673395E−08 |
| A26 = | −4.24236981E−04 | −4.83018831E−05 | −4.06222074E−08 | −2.19031260E−09 |
| A28 = | 1.70389254E−05 | 1.56384306E−06 | 1.56263864E−09 | 2.79814338E−11 |

| Surface # | 15 | 16 |
|---|---|---|
| k = | −2.85925E+00 | −2.82810E+00 |
| A4 = | −2.42945186E−01 | −1.79322900E−01 |
| A6 = | 1.31452765E−01 | 1.34206243E−01 |
| A8 = | −2.49744720E−02 | −7.09531208E−02 |
| A10 = | −2.12946376E−02 | 2.58055948E−02 |
| A12 = | 1.83027817E−02 | −6.61721524E−03 |
| A14 = | −6.90908276E−03 | 1.22811597E−03 |
| A16 = | 1.61113357E−03 | −1.67642764E−04 |
| A18 = | −2.55166403E−04 | 1.69311032E−05 |
| A20 = | 2.84871447E−05 | −1.26052820E−06 |
| A22 = | −2.26101950E−06 | 6.81843230E−08 |
| A24 = | 1.25630275E−07 | −2.60146793E−09 |
| A26 = | −4.66608513E−09 | 6.62468589E−11 |
| A28 = | 1.04372423E−10 | −1.00868512E−12 |
| A30 = | −1.06516740E−12 | 6.93265957E−15 |

In the 7th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 7th embodiment, so an explanation in this regard will not be provided again.

Moreover, these parameters can be calculated from Table 13 and Table 14 as the following values and satisfy the following conditions:

| 7th Embodiment | | | |
|---|---|---|---|
| f [mm] | 4.35 | f/f45 | −0.79 |
| Fno | 1.92 | f/f67 | 0.82 |
| HFOV [deg.] | 46.1 | f3/f5 | −0.67 |
| V2 + V3 + V6 + V7 | 224.1 | f5/f6 | −4.95 |
| V4/N4 | 10.90 | f5/f7 | 3.65 |
| (CT3 + CT4)/T34 | 2.51 | f6/R11 + f6/R12 | 2.58 |
| (CT4 + CT5)/T45 | 7.59 | Y72/Y11 | 2.32 |
| CT1/|f1| + CT2/|f2| | 0.08 | Yc61/Y61 | 0.69 |
| CT5/T67 | 0.98 | Yc62/Y62 | 0.66 |
| TL/ImgH | 1.47 | Yc72/Y72 | 0.49 |
| |R1/f| | 3.49 | | |

8th Embodiment

Figure 15:
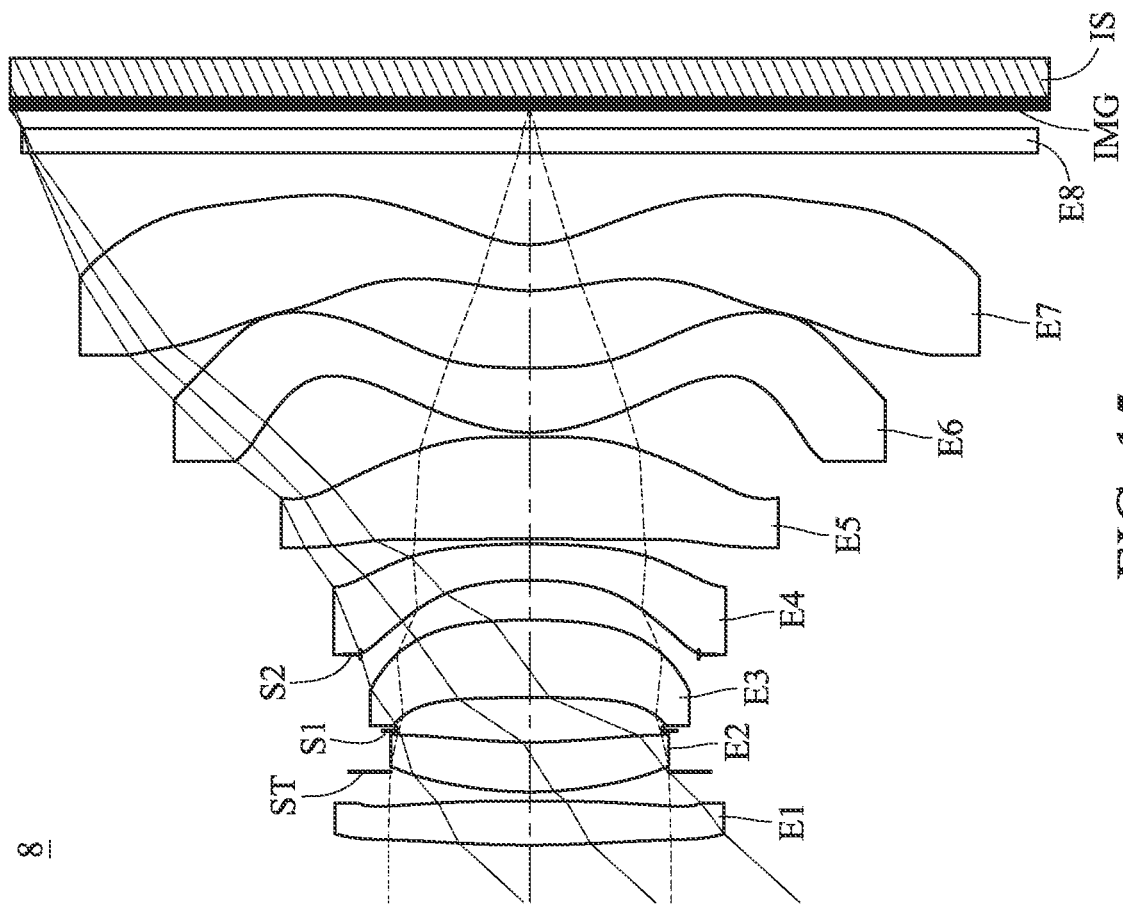
FIG. 15 is a schematic view of an image capturing unit according to the 8th embodiment of the present disclosure.
Figure 16:
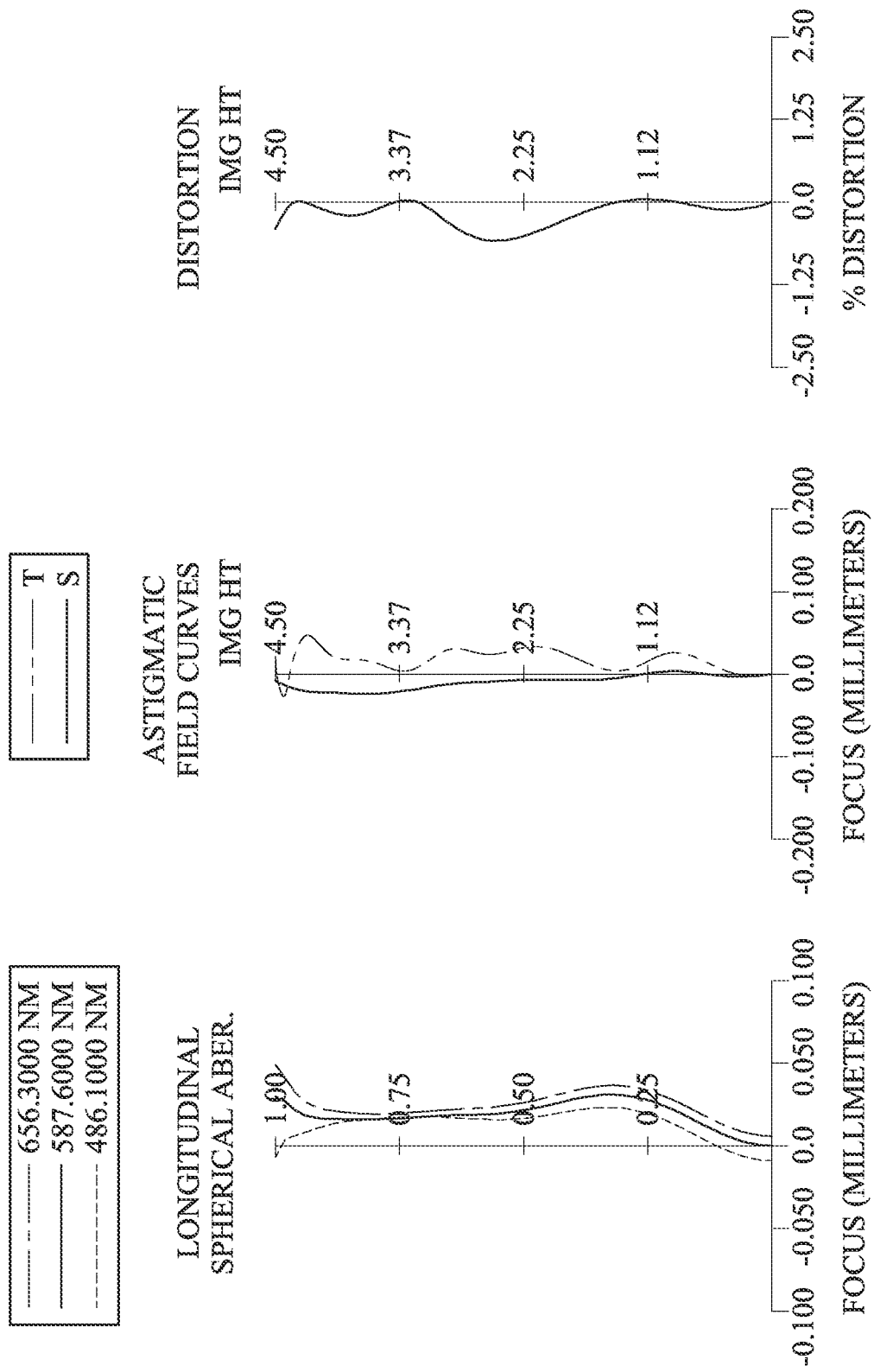
FIG. 16 shows spherical aberration curves, astigmatic field curves and a distortion curve of the image capturing unit according to the 8th embodiment.

FIG. 15 is a schematic view of an image capturing unit according to the 8th embodiment of the present disclosure. FIG. 16 shows, in order from left to right, spherical aberration curves, astigmatic field curves and a distortion curve of the image capturing unit according to the 8th embodiment. In FIG. 15, the image capturing unit 8 includes the optical photographing system (its reference numeral is omitted) of the present disclosure and an image sensor IS. The optical photographing system includes, in order from an object side to an image side along an optical axis, a first lens element E1, an aperture stop ST, a second lens element E2, a stop S1, a third lens element E3, a stop S2, a fourth lens element E4, a fifth lens element E5, a sixth lens element E6, a seventh lens element E7, a filter E8 and an image surface IMG. The optical photographing system includes seven lens elements (E1, E2, E3, E4, E5, E6 and E7) with no additional lens element disposed between each of the adjacent seven lens elements.

The first lens element E1 with positive refractive power has an object-side surface being convex in a paraxial region thereof and an image-side surface being convex in a paraxial region thereof. The first lens element E1 is made of plastic material and has the object-side surface and the image-side surface being both aspheric. The object-side surface of the first lens element E1 has two inflection points. The image-side surface of the first lens element E1 has one inflection point.

The second lens element E2 with positive refractive power has an object-side surface being convex in a paraxial region thereof and an image-side surface being concave in a paraxial region thereof. The second lens element E2 is made of plastic material and has the object-side surface and the image-side surface being both aspheric. The image-side surface of the second lens element E2 has two inflection points.

The third lens element E3 with positive refractive power has an object-side surface being concave in a paraxial region thereof and an image-side surface being convex in a paraxial region thereof. The third lens element E3 is made of plastic material and has the object-side surface and the image-side surface being both aspheric.

The fourth lens element E4 with negative refractive power has an object-side surface being concave in a paraxial region thereof and an image-side surface being convex in a paraxial region thereof. The fourth lens element E4 is made of plastic material and has the object-side surface and the image-side surface being both aspheric. The object-side surface of the fourth lens element E4 has one inflection point. The image-side surface of the fourth lens element E4 has one inflection point.

The fifth lens element E5 with negative refractive power has an object-side surface being concave in a paraxial region thereof and an image-side surface being concave in a paraxial region thereof. The fifth lens element E5 is made of plastic material and has the object-side surface and the image-side surface being both aspheric. The object-side surface of the fifth lens element E5 has four inflection points. The image-side surface of the fifth lens element E5 has two inflection points.

The sixth lens element E6 with positive refractive power has an object-side surface being convex in a paraxial region thereof and an image-side surface being concave in a paraxial region thereof. The sixth lens element E6 is made of plastic material and has the object-side surface and the image-side surface being both aspheric. The object-side surface of the sixth lens element E6 has two inflection points. The image-side surface of the sixth lens element E6 has four inflection points. The object-side surface of the sixth lens element E6 has at least one concave critical point in an off-axis region thereof. The image-side surface of the sixth lens element E6 has at least one convex critical point in an off-axis region thereof.

The seventh lens element E7 with negative refractive power has an object-side surface being convex in a paraxial region thereof and an image-side surface being concave in a paraxial region thereof. The seventh lens element E7 is made of plastic material and has the object-side surface and the image-side surface being both aspheric. The object-side surface of the seventh lens element E7 has six inflection points. The image-side surface of the seventh lens element E7 has three inflection points. The image-side surface of the seventh lens element E7 has at least one convex critical point in an off-axis region thereof.

The filter E8 is made of glass material and located between the seventh lens element E7 and the image surface IMG, and will not affect the focal length of the optical photographing system. The image sensor IS is disposed on or near the image surface IMG of the optical photographing system.

The detailed optical data of the 8th embodiment are shown in Table 15 and the aspheric surface data are shown in Table 16 below.

TABLE 15

8th Embodiment
f = 4.12 mm, Fno = 1.68, HFOV = 47.6 deg.

| Surface # |           | Curvature Radius | Thickness | Material | Index | Abbe # | Focal Length |
|-----------|-----------|------------------|-----------|----------|-------|--------|--------------|
| 0         | Object    | Plano            | Infinity  |          |       |        |              |
| 1         | Lens 1    | 9.5025 (ASP)     | 0.384     | Plastic  | 1.545 | 56.1   | 13.87        |
| 2         |           | −36.4031 (ASP)   | 0.254     |          |       |        |              |
| 3         | Ape. Stop | Plano            | −0.176    |          |       |        |              |
| 4         | Lens 2    | 3.1696 (ASP)     | 0.433     | Plastic  | 1.545 | 56.1   | 14.63        |
| 5         |           | 5.0085 (ASP)     | 0.099     |          |       |        |              |
| 6         | Stop      | Plano            | 0.288     |          |       |        |              |
| 7         | Lens 3    | −37.5465 (ASP)   | 0.675     | Plastic  | 1.544 | 56.0   | 11.85        |
| 8         |           | −5.5384 (ASP)    | −0.300    |          |       |        |              |
| 9         | Stop      | Plano            | 0.647     |          |       |        |              |
| 10        | Lens 4    | −3.1703 (ASP)    | 0.314     | Plastic  | 1.686 | 18.4   | −7.96        |
| 11        |           | −7.8615 (ASP)    | 0.048     |          |       |        |              |
| 12        | Lens 5    | −10.5878 (ASP)   | 0.885     | Plastic  | 1.566 | 37.4   | −18.06       |
| 13        |           | 305.8104 (ASP)   | 0.037     |          |       |        |              |
| 14        | Lens 6    | 1.5017 (ASP)     | 0.560     | Plastic  | 1.544 | 56.0   | 3.28         |
| 15        |           | 8.2869 (ASP)     | 0.672     |          |       |        |              |
| 16        | Lens 7    | 1.6366 (ASP)     | 0.400     | Plastic  | 1.534 | 56.0   | −4.61        |
| 17        |           | 0.8996 (ASP)     | 0.800     |          |       |        |              |
| 18        | Filter    | Plano            | 0.210     | Glass    | 1.517 | 64.2   | —            |
| 19        |           | Plano            | 0.165     |          |       |        |              |
| 20        | Image     | Plano            | —         |          |       |        |              |

Note:
Reference wavelength is 587.6 nm (d-line).
An effective radius of the stop S1 (Surface 6) is 1.160 mm.
An effective radius of the stop S2 (Surface 9) is 1.470 mm.

TABLE 16

Aspheric Coefficients

| Surface # | 1 | 2 | 4 | 5 |
|---|---|---|---|---|
| k =  | 0.00000E+00 | 0.00000E+00 | 0.00000E+00 | 0.00000E+00 |
| A4 = | −1.60884263E−02 | −4.15534573E−02 | −5.29339459E−02 | −3.70158995E−02 |
| A6 = | 4.04884341E−03 | 4.89756676E−02 | 8.12488462E−02 | −3.62475838E−02 |
| A8 = | −8.76930478E−03 | −3.84368400E−02 | −9.77867054E−02 | 9.45131806E−02 |
| A10 = | 8.82537461E−03 | 1.63065628E−02 | 8.48142424E−02 | −1.47677206E−01 |
| A12 = | −4.41738375E−03 | −4.30692600E−04 | −4.22560707E−02 | 1.35804337E−01 |
| A14 = | 1.20037704E−03 | −1.93508551E−03 | 1.03847277E−02 | −6.67042869E−02 |
| A16 = | −1.28891959E−04 | 5.06042209E−04 | −3.64023331E−04 | 1.40453957E−02 |

| Surface # | 7 | 8 | 10 | 11 |
|---|---|---|---|---|
| k =  | 0.00000E+00 | 4.70314E+00 | −2.37266E+00 | −8.47420E+01 |
| A4 = | −5.89787636E−02 | −7.68199208E−02 | −1.55776765E−01 | −1.01969778E−01 |
| A6 = | −1.08487342E−02 | 1.12479399E−02 | 1.63168479E−01 | 2.90010741E−01 |
| A8 = | −4.61916322E−02 | −1.00252277E−01 | −4.06436973E−01 | −6.23308694E−01 |
| A10 = | 8.99800916E−02 | 1.43145510E−01 | 4.97076330E−01 | 6.91410713E−01 |
| A12 = | −1.12195096E−01 | −1.00267530E−01 | −2.77582489E−01 | −4.50849553E−01 |

TABLE 16-continued

| Aspheric Coefficients | | | | |
|---|---|---|---|---|
| A14 = | 7.07441639E−02 | 3.56691030E−02 | 4.47682369E−02 | 1.80810362E−01 |
| A16 = | −1.95640889E−02 | −5.42117532E−03 | 2.46170929E−02 | −4.37575178E−02 |
| A18 = | — | — | −1.23682189E−02 | 5.85447796E−03 |
| A20 = | — | — | 1.62648834E−03 | −3.31941593E−04 |

| Surface # | 12 | 13 | 14 | 15 |
|---|---|---|---|---|
| k = | 8.57237E+00 | 0.00000E+00 | −3.86780E+00 | 4.81112E+00 |
| A4 = | 3.53237643E−02 | −2.99975531E−01 | −6.29104233E−02 | 1.93560244E−01 |
| A6 = | 1.71133640E−01 | 3.09695699E−01 | 1.94629909E−01 | −5.89814309E−02 |
| A8 = | −4.31626302E−01 | −2.23277868E−01 | −2.42881310E−01 | −6.44271107E−02 |
| A10 = | 4.92231899E−01 | 9.53321858E−02 | 1.74238645E−01 | 6.53989975E−02 |
| A12 = | −3.43112904E−01 | 1.46881928E−02 | −8.74175219E−02 | −2.84474648E−02 |
| A14 = | 1.55274843E−01 | −5.76106256E−02 | 3.31240967E−02 | 7.14169238E−03 |
| A16 = | −4.43004855E−02 | 4.52363000E−02 | −9.60762269E−03 | −1.04590720E−03 |
| A18 = | 6.17752752E−03 | −2.05000633E−02 | 2.07082691E−03 | 6.97596351E−05 |
| A20 = | 6.34525272E−04 | 6.02265505E−03 | −3.16084481E−04 | 3.25575662E−06 |
| A22 = | −5.02096610E−04 | −1.16368060E−03 | 3.21640822E−05 | −1.09291141E−06 |
| A24 = | 1.07424334E−04 | 1.42814544E−04 | −1.99362532E−06 | 9.60185420E−08 |
| A26 = | −1.11351515E−05 | −1.00912867E−05 | 6.30421923E−08 | −4.00006882E−09 |
| A28 = | 4.68893063E−07 | 3.12435470E−07 | −6.05722835E−10 | 6.72013221E−11 |

| Surface # | 16 | 17 |
|---|---|---|
| k = | −2.59697E+00 | −3.04106E+00 |
| A4 = | −3.15601177E−01 | −1.89749560E−01 |
| A6 = | 2.37264727E−01 | 1.66491444E−01 |
| A8 = | −1.10202265E−01 | −1.02811282E−01 |
| A10 = | 2.26289159E−02 | 4.33279911E−02 |
| A12 = | 2.91899887E−03 | −1.28242066E−02 |
| A14 = | −3.02154568E−03 | 2.73453314E−03 |
| A16 = | 8.69289838E−04 | −4.25983392E−04 |
| A18 = | −1.46000934E−04 | 4.87200982E−05 |
| A20 = | 1.61552985E−05 | −4.07719913E−06 |
| A22 = | −1.21775233E−06 | 2.46310230E−07 |
| A24 = | 6.22110930E−08 | −1.04414194E−08 |
| A26 = | −2.06816411E−09 | 2.94293554E−10 |
| A28 = | 4.04665502E−11 | −4.94699072E−12 |
| A30 = | −3.54200917E−13 | 3.74887220E−14 |

In the 8th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 8th embodiment, so an explanation in this regard will not be provided again.

Moreover, these parameters can be calculated from Table 15 and Table 16 as the following values and satisfy the following conditions:

| 8th Embodiment | | | |
|---|---|---|---|
| f [mm] | 4.12 | f/f45 | −0.76 |
| Fno | 1.68 | f/f67 | 0.86 |
| HFOV [deg.] | 47.6 | f3/f5 | −0.66 |
| V2 + V3 + V6 + V7 | 224.0 | f5/f6 | −5.51 |
| V4/N4 | 10.90 | f5/f7 | 3.92 |
| (CT3 + CT4)/T34 | 2.85 | f6/R11 + f6/R12 | 2.58 |
| (CT4 + CT5)/T45 | 24.98 | Y72/Y11 | 2.31 |
| CT1/|f1| + CT2/|f2| | 0.06 | Yc61/Y61 | 0.67 |
| CT5/T67 | 1.32 | Yc62/Y62 | 0.65 |
| TL/ImgH | 1.42 | Yc72/Y72 | 0.46 |
| |R1/f| | 2.31 | — | — |

9th Embodiment

Figure 17:
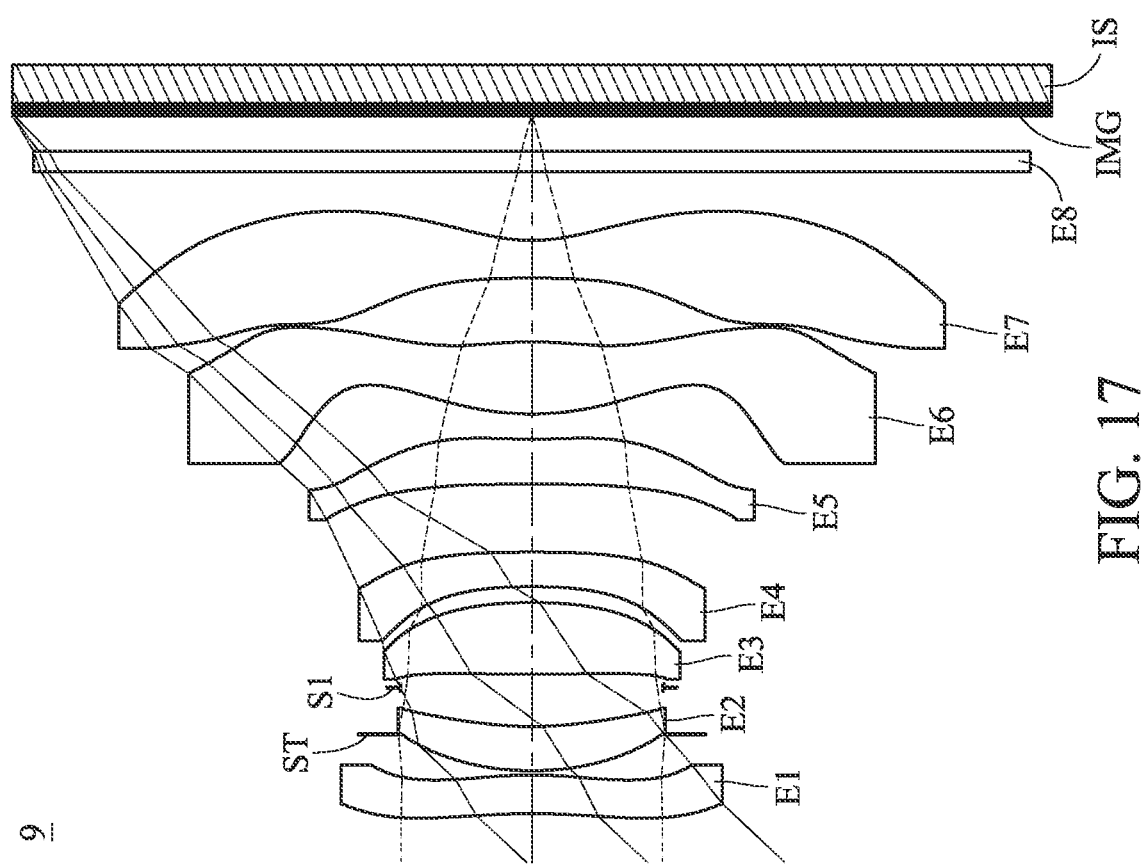
FIG. 17 is a schematic view of an image capturing unit according to the 9th embodiment of the present disclosure.
Figure 18:
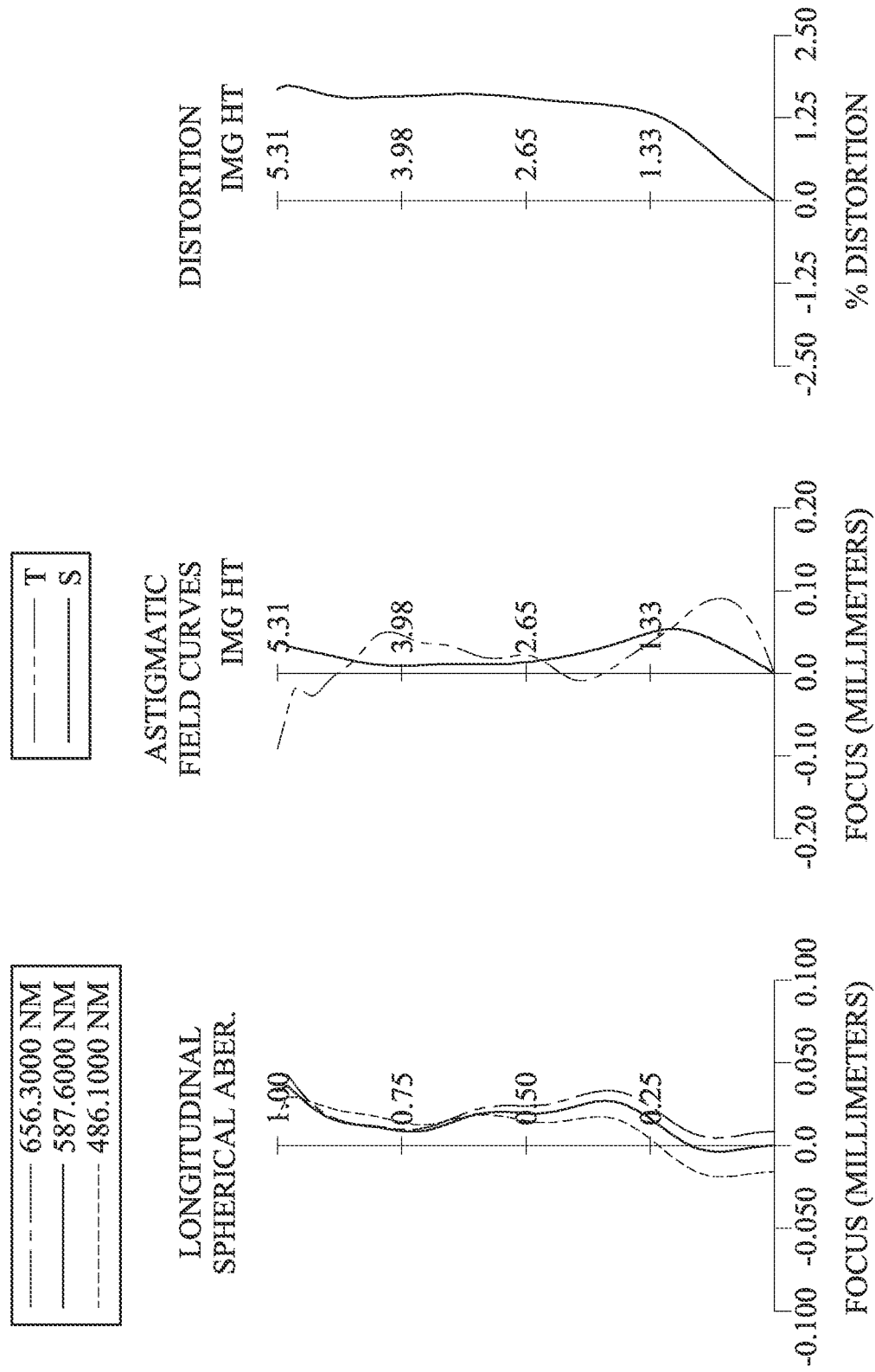
FIG. 18 shows spherical aberration curves, astigmatic field curves and a distortion curve of the image capturing unit according to the 9th embodiment.

FIG. 17 is a schematic view of an image capturing unit according to the 9th embodiment of the present disclosure. FIG. 18 shows, in order from left to right, spherical aberration curves, astigmatic field curves and a distortion curve of the image capturing unit according to the 9th embodiment. In FIG. 17, the image capturing unit 9 includes the optical photographing system (its reference numeral is omitted) of the present disclosure and an image sensor IS. The optical photographing system includes, in order from an object side to an image side along an optical axis, a first lens element E1, an aperture stop ST, a second lens element E2, a stop S1, a third lens element E3, a fourth lens element E4, a fifth lens element E5, a sixth lens element E6, a seventh lens element E7, a filter E8 and an image surface IMG. The optical photographing system includes seven lens elements (E1, E2, E3, E4, E5, E6 and E7) with no additional lens element disposed between each of the adjacent seven lens elements.

The first lens element E1 with positive refractive power has an object-side surface being concave in a paraxial region thereof and an image-side surface being convex in a paraxial region thereof. The first lens element E1 is made of plastic material and has the object-side surface and the image-side surface being both aspheric. The object-side surface of the first lens element E1 has one inflection point. The image-side surface of the first lens element E1 has one inflection point.

The second lens element E2 with positive refractive power has an object-side surface being convex in a paraxial region thereof and an image-side surface being concave in a paraxial region thereof. The second lens element E2 is made of plastic material and has the object-side surface and the image-side surface being both aspheric.

The third lens element E3 with positive refractive power has an object-side surface being convex in a paraxial region thereof and an image-side surface being convex in a paraxial region thereof. The third lens element E3 is made of plastic material and has the object-side surface and the image-side surface being both aspheric. The object-side surface of the third lens element E3 has one inflection point.

The fourth lens element E4 with negative refractive power has an object-side surface being concave in a paraxial region thereof and an image-side surface being convex in a paraxial region thereof. The fourth lens element E4 is made of plastic material and has the object-side surface and the image-side surface being both aspheric. The object-side surface of the fourth lens element E4 has one inflection point. The image-side surface of the fourth lens element E4 has one inflection point.

The fifth lens element E5 with negative refractive power has an object-side surface being convex in a paraxial region thereof and an image-side surface being concave in a paraxial region thereof. The fifth lens element E5 is made of plastic material and has the object-side surface and the image-side surface being both aspheric. The object-side surface of the fifth lens element E5 has one inflection point. The image-side surface of the fifth lens element E5 has two inflection points.

The sixth lens element E6 with positive refractive power has an object-side surface being convex in a paraxial region thereof and an image-side surface being convex in a paraxial region thereof. The sixth lens element E6 is made of plastic material and has the object-side surface and the image-side surface being both aspheric. The object-side surface of the sixth lens element E6 has two inflection points. The image-side surface of the sixth lens element E6 has four inflection points. The object-side surface of the sixth lens element E6 has at least one concave critical point in an off-axis region thereof. The image-side surface of the sixth lens element E6 has at least one convex critical point in an off-axis region thereof.

The seventh lens element E7 with negative refractive power has an object-side surface being concave in a paraxial region thereof and an image-side surface being concave in a paraxial region thereof. The seventh lens element E7 is made of plastic material and has the object-side surface and the image-side surface being both aspheric. The object-side surface of the seventh lens element E7 has three inflection points. The image-side surface of the seventh lens element E7 has two inflection points. The image-side surface of the seventh lens element E7 has at least one convex critical point in an off-axis region thereof.

The filter E8 is made of glass material and located between the seventh lens element E7 and the image surface IMG, and will not affect the focal length of the optical photographing system. The image sensor IS is disposed on or near the image surface IMG of the optical photographing system.

The detailed optical data of the 9th embodiment are shown in Table 17 and the aspheric surface data are shown in Table 18 below.

TABLE 17

9th Embodiment f = 4.89 mm, Fno = 1.83, HFOV = 46.8 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | −6.9430 (ASP) | 0.396 | Plastic | 1.545 | 56.1 | 12.87 |
| 2 | | −3.5592 (ASP) | 0.413 | | | | |
| 3 | Ape. Stop | Plano | −0.369 | | | | |
| 4 | Lens 2 | 3.4818 (ASP) | 0.451 | Plastic | 1.544 | 56.0 | 72.88 |
| 5 | | 3.6428 (ASP) | 0.400 | | | | |
| 6 | Stop | Plano | 0.135 | | | | |
| 7 | Lens 3 | 21.5487 (ASP) | 0.733 | Plastic | 1.544 | 56.0 | 7.26 |
| 8 | | −4.7752 (ASP) | 0.163 | | | | |
| 9 | Lens 4 | −5.7356 (ASP) | 0.353 | Plastic | 1.686 | 18.4 | −12.81 |
| 10 | | −16.9146 (ASP) | 0.694 | | | | |
| 11 | Lens 5 | 94.4228 (ASP) | 0.462 | Plastic | 1.566 | 37.4 | −14.02 |
| 12 | | 7.3081 (ASP) | 0.257 | | | | |
| 13 | Lens 6 | 2.9021 (ASP) | 0.738 | Plastic | 1.544 | 56.0 | 3.10 |
| 14 | | −3.6718 (ASP) | 0.653 | | | | |
| 15 | Lens 7 | −10.3606 (ASP) | 0.385 | Plastic | 1.534 | 56.0 | −2.87 |
| 16 | | 1.8204 (ASP) | 0.700 | | | | |
| 17 | Filter | Plano | 0.210 | Glass | 1.517 | 64.2 | — |
| 18 | | Plano | 0.365 | | | | |
| 19 | Image | Plano | — | | | | |

Note:

Reference wavelength is 587.6 nm (d-line).

An effective radius of the stop S1 (Surface 6) is 1.345 mm.

TABLE 18

| Aspheric Coefficients | | | | |
|---|---|---|---|---|
| Surface # | 1 | 2 | 4 | 5 |
| k = | 0.00000E+00 | 0.00000E+00 | 0.00000E+00 | 0.00000E+00 |
| A4 = | 2.84111344E−02 | 2.51111445E−01 | 2.18606314E−01 | −5.09014115E−02 |
| A6 = | −3.74349647E−03 | −6.40182240E−01 | −8.28406632E−01 | 4.81485124E−02 |
| A8 = | 1.14124036E−02 | 1.48184399E+00 | 2.35589846E+00 | −1.02766673E−01 |
| A10 = | −1.99597090E−02 | −2.41605810E+00 | −4.76464154E+00 | 2.28942948E−01 |
| A12 = | 2.20492041E−02 | 2.75579575E+00 | 6.83911543E+00 | −3.60811068E−01 |
| A14 = | −1.60088775E−02 | −2.19436307E+00 | −6.94595228E+00 | 3.79262738E−01 |
| A16 = | 7.68660200E−03 | 1.20966437E+00 | 4.94385851E+00 | −2.59671466E−01 |
| A18 = | −2.40959730E−03 | −4.51291344E−01 | −2.40776417E+00 | 1.11158659E−01 |
| A20 = | 4.73463273E−04 | 1.08537897E−01 | 7.63425082E−01 | −2.69445830E−02 |
| A22 = | −5.28828755E−05 | −1.51665124E−02 | −1.41865038E−01 | 2.81405552E−03 |
| A24 = | 2.56019149E−06 | 9.34506497E−04 | 1.17131078E−02 | — |

| Surface # | 7 | 8 | 9 | 10 |
|---|---|---|---|---|
| k = | 0.00000E+00 | 0.00000E+00 | 0.00000E+00 | 0.00000E+00 |
| A4 = | −2.19758239E−02 | −4.15332032E−02 | −9.01472655E−02 | −3.52537112E−02 |
| A6 = | 5.59625803E−02 | −5.70394321E−02 | 1.03917394E−01 | −2.94753714E−02 |
| A8 = | −2.50038099E−01 | 2.63616274E−01 | −2.80934954E−01 | 1.70705584E−01 |
| A10 = | 6.17185547E−01 | −6.48511313E−01 | 4.89685567E−01 | −4.11179650E−01 |
| A12 = | −9.42870572E−01 | 1.00081321E+00 | −4.84331258E−01 | 5.96435052E−01 |
| A14 = | 9.20667530E−01 | −1.02120091E+00 | 1.62981720E−01 | −5.70126739E−01 |
| A16 = | −5.76925777E−01 | 7.00063966E−01 | 1.96494023E−01 | 3.70287209E−01 |
| A18 = | 2.24562608E−01 | −3.20223456E−01 | −2.99072521E−01 | −1.64350158E−01 |
| A20 = | −4.94485139E−02 | 9.41354705E−02 | 1.88468693E−01 | 4.90831536E−02 |
| A22 = | 4.70522324E−03 | −1.61523742E−02 | −6.56027186E−02 | −9.42895630E−03 |
| A24 = | — | 1.23366068E−03 | 1.22965260E−02 | 1.05159954E−03 |
| A26 = | — | — | −9.70997862E−04 | −5.16901398E−05 |

| Surface # | 11 | 12 | 13 | 14 |
|---|---|---|---|---|
| k = | 0.00000E+00 | 0.00000E+00 | 0.00000E+00 | 1.00000E+00 |
| A4 = | −7.96269152E−02 | −1.25673194E−01 | −8.37263842E−03 | 1.37431290E−01 |
| A6 = | 9.77489604E−02 | −1.28176249E−01 | −1.40902459E−03 | −1.57495770E−01 |
| A8 = | −1.29470966E−01 | 1.42050619E−01 | −1.64910498E−02 | −3.52825281E−02 |
| A10 = | 1.47054788E−01 | −2.49298065E−01 | 1.30058087E−02 | 2.78413115E−02 |
| A12 = | −1.22132599E−01 | 2.72678105E−01 | −2.48582765E−03 | −1.12075902E−02 |
| A14 = | 7.04560807E−02 | −2.00646437E−01 | −2.77833270E−03 | 2.87013961E−03 |
| A16 = | −2.78633531E−02 | 1.01879515E−01 | 2.54421637E−03 | −4.93948676E−04 |
| A18 = | 7.43524024E−03 | −3.60472381E−02 | −1.04031872E−03 | 5.79609353E−05 |
| A20 = | −1.29977632E−03 | 8.84459403E−03 | 2.59987178E−04 | −4.60764575E−06 |
| A22 = | 1.40916368E−04 | −1.47155973E−03 | −4.11459283E−05 | 2.41323731E−07 |
| A24 = | −8.48410724E−06 | 1.58036504E−04 | 4.03686945E−06 | −7.82634016E−09 |
| A26 = | 2.13368013E−07 | −9.86555290E−06 | −2.24245345E−07 | 1.37133240E−10 |
| A28 = | — | 2.71553160E−07 | 5.39240871E−09 | −8.72376519E−13 |
| A30 = | — | — | — | −1.61929290E−15 |

| Surface # | 15 | 16 |
|---|---|---|
| k = | 0.00000E+00 | 1.00000E+00 |
| A4 = | −2.24137334E−02 | −1.28923919E−01 |
| A6 = | −2.44464631E−02 | 4.88818044E−02 |
| A8 = | 2.16872524E−02 | −1.63797952E−02 |
| A10 = | −9.53190609E−03 | 4.48174309E−03 |
| A12 = | 2.98847264E−03 | −9.48565518E−04 |
| A14 = | −6.64362089E−04 | 1.50824694E−04 |
| A16 = | 1.01879421E−04 | −1.78007442E−05 |
| A18 = | −1.07075291E−05 | 1.54476333E−06 |
| A20 = | 7.67220121E−07 | −9.68530324E−08 |
| A22 = | −3.67063092E−08 | 4.23899954E−09 |
| A24 = | 1.11048411E−09 | −1.21307797E−10 |
| A26 = | −1.85376202E−11 | 1.97391933E−12 |
| A28 = | 1.02121911E−13 | −1.15218295E−14 |
| A30 = | 7.43616441E−16 | −5.96692081E−17 |

In the 9th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 9th embodiment, so an explanation in this regard will not be provided again.

Moreover, these parameters can be calculated from Table 17 and Table 18 as the following values and satisfy the following conditions:

| 9th Embodiment | | | |
|---|---|---|---|
| f [mm] | 4.89 | f/f45 | −0.77 |
| Fno | 1.83 | f/f67 | 0.50 |
| HFOV [deg.] | 46.8 | f3/f5 | −0.52 |
| V2 + V3 + V6 + V7 | 223.9 | f5/f6 | −4.52 |
| V4/N4 | 10.91 | f5/f7 | 4.89 |
| (CT3 + CT4)/T34 | 6.66 | f6/R11 + f6/R12 | 0.22 |
| (CT4 + CT5)/T45 | 1.17 | Y72/Y11 | 2.17 |
| CT1/|f1| + CT2/|f2| | 0.04 | Yc61/Y61 | 0.64 |
| CT5/T67 | 0.71 | Yc62/Y62 | 0.68 |
| TL/ImgH | 1.34 | Yc72/Y72 | 0.46 |
| |R1/f| | 1.42 | — | — |

10th Embodiment

Figure 19:
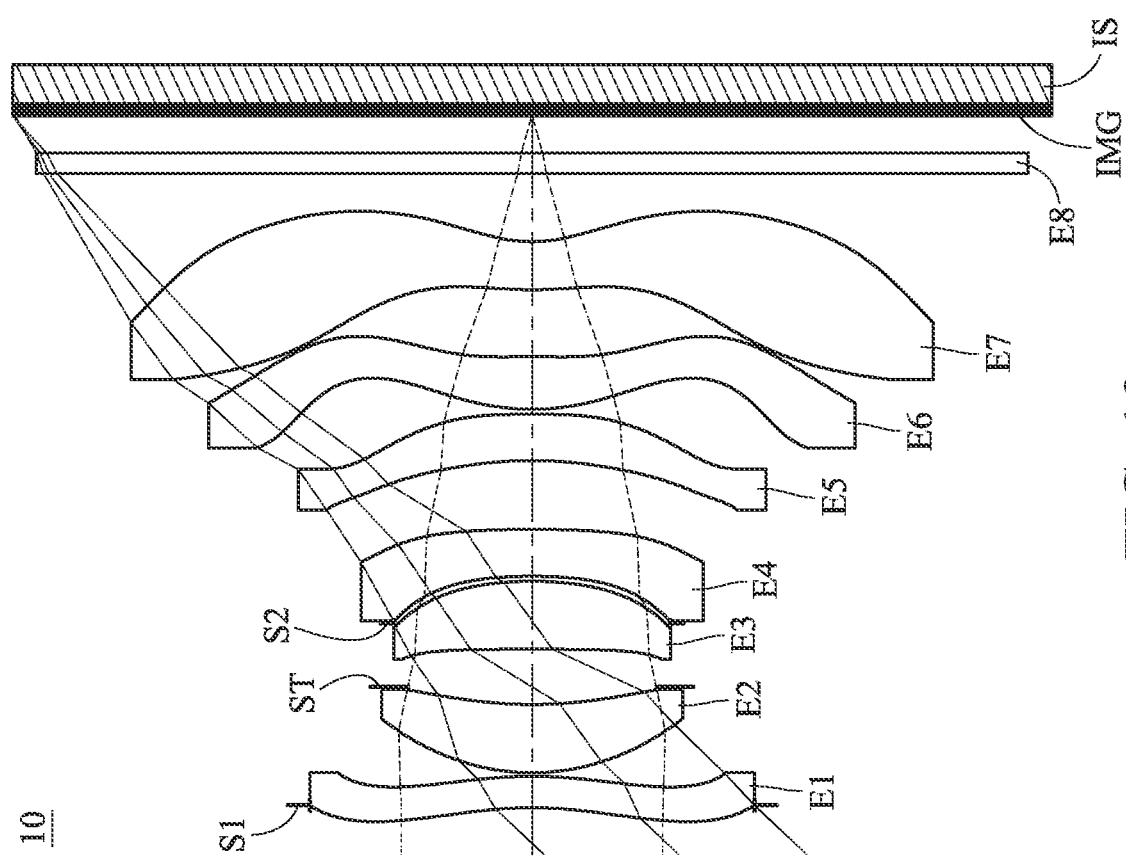
FIG. 19 is a schematic view of an image capturing unit according to the 10th embodiment of the present disclosure.
Figure 20:
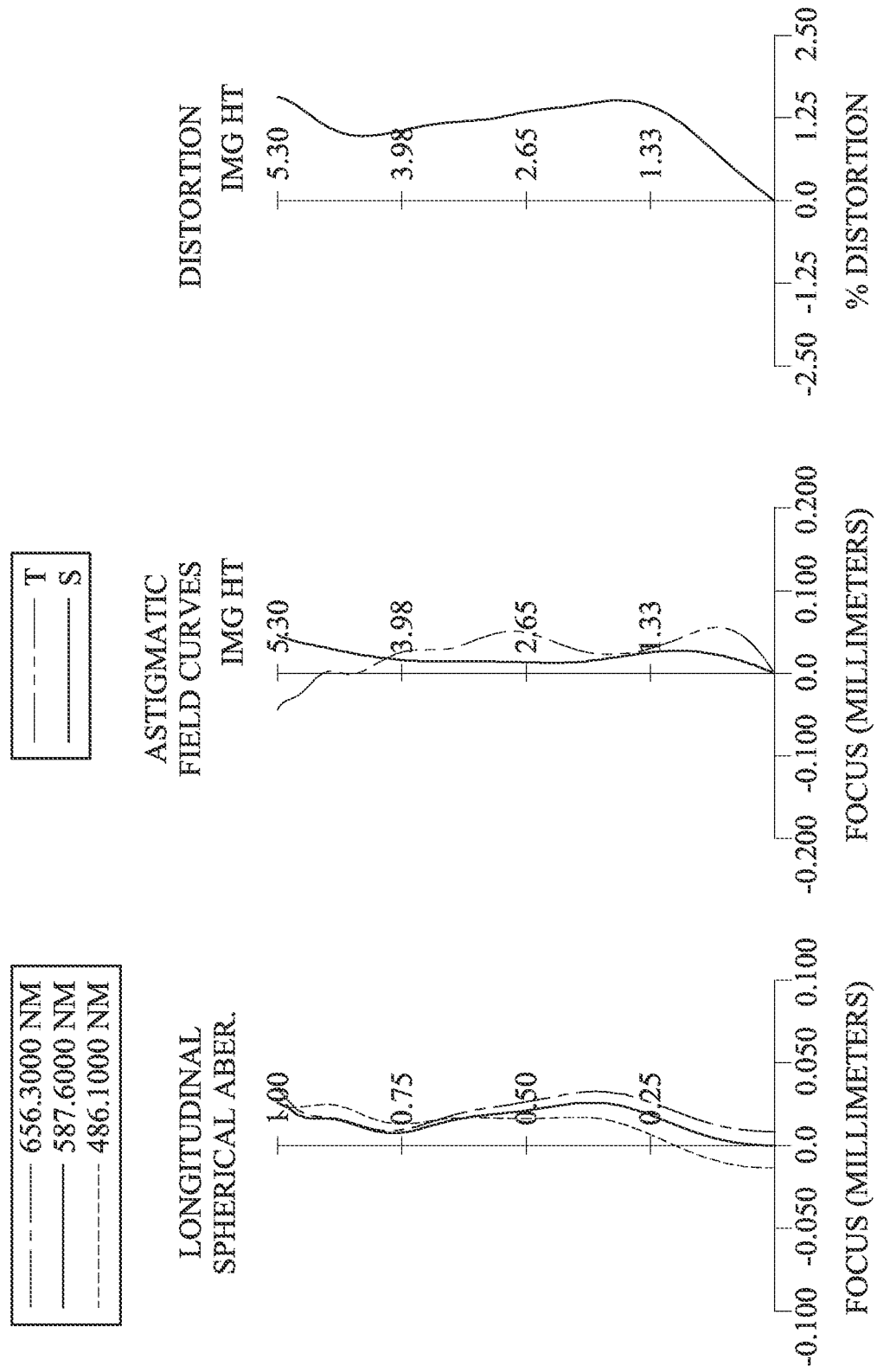
FIG. 20 shows spherical aberration curves, astigmatic field curves and a distortion curve of the image capturing unit according to the 10th embodiment.

FIG. 19 is a schematic view of an image capturing unit according to the 10th embodiment of the present disclosure. FIG. 20 shows, in order from left to right, spherical aberration curves, astigmatic field curves and a distortion curve of the image capturing unit according to the 10th embodiment. In FIG. 19, the image capturing unit 10 includes the optical photographing system (its reference numeral is omitted) of the present disclosure and an image sensor IS. The optical photographing system includes, in order from an object side to an image side along an optical axis, a stop S1, a first lens element E1, a second lens element E2, an aperture stop ST, a third lens element E3, a stop S2, a fourth lens element E4, a fifth lens element E5, a sixth lens element E6, a seventh lens element E7, a filter E8 and an image surface IMG. The optical photographing system includes seven lens elements (E1, E2, E3, E4, E5, E6 and E7) with no additional lens element disposed between each of the adjacent seven lens elements.

The first lens element E1 with negative refractive power has an object-side surface being concave in a paraxial region thereof and an image-side surface being convex in a paraxial region thereof. The first lens element E1 is made of plastic material and has the object-side surface and the image-side surface being both aspheric. The object-side surface of the first lens element E1 has one inflection point. The image-side surface of the first lens element E1 has one inflection point.

The second lens element E2 with positive refractive power has an object-side surface being convex in a paraxial region thereof and an image-side surface being concave in a paraxial region thereof. The second lens element E2 is made of plastic material and has the object-side surface and the image-side surface being both aspheric. The image-side surface of the second lens element E2 has two inflection points.

The third lens element E3 with positive refractive power has an object-side surface being concave in a paraxial region thereof and an image-side surface being convex in a paraxial region thereof. The third lens element E3 is made of plastic material and has the object-side surface and the image-side surface being both aspheric.

The fourth lens element E4 with negative refractive power has an object-side surface being concave in a paraxial region thereof and an image-side surface being convex in a paraxial region thereof. The fourth lens element E4 is made of plastic material and has the object-side surface and the image-side surface being both aspheric. The image-side surface of the fourth lens element E4 has one inflection point.

The fifth lens element E5 with negative refractive power has an object-side surface being concave in a paraxial region thereof and an image-side surface being convex in a paraxial region thereof. The fifth lens element E5 is made of plastic material and has the object-side surface and the image-side surface being both aspheric. The object-side surface of the fifth lens element E5 has two inflection points. The image-side surface of the fifth lens element E5 has two inflection points.

The sixth lens element E6 with positive refractive power has an object-side surface being convex in a paraxial region thereof and an image-side surface being convex in a paraxial region thereof. The sixth lens element E6 is made of plastic material and has the object-side surface and the image-side surface being both aspheric. The object-side surface of the sixth lens element E6 has two inflection points. The image-side surface of the sixth lens element E6 has four inflection points. The object-side surface of the sixth lens element E6 has at least one concave critical point in an off-axis region thereof. The image-side surface of the sixth lens element E6 has at least one convex critical point in an off-axis region thereof.

The seventh lens element E7 with negative refractive power has an object-side surface being convex in a paraxial region thereof and an image-side surface being concave in a paraxial region thereof. The seventh lens element E7 is made of plastic material and has the object-side surface and the image-side surface being both aspheric. The object-side surface of the seventh lens element E7 has two inflection points. The image-side surface of the seventh lens element E7 has two inflection points. The image-side surface of the seventh lens element E7 has at least one convex critical point in an off-axis region thereof.

The filter E8 is made of glass material and located between the seventh lens element E7 and the image surface IMG, and will not affect the focal length of the optical photographing system. The image sensor IS is disposed on or near the image surface IMG of the optical photographing system.

The detailed optical data of the 10th embodiment are shown in Table 19 and the aspheric surface data are shown in Table 20 below.

TABLE 19

10th Embodiment
f = 4.88 mm, Fno = 1.83, HFOV = 46.9 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Stop | Plano | −0.024 | | | | |
| 2 | Lens 1 | −3.8110 (ASP) | 0.322 | Plastic | 1.545 | 56.1 | −195.21 |
| 3 | | −4.0704 (ASP) | 0.035 | | | | |
| 4 | Lens 2 | 2.2650 (ASP) | 0.698 | Plastic | 1.544 | 56.0 | 7.87 |
| 5 | | 4.2892 (ASP) | 0.180 | | | | |
| 6 | Ape. Stop | Plano | 0.385 | | | | |
| 7 | Lens 3 | −74.3854 (ASP) | 0.695 | Plastic | 1.544 | 56.0 | 6.79 |
| 8 | | −3.5325 (ASP) | −0.433 | | | | |
| 9 | Stop | Plano | 0.484 | | | | |
| 10 | Lens 4 | −4.6871 (ASP) | 0.479 | Plastic | 1.669 | 19.4 | −11.31 |
| 11 | | −12.8193 (ASP) | 0.704 | | | | |
| 12 | Lens 5 | −4.0294 (ASP) | 0.473 | Plastic | 1.566 | 37.4 | −10.74 |
| 13 | | −12.4566 (ASP) | 0.051 | | | | |
| 14 | Lens 6 | 2.5185 (ASP) | 0.537 | Plastic | 1.544 | 56.0 | 4.05 |
| 15 | | −16.3949 (ASP) | 0.685 | | | | |
| 16 | Lens 7 | 4.2073 (ASP) | 0.490 | Plastic | 1.534 | 55.9 | −4.25 |
| 17 | | 1.4141 (ASP) | 0.700 | | | | |
| 18 | Filter | Plano | 0.210 | Glass | 1.517 | 64.2 | — |
| 19 | | Plano | 0.375 | | | | |
| 20 | Image | Plano | — | | | | |

Note:
Reference wavelength is 587.6 nm (d-line).
An effective radius of the stop S1 (Surface 1) is 2.270 mm.
An effective radius of the stop S2 (Surface 9 is 1.405 mm.

TABLE 20

Aspheric Coefficients

| Surface # | 2 | 3 | 4 | 5 |
|---|---|---|---|---|
| k = | −4.18257E−01 | 0.00000E+00 | −6.75557E−01 | −3.99828E−01 |
| A4 = | 5.42875496E−02 | 6.18059456E−02 | 1.12293672E−02 | −2.43534858E−02 |
| A6 = | −2.73091937E−02 | −5.71686107E−02 | −7.40952696E−02 | 2.62896533E−02 |
| A8 = | 1.74980351E−02 | 7.98175918E−02 | 2.07751543E−01 | −5.94942683E−02 |
| A10 = | −7.84711608E−03 | −8.25875499E−02 | −3.48809152E−01 | 1.16092667E−01 |
| A12 = | 2.16934296E−03 | 6.13238701E−02 | 3.85513174E−01 | −1.57785267E−01 |
| A14 = | −2.76653130E−04 | −3.24591807E−02 | −2.84146073E−01 | 1.36005082E−01 |
| A16 = | −1.91210059E−05 | 1.21257193E−02 | 1.37716187E−01 | −7.01513525E−02 |
| A18 = | 1.19511391E−05 | −3.11323287E−03 | −4.19975290E−02 | 1.90992931E−02 |
| A20 = | −1.57645380E−06 | 5.21110553E−04 | 7.27585511E−03 | −1.77104135E−03 |
| A22 = | 7.32902172E−08 | −5.10751906E−05 | −5.43626619E−04 | −1.24214427E−04 |
| A24 = | — | 2.22057430E−06 | — | — |

| Surface # | 7 | 8 | 10 | 11 |
|---|---|---|---|---|
| k = | 0.00000E+00 | 0.00000E+00 | 0.00000E+00 | 0.00000E+00 |
| A4 = | −1.71474326E−02 | −7.88583583E−03 | −3.39866948E−02 | −5.01145679E−03 |
| A6 = | 1.47127948E−02 | −1.39084564E−01 | −2.56761509E−03 | −3.43459703E−02 |
| A8 = | −4.91086736E−02 | 3.49198854E−01 | −2.76923514E−01 | 6.60590197E−02 |
| A10 = | 6.86594533E−02 | −5.98469542E−01 | 1.05040544E+00 | −1.32530972E−01 |
| A12 = | −5.00401359E−02 | 7.01003372E−01 | −2.10127681E+00 | 1.93843006E−01 |
| A14 = | 9.69373584E−03 | −5.46356414E−01 | 2.63449499E+00 | −1.94449753E−01 |
| A16 = | 9.05867929E−03 | 2.70400712E−01 | −2.16000247E+00 | 1.33725901E−01 |
| A18 = | −5.87337262E−03 | −7.92129293E−02 | 1.15405922E+00 | −6.30035720E−02 |
| A20 = | 1.02052007E−03 | 1.19627954E−02 | −3.86025048E−01 | 2.00032936E−02 |
| A22 = | — | −6.51212505E−04 | 7.32073200E−02 | −4.08902248E−03 |
| A24 = | — | — | −5.99577586E−03 | 4.85257344E−04 |
| A26 = | — | — | — | −2.53477820E−05 |

| Surface # | 12 | 13 | 14 | 15 |
|---|---|---|---|---|
| k = | −1.26144E+00 | 0.00000E+00 | −1.00000E+00 | 0.00000E+00 |
| A4 = | −2.75400676E−03 | −8.49865846E−02 | 3.60843091E−02 | 1.85624788E−01 |
| A6 = | 7.62719311E−02 | −5.54990489E−02 | −1.06032905E−01 | −9.74306761E−02 |
| A8 = | −1.54020283E−01 | 1.82180235E−01 | 1.26325743E−01 | 7.80019162E−03 |
| A10 = | 1.70453683E−01 | −2.35575785E−01 | −1.16660012E−01 | 1.42654336E−02 |
| A12 = | −1.24992402E−01 | 1.95029340E−01 | 7.43894640E−02 | −8.57027360E−03 |
| A14 = | 6.43789131E−02 | −1.09582362E−01 | −3.23761910E−02 | 2.63940022E−03 |
| A16 = | −2.40927009E−02 | 4.24679350E−02 | 9.74530416E−03 | −5.24207002E−04 |
| A18 = | 6.62539753E−03 | −1.13938028E−02 | −2.04503646E−03 | 7.14251404E−05 |

TABLE 20-continued

| Aspheric Coefficients | | | | |
|---|---|---|---|---|
| A20 = | −1.30776682E−03 | 2.10315369E−03 | 2.97591976E−04 | −6.77330272E−06 |
| A22 = | 1.73822164E−04 | −2.61535404E−04 | −2.93115331E−05 | 4.40639557E−07 |
| A24 = | −1.37699546E−05 | 2.08968388E−05 | 1.84890193E−06 | −1.87727582E−08 |
| A26 = | 4.86594621E−07 | −9.67534679E−07 | −6.58668784E−08 | 4.71789126E−10 |
| A28 = | — | 1.97040800E−08 | 8.86446181E−10 | −5.29995750E−12 |
| A30 = | — | — | 6.73826102E−12 | — |

| Surface # | 16 | 17 |
|---|---|---|
| k = | 0.00000E+00 | −1.00000E+00 |
| A4 = | −1.31290254E−01 | −2.03898411E−01 |
| A6 = | 1.80830464E−02 | 9.26788869E−02 |
| A8 = | 1.27718428E−02 | −3.57059387E−02 |
| A10 = | −9.35846058E−03 | 1.08332111E−02 |
| A12 = | 3.16849301E−03 | −2.48885056E−03 |
| A14 = | −6.66052623E−04 | 4.23380633E−04 |
| A16 = | 9.37462080E−05 | −5.25854650E−05 |
| A18 = | −9.08269838E−06 | 4.70667445E−06 |
| A20 = | 6.06836695E−07 | −2.97698335E−07 |
| A22 = | −2.72983485E−08 | 1.28387541E−08 |
| A24 = | 7.74903468E−10 | −3.51377907E−10 |
| A26 = | −1.17097678E−11 | 5.12114034E−12 |
| A28 = | 3.85371784E−14 | −1.57828518E−14 |
| A30 = | 8.18505701E−16 | −3.43592788E−16 |

In the 10th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 10th embodiment, so an explanation in this regard will not be provided again.

Moreover, these parameters can be calculated from Table 19 and Table 20 as the following values and satisfy the following conditions:

| 10th Embodiment | | | |
|---|---|---|---|
| f [mm] | 4.88 | f/f45 | −0.93 |
| Fno | 1.83 | f/f67 | 0.48 |
| HFOV [deg.] | 46.9 | f3/f5 | −0.63 |
| V2 + V3 + V6 + V7 | 223.9 | f5/f6 | −2.65 |
| V4/N4 | 11.65 | f5/f7 | 2.53 |
| (CT3 + CT4)/T34 | 23.02 | f6/R11 + f6/R12 | 1.36 |
| (CT4 + CT5)/T45 | 1.35 | Y72/Y11 | 1.80 |
| CT1/|f1| + CT2/|f2| | 0.09 | Yc61/Y61 | 0.58 |
| CT5/T67 | 0.69 | Yc62/Y62 | 0.54 |
| TL/ImgH | 1.33 | Yc72/Y72 | 0.43 |
| |R1/f| | 0.78 | — | — |

11th Embodiment

Figure 21:
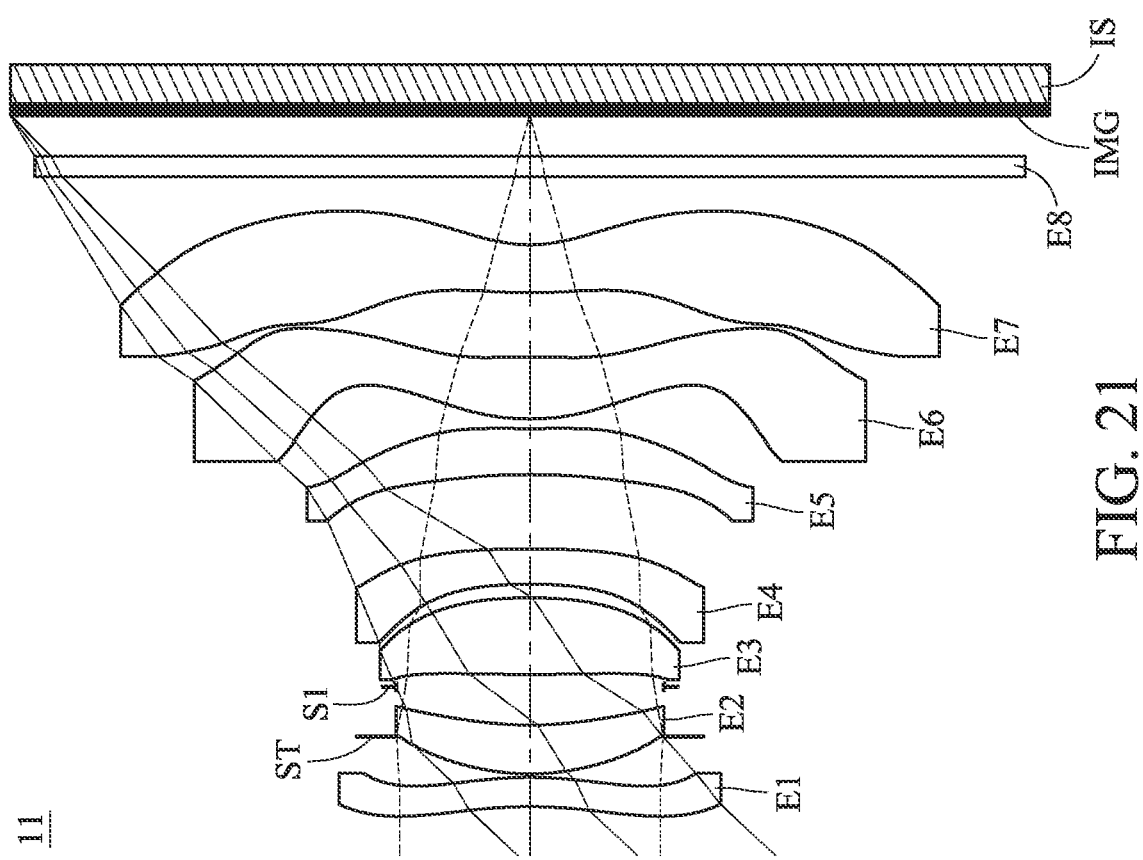
FIG. 21 is a schematic view of an image capturing unit according to the 11th embodiment of the present disclosure.
Figure 22:
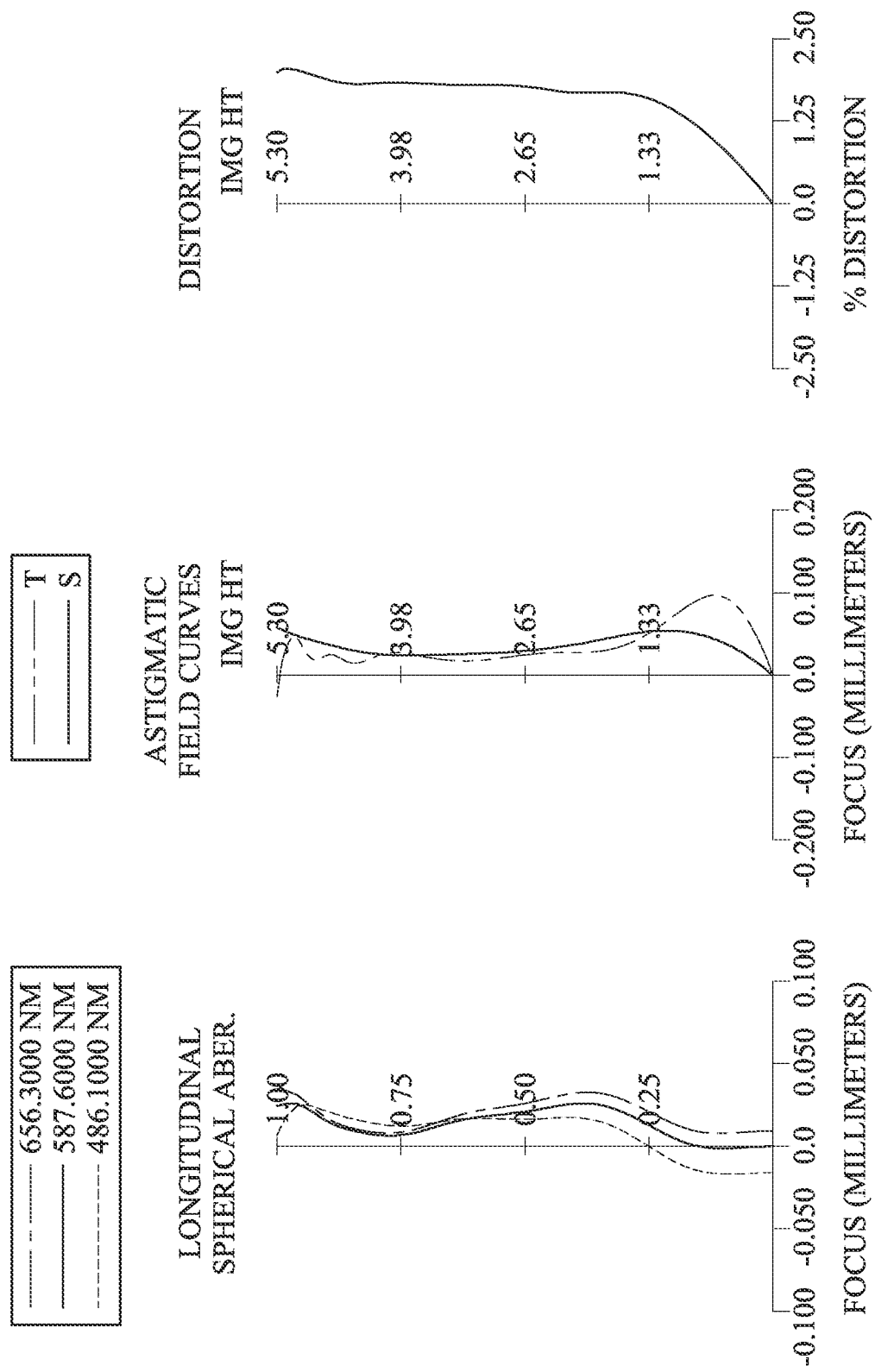
FIG. 22 shows spherical aberration curves, astigmatic field curves and a distortion curve of the image capturing unit according to the 11th embodiment.

FIG. 21 is a schematic view of an image capturing unit according to the 11th embodiment of the present disclosure. FIG. 22 shows, in order from left to right, spherical aberration curves, astigmatic field curves and a distortion curve of the image capturing unit according to the 11th embodiment. In FIG. 21, the image capturing unit 11 includes the optical photographing system (its reference numeral is omitted) of the present disclosure and an image sensor IS. The optical photographing system includes, in order from an object side to an image side along an optical axis, a first lens element E1, an aperture stop ST, a second lens element E2, a stop S1, a third lens element E3, a fourth lens element E4, a fifth lens element E5, a sixth lens element E6, a seventh lens element E7, a filter E8 and an image surface IMG. The optical photographing system includes seven lens elements (E1, E2, E3, E4, E5, E6 and E7) with no additional lens element disposed between each of the adjacent seven lens elements.

The first lens element E1 with positive refractive power has an object-side surface being concave in a paraxial region thereof and an image-side surface being convex in a paraxial region thereof. The first lens element E1 is made of plastic material and has the object-side surface and the image-side surface being both aspheric. The object-side surface of the first lens element E1 has one inflection point. The image-side surface of the first lens element E1 has one inflection point.

The second lens element E2 with positive refractive power has an object-side surface being convex in a paraxial region thereof and an image-side surface being concave in a paraxial region thereof. The second lens element E2 is made of plastic material and has the object-side surface and the image-side surface being both aspheric.

The third lens element E3 with positive refractive power has an object-side surface being convex in a paraxial region thereof and an image-side surface being convex in a paraxial region thereof. The third lens element E3 is made of plastic material and has the object-side surface and the image-side surface being both aspheric. The object-side surface of the third lens element E3 has one inflection point. The image-side surface of the third lens element E3 has one inflection point.

The fourth lens element E4 with negative refractive power has an object-side surface being concave in a paraxial region thereof and an image-side surface being convex in a paraxial region thereof. The fourth lens element E4 is made of plastic material and has the object-side surface and the image-side surface being both aspheric. The object-side surface of the fourth lens element E4 has one inflection point. The image-side surface of the fourth lens element E4 has one inflection point.

The fifth lens element E5 with negative refractive power has an object-side surface being concave in a paraxial region thereof and an image-side surface being concave in a paraxial region thereof. The fifth lens element E5 is made of plastic material and has the object-side surface and the image-side surface being both aspheric. The image-side surface of the fifth lens element E5 has two inflection points.

The sixth lens element E6 with positive refractive power has an object-side surface being convex in a paraxial region thereof and an image-side surface being convex in a paraxial region thereof. The sixth lens element E6 is made of plastic material and has the object-side surface and the image-side surface being both aspheric. The object-side surface of the sixth lens element E6 has two inflection points. The image-side surface of the sixth lens element E6 has four inflection points. The object-side surface of the sixth lens element E6 has at least one concave critical point in an off-axis region thereof. The image-side surface of the sixth lens element E6 has at least one convex critical point in an off-axis region thereof.

The seventh lens element E7 with negative refractive power has an object-side surface being convex in a paraxial region thereof and an image-side surface being concave in a paraxial region thereof. The seventh lens element E7 is made of plastic material and has the object-side surface and the image-side surface being both aspheric. The object-side surface of the seventh lens element E7 has four inflection points. The image-side surface of the seventh lens element E7 has two inflection points. The image-side surface of the seventh lens element E7 has at least one convex critical point in an off-axis region thereof.

The filter E8 is made of glass material and located between the seventh lens element E7 and the image surface IMG, and will not affect the focal length of the optical photographing system. The image sensor IS is disposed on or near the image surface IMG of the optical photographing system.

The detailed optical data of the 11th embodiment are shown in Table 21 and the aspheric surface data are shown in Table 22 below.

TABLE 21

11th Embodiment
f = 4.87 mm, Fno = 1.83, HFOV = 46.8 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | −4.2550 (ASP) | 0.300 | Plastic | 1.545 | 56.1 | 43.82 |
| 2 | | −3.7013 (ASP) | 0.415 | | | | |
| 3 | Ape. Stop | Plano | −0.380 | | | | |
| 4 | Lens 2 | 2.5040 (ASP) | 0.498 | Plastic | 1.544 | 56.0 | 13.57 |
| 5 | | 3.5234 (ASP) | 0.394 | | | | |
| 6 | Stop | Plano | 0.125 | | | | |
| 7 | Lens 3 | 21.0066 (ASP) | 0.784 | Plastic | 1.544 | 56.0 | 6.81 |
| 8 | | −4.4420 (ASP) | 0.140 | | | | |
| 9 | Lens 4 | −4.7361 (ASP) | 0.360 | Plastic | 1.669 | 19.4 | −12.71 |
| 10 | | −11.0145 (ASP) | 0.760 | | | | |
| 11 | Lens 5 | −6.6882 (ASP) | 0.471 | Plastic | 1.566 | 37.4 | −10.19 |
| 12 | | 43.0671 (ASP) | 0.098 | | | | |
| 13 | Lens 6 | 2.5318 (ASP) | 0.634 | Plastic | 1.544 | 56.0 | 3.58 |
| 14 | | −7.6549 (ASP) | 0.656 | | | | |
| 15 | Lens 7 | 5.1131 (ASP) | 0.490 | Plastic | 1.534 | 55.9 | −3.84 |
| 16 | | 1.4154 (ASP) | 0.700 | | | | |
| 17 | Filter | Plano | 0.210 | Glass | 1.517 | 64.2 | — |
| 18 | | Plano | 0.408 | | | | |
| 19 | Image | Plano | — | | | | |

Note:
Reference wavelength is 587.6 nm (d-line).
An effective radius of the stop S1 (Surface 6) is 1.370 mm.

TABLE 22

Aspheric Coefficients

| Surface # | 1 | 2 | 4 | 5 |
|---|---|---|---|---|
| k = | −4.03584E+00 | 0.00000E+00 | −4.93045E−01 | 0.00000E+00 |
| A4 = | 4.14394239E−02 | 7.98513531E−02 | 1.53485378E−02 | −5.76855730E−02 |
| A6 = | −2.13720624E−02 | −1.03787043E−01 | −1.50983078E−01 | 6.55925796E−02 |
| A8 = | 1.94469661E−02 | 2.51552070E−01 | 5.40745208E−01 | −1.22714685E−01 |
| A10 = | −9.64199777E−03 | −4.28589623E−01 | −1.13321917E+00 | 1.94890922E−01 |
| A12 = | 1.32202295E−03 | 5.04565949E−01 | 1.53720214E+00 | −2.10320433E−01 |
| A14 = | 1.28288056E−03 | −4.09080808E−01 | −1.37803156E+00 | 1.46342684E−01 |
| A16 = | −8.53933644E−04 | 2.27001290E−01 | 8.10548633E−01 | −6.25743238E−02 |
| A18 = | 2.39140722E−04 | −8.44445231E−02 | −3.00721169E−01 | 1.49808707E−02 |
| A20 = | −3.34809076E−05 | 2.00937451E−02 | 6.38231848E−02 | −1.53417085E−03 |
| A22 = | 1.90843335E−06 | −2.75981952E−03 | −5.90788518E−03 | — |
| A24 = | — | 1.66194655E−04 | — | — |

| Surface # | 7 | 8 | 9 | 10 |
|---|---|---|---|---|
| k = | 0.00000E+00 | 0.00000E+00 | 0.00000E+00 | 0.00000E+00 |
| A4 = | −1.38004280E−02 | −2.10031782E−02 | −4.84505768E−02 | −7.19009299E−03 |
| A6 = | −1.98341845E−03 | −1.37295278E−01 | −5.07585282E−02 | −7.21611923E−02 |
| A8 = | −1.71066344E−02 | 4.80391858E−01 | 1.43380753E−01 | 2.05095276E−01 |
| A10 = | 7.48606545E−02 | −1.10304998E+00 | −4.08215074E−01 | −4.14009346E−01 |

TABLE 22-continued

| Aspheric Coefficients | | | | |
|---|---|---|---|---|
| A12 = | −1.61954648E−01 | 1.68159716E+00 | 8.50054294E−01 | 5.59277693E−01 |
| A14 = | 2.01994401E−01 | −1.72339976E+00 | −1.19971600E+00 | −5.12589317E−01 |
| A16 = | −1.53802037E−01 | 1.19223986E+00 | 1.15293175E+00 | 3.22867981E−01 |
| A18 = | 7.04782811E−02 | −5.49918526E−01 | −7.56511814E−01 | −1.39806038E−01 |
| A20 = | −1.78785041E−02 | 1.62299262E−01 | 3.33381297E−01 | 4.08879633E−02 |
| A22 = | 1.92899847E−03 | −2.77639760E−02 | −9.41953917E−02 | −7.71261480E−03 |
| A24 = | — | 2.09637360E−03 | 1.53833577E−02 | 8.46356378E−04 |
| A26 = | — | — | −1.10164643E−03 | −4.09994272E−05 |

| Surface # | 11 | 12 | 13 | 14 |
|---|---|---|---|---|
| k = | 0.00000E+00 | 0.00000E+00 | −1.00000E+00 | 0.00000E+00 |
| A4 = | −7.92539781E−03 | −4.27344675E−03 | 1.14891541E−01 | 2.07963118E−01 |
| A6 = | 1.46233257E−02 | −3.72124349E−01 | −3.18663743E−01 | −9.99252823E−02 |
| A8 = | 2.63729573E−02 | 7.72263848E−01 | 4.50632804E−01 | 4.94518405E−03 |
| A10 = | −8.72774395E−02 | −9.41184008E−01 | −4.38722811E−01 | 1.65711644E−02 |
| A12 = | 1.13218882E−01 | 7.83193577E−01 | 2.96048102E−01 | −9.17984768E−03 |
| A14 = | −8.85722258E−02 | −4.61347988E−01 | −1.41047943E−01 | 2.62011255E−03 |
| A16 = | 4.55829137E−02 | 1.94563701E−01 | 4.81130919E−02 | −4.67721960E−04 |
| A18 = | −1.57987111E−02 | −5.86343472E−02 | −1.17956924E−02 | 5.45288086E−05 |
| A20 = | 3.64783034E−03 | 1.24224355E−02 | 2.05930383E−03 | −4.12595790E−06 |
| A22 = | −5.36274420E−04 | −1.78144375E−03 | −2.49380397E−04 | 1.92589984E−07 |
| A24 = | 4.52546528E−05 | 1.59459508E−04 | 1.98696019E−05 | −4.81140449E−09 |
| A26 = | −1.66344203E−06 | −7.18067056E−06 | −9.34915134E−07 | 3.53929533E−11 |
| A28 = | — | 1.36087012E−08 | 1.96474439E−08 | 5.33251892E−13 |
| A30 = | — | 8.26580254E−09 | — | — |

| Surface # | 15 | 16 |
|---|---|---|
| k = | 0.00000E+00 | −1.00000E+00 |
| A4 = | −9.04274691E−02 | −1.88987516E−01 |
| A6 = | −1.31743435E−02 | 7.99064043E−02 |
| A8 = | 3.26756730E−02 | −2.82735219E−02 |
| A10 = | −1.92136512E−02 | 7.87535285E−03 |
| A12 = | 6.76626258E−03 | −1.66843353E−03 |
| A14 = | −1.55669759E−03 | 2.63828652E−04 |
| A16 = | 2.40907984E−04 | −3.08263267E−05 |
| A18 = | −2.54762975E−05 | 2.63523828E−06 |
| A20 = | 1.84346539E−06 | −1.62014570E−07 |
| A22 = | −8.95412978E−08 | 6.93326860E−09 |
| A24 = | 2.76770564E−09 | −1.93945104E−10 |
| A26 = | −4.77212494E−11 | 3.09592822E−12 |
| A28 = | 2.86808465E−13 | −1.80875745E−14 |
| A30 = | 1.72265213E−15 | −8.38237481E−17 |

In the 11th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 11th embodiment, so an explanation in this regard will not be provided again.

Moreover, these parameters can be calculated from Table 21 and Table 22 as the following values and satisfy the following conditions:

| 11th Embodiment | | | |
|---|---|---|---|
| f [mm] | 4.87 | f/f45 | −0.91 |
| Fno | 1.83 | f/f67 | 0.60 |
| HFOV [deg.] | 46.8 | f3/f5 | −0.67 |
| V2 + V3 + V6 + V7 | 223.9 | f5/f6 | −2.85 |
| V4/N4 | 11.65 | f5/f7 | 2.65 |
| (CT3 + CT4)/T34 | 8.17 | f6/R11 + f6/R12 | 0.95 |
| (CT4 + CT5)/T45 | 1.09 | Y72/Y11 | 2.14 |
| CT1/|f1| + CT2/|f2| | 0.04 | Yc61/Y61 | 0.64 |
| CT5/T67 | 0.72 | Yc62/Y62 | 0.68 |
| TL/ImgH | 1.33 | Yc72/Y72 | 0.46 |
| |R1/f| | 0.87 | — | — |

12th Embodiment

Figure 23:
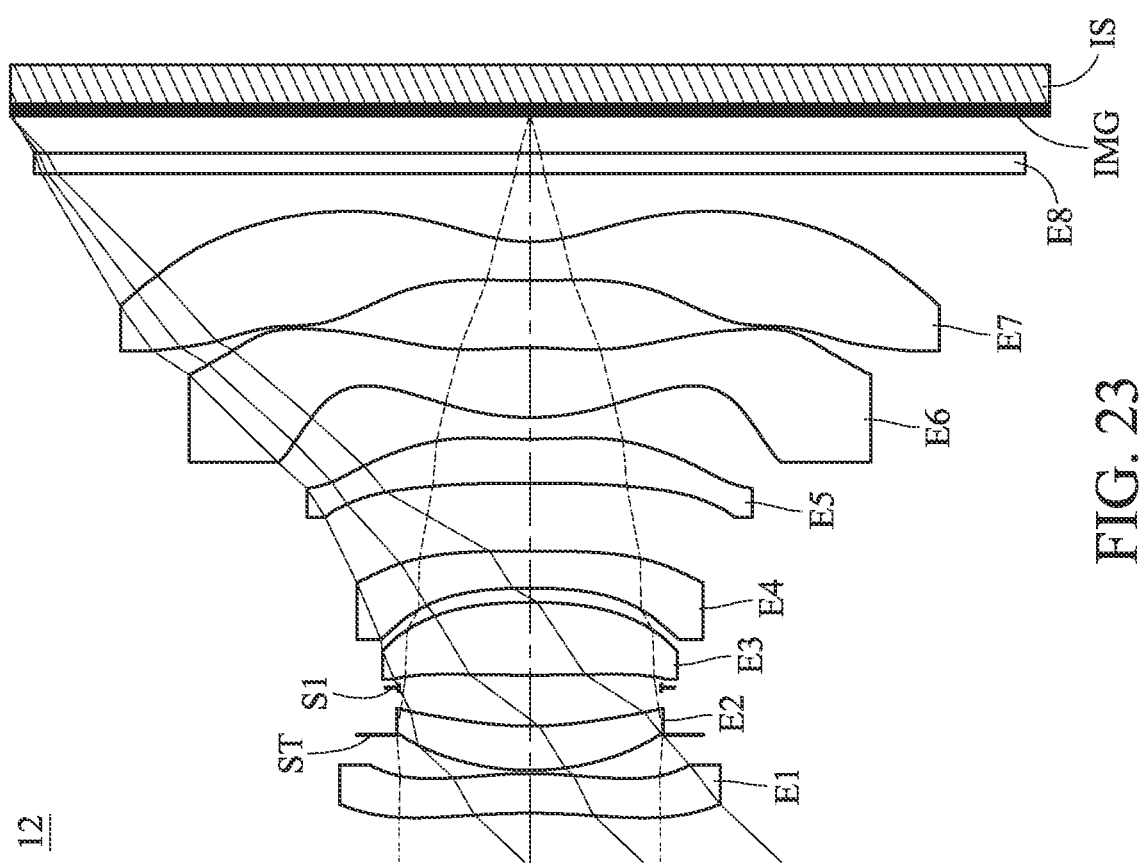
FIG. 23 is a schematic view of an image capturing unit according to the 12th embodiment of the present disclosure.
Figure 24:
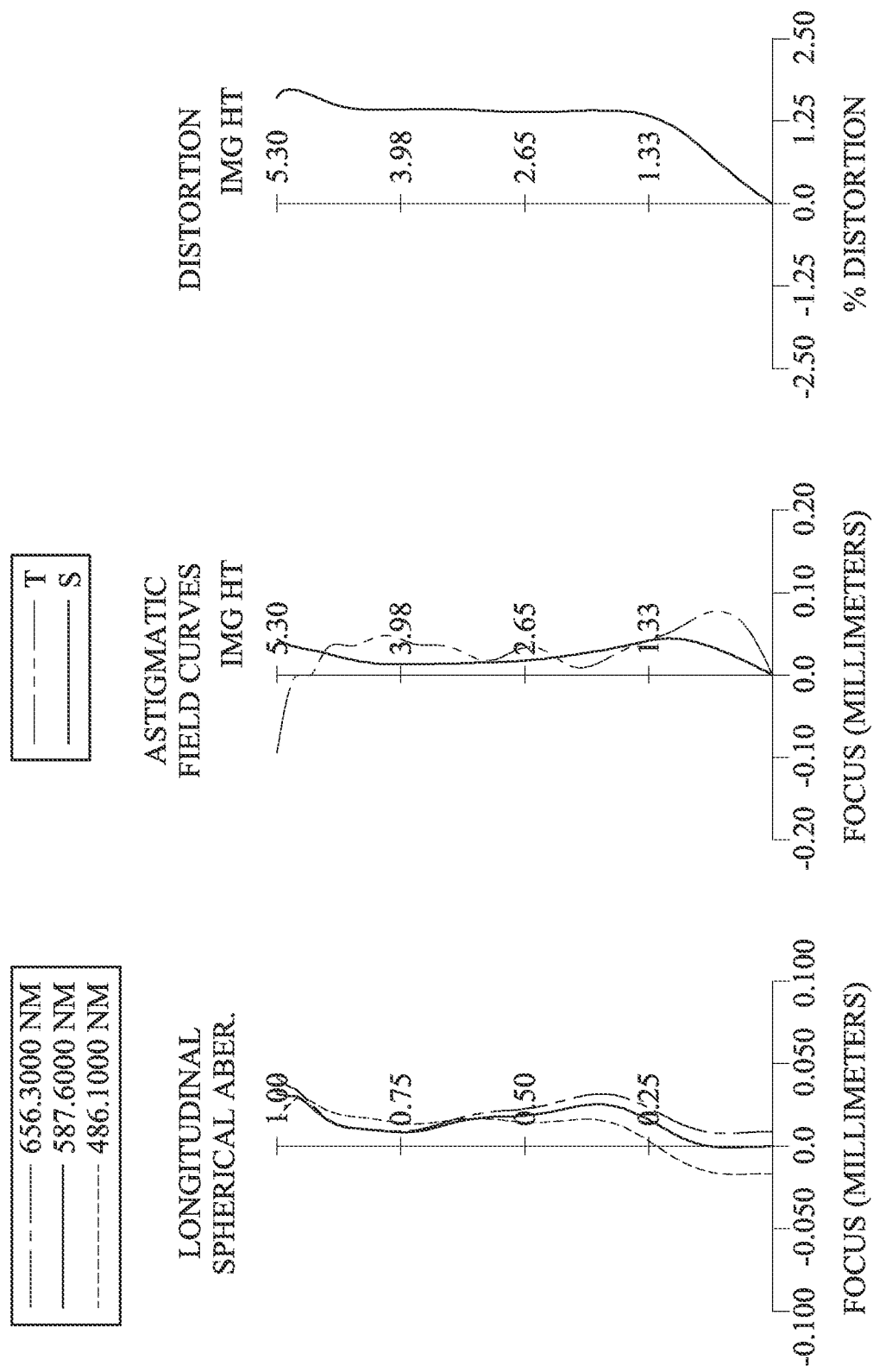
FIG. 24 shows spherical aberration curves, astigmatic field curves and a distortion curve of the image capturing unit according to the 12th embodiment.

FIG. 23 is a schematic view of an image capturing unit according to the 12th embodiment of the present disclosure. FIG. 24 shows, in order from left to right, spherical aberration curves, astigmatic field curves and a distortion curve of the image capturing unit according to the 12th embodiment. In FIG. 23, the image capturing unit 12 includes the optical photographing system (its reference numeral is omitted) of the present disclosure and an image sensor IS. The optical photographing system includes, in order from an object side to an image side along an optical axis, a first lens element E1, an aperture stop ST, a second lens element E2, a stop S1, a third lens element E3, a fourth lens element E4, a fifth lens element E5, a sixth lens element E6, a seventh lens element E7, a filter E8 and an image surface IMG. The optical photographing system includes seven lens elements (E1, E2, E3, E4, E5, E6 and E7) with no additional lens element disposed between each of the adjacent seven lens elements.

The first lens element E1 with positive refractive power has an object-side surface being concave in a paraxial region thereof and an image-side surface being convex in a paraxial region thereof. The first lens element E1 is made of plastic material and has the object-side surface and the image-side surface being both aspheric. The object-side surface of the first lens element E1 has one inflection point. The image-side surface of the first lens element E1 has one inflection point.

The second lens element E2 with positive refractive power has an object-side surface being convex in a paraxial region thereof and an image-side surface being concave in a paraxial region thereof. The second lens element E2 is made of plastic material and has the object-side surface and the image-side surface being both aspheric.

The third lens element E3 with positive refractive power has an object-side surface being convex in a paraxial region thereof and an image-side surface being convex in a paraxial region thereof. The third lens element E3 is made of plastic material and has the object-side surface and the image-side surface being both aspheric. The object-side surface of the third lens element E3 has one inflection point.

The fourth lens element E4 with negative refractive power has an object-side surface being concave in a paraxial region thereof and an image-side surface being convex in a paraxial region thereof. The fourth lens element E4 is made of plastic material and has the object-side surface and the image-side surface being both aspheric. The object-side surface of the fourth lens element E4 has one inflection point. The image-side surface of the fourth lens element E4 has one inflection point.

The fifth lens element E5 with negative refractive power has an object-side surface being concave in a paraxial region thereof and an image-side surface being concave in a paraxial region thereof. The fifth lens element E5 is made of plastic material and has the object-side surface and the image-side surface being both aspheric. The image-side surface of the fifth lens element E5 has two inflection points.

The sixth lens element E6 with positive refractive power has an object-side surface being convex in a paraxial region thereof and an image-side surface being convex in a paraxial region thereof. The sixth lens element E6 is made of plastic material and has the object-side surface and the image-side surface being both aspheric. The object-side surface of the sixth lens element E6 has two inflection points. The image-side surface of the sixth lens element E6 has four inflection points. The object-side surface of the sixth lens element E6 has at least one concave critical point in an off-axis region thereof. The image-side surface of the sixth lens element E6 has at least one convex critical point in an off-axis region thereof.

The seventh lens element E7 with negative refractive power has an object-side surface being convex in a paraxial region thereof and an image-side surface being concave in a paraxial region thereof. The seventh lens element E7 is made of plastic material and has the object-side surface and the image-side surface being both aspheric. The object-side surface of the seventh lens element E7 has four inflection points. The image-side surface of the seventh lens element E7 has one inflection point. The image-side surface of the seventh lens element E7 has at least one convex critical point in an off-axis region thereof.

The filter E8 is made of glass material and located between the seventh lens element E7 and the image surface IMG, and will not affect the focal length of the optical photographing system. The image sensor IS is disposed on or near the image surface IMG of the optical photographing system.

The detailed optical data of the 12th embodiment are shown in Table 23 and the aspheric surface data are shown in Table 24 below.

TABLE 23

12th Embodiment
f = 4.88 mm, Fno = 1.83, HFOV = 46.8 deg.

| Surface # | | Curvature Radius | Thickness | Material | Index | Abbe # | Focal Length |
|---|---|---|---|---|---|---|---|
| 0 | Object | Plano | Infinity | | | | |
| 1 | Lens 1 | −7.0016 (ASP) | 0.404 | Plastic | 1.545 | 56.1 | 18.21 |
| 2 | | −4.1887 (ASP) | 0.393 | | | | |
| 3 | Ape. Stop | Plano | −0.358 | | | | |
| 4 | Lens 2 | 2.9574 (ASP) | 0.451 | Plastic | 1.544 | 56.0 | 26.54 |
| 5 | | 3.5194 (ASP) | 0.393 | | | | |
| 6 | Stop | Plano | 0.128 | | | | |
| 7 | Lens 3 | 20.7302 (ASP) | 0.746 | Plastic | 1.544 | 56.0 | 7.15 |
| 8 | | −4.7239 (ASP) | 0.144 | | | | |
| 9 | Lens 4 | −6.0672 (ASP) | 0.380 | Plastic | 1.669 | 19.4 | −12.05 |
| 10 | | −25.1212 (ASP) | 0.691 | | | | |
| 11 | Lens 5 | −151.1131 (ASP) | 0.454 | Plastic | 1.566 | 37.4 | −15.61 |
| 12 | | 9.3944 (ASP) | 0.221 | | | | |
| 13 | Lens 6 | 2.9621 (ASP) | 0.711 | Plastic | 1.544 | 56.0 | 3.46 |
| 14 | | −4.7298 (ASP) | 0.688 | | | | |
| 15 | Lens 7 | 13.1613 (ASP) | 0.395 | Plastic | 1.534 | 56.0 | −3.25 |
| 16 | | 1.5169 (ASP) | 0.700 | | | | |
| 17 | Filter | Plano | 0.210 | Glass | 1.517 | 64.2 | — |
| 18 | | Plano | 0.375 | | | | |
| 19 | Image | Plano | — | | | | |

Note:

Reference wavelength is 587.6 nm (d-line).

An effective radius of the stop S1 (Surface 6) is 1.340 mm.

TABLE 24

| Aspheric Coefficients | | | | |
|---|---|---|---|---|
| Surface # | 1 | 2 | 4 | 5 |
| k = | 0.00000E+00 | 0.00000E+00 | 0.00000E+00 | 0.00000E+00 |
| A4 = | 2.84405829E-02 | 1.62102911E-01 | 1.10635687E-01 | -6.13919270E-02 |
| A6 = | -4.13432589E-03 | -3.76738715E-01 | -4.58021927E-01 | 7.01782767E-02 |
| A8 = | 8.27573500E-03 | 9.02522648E-01 | 1.30842391E+00 | -1.67028305E-01 |
| A10 = | -1.34357408E-02 | -1.52180890E+00 | -2.56468976E+00 | 3.57304625E-01 |
| A12 = | 1.55698714E-02 | 1.79171066E+00 | 3.48890131E+00 | -5.30719156E-01 |
| A14 = | -1.21139149E-02 | -1.46957074E+00 | -3.29772524E+00 | 5.25850301E-01 |
| A16 = | 6.18515698E-03 | 8.32829119E-01 | 2.14754825E+00 | -3.40278173E-01 |
| A18 = | -2.03772798E-03 | -3.18834423E-01 | -9.40133023E-01 | 1.37926795E-01 |
| A20 = | 4.16659187E-04 | 7.85591793E-02 | 2.62666997E-01 | -3.17019697E-02 |
| A22 = | -4.80751882E-05 | -1.12301048E-02 | -4.19908935E-02 | 3.14418059E-03 |
| A24 = | 2.39169037E-06 | 7.06979600E-04 | 2.89012428E-03 | — |
| Surface # | 7 | 8 | 9 | 10 |
| k = | 0.00000E+00 | 0.00000E+00 | 0.00000E+00 | 0.00000E+00 |
| A4 = | -1.73229043E-02 | -4.97212864E-02 | -9.52683199E-02 | -3.51631634E-02 |
| A6 = | 1.62474012E-02 | -2.24014993E-02 | 1.18230067E-01 | -1.87285348E-02 |
| A8 = | -8.01209140E-02 | 1.14485351E-01 | -3.87543000E-01 | 1.11084546E-01 |
| A10 = | 1.99802832E-01 | -2.61334924E-01 | 8.75861691E-01 | -2.59861270E-01 |
| A12 = | -3.09340028E-01 | 3.79468292E-01 | -1.29448068E+00 | 3.70055454E-01 |
| A14 = | 3.06307169E-01 | -3.73672279E-01 | 1.26336605E+00 | -3.50642352E-01 |
| A16 = | -1.95401157E-01 | 2.52050435E-01 | -8.13647213E-01 | 2.27089630E-01 |
| A18 = | 7.77516849E-02 | -1.15258692E-01 | 3.34590889E-01 | -1.00850916E-01 |
| A20 = | -1.75708859E-02 | 3.43591580E-02 | -7.92847377E-02 | 3.02022895E-02 |
| A22 = | 1.72228081E-03 | -6.05535612E-03 | 7.21926654E-03 | -5.82703114E-03 |
| A24 = | — | 4.79945216E-04 | 7.99376995E-04 | 6.53497891E-04 |
| A26 = | — | — | -1.71568308E-04 | -3.23328623E-05 |
| Surface # | 11 | 12 | 13 | 14 |
| k = | 0.00000E+00 | 0.00000E+00 | 0.00000E+00 | 0.00000E+00 |
| A4 = | -4.36926389E-02 | -3.24970075E-02 | 8.38870966E-02 | 1.72545010E-01 |
| A6 = | -5.65437471E-05 | -2.60971850E-01 | -1.90503528E-01 | -5.67124860E-02 |
| A8 = | 6.32415487E-02 | 5.45546665E-01 | 2.27560982E-01 | -1.66804576E-02 |
| A10 = | -1.03591554E-01 | -6.86322437E-01 | -2.08504597E-01 | 2.31817891E-02 |
| A12 = | 1.00369646E-01 | 6.03982291E-01 | 1.40363730E-01 | -1.04905438E-02 |
| A14 = | -6.70294737E-02 | -3.79605682E-01 | -6.85944297E-02 | 2.78228165E-03 |
| A16 = | 3.15991827E-02 | 1.71097542E-01 | 2.42978467E-02 | -4.78418823E-04 |
| A18 = | -1.04376283E-02 | -5.51470565E-02 | -6.21586021E-03 | 5.47339162E-05 |
| A20 = | 2.34783058E-03 | 1.25530891E-02 | 1.13296021E-03 | -4.13606216E-06 |
| A22 = | -3.40150707E-04 | -1.96387644E-03 | -1.42968154E-04 | 1.98386049E-07 |
| A24 = | 2.84428126E-05 | 2.00341782E-04 | 1.18325937E-05 | -5.47972511E-09 |
| A26 = | -1.03825946E-06 | -1.19725119E-05 | -5.76268809E-07 | 6.68701910E-11 |
| A28 = | — | 3.17358051E-07 | 1.24904288E-08 | -2.07417090E-14 |
| Surface # | 15 | 16 | | |
| k = | 0.00000E+00 | -1.00000E+00 | | |
| A4 = | -7.44835442E-02 | -1.79750263E-01 | | |
| A6 = | -1.17187465E-02 | 7.74339664E-02 | | |
| A8 = | 2.58195031E-02 | -2.81718091E-02 | | |
| A10 = | -1.47966142E-02 | 8.09209186E-03 | | |
| A12 = | 5.23158968E-03 | -1.77129994E-03 | | |
| A14 = | -1.21419753E-03 | 2.90286995E-04 | | |
| A16 = | 1.88857084E-04 | -3.52547695E-05 | | |
| A18 = | -1.99800505E-05 | 3.13616889E-06 | | |
| A20 = | 1.44053989E-06 | -2.00378081E-07 | | |
| A22 = | -6.94585694E-08 | 8.87956829E-09 | | |
| A24 = | 2.12117123E-09 | -2.55756190E-10 | | |
| A26 = | -3.57588850E-11 | 4.16488143E-12 | | |
| A28 = | 1.97279734E-13 | -2.39965161E-14 | | |
| A30 = | 1.51272177E-15 | -1.31246074E-16 | | |

In the 12th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 12th embodiment, so an explanation in this regard will not be provided again.

Moreover, these parameters can be calculated from Table 23 and Table 24 as the following values and satisfy the following conditions:

| 12th Embodiment | | | |
|---|---|---|---|
| f [mm] | 4.88 | f/f45 | −0.75 |
| Fno | 1.83 | f/f67 | 0.46 |
| HFOV [deg.] | 46.8 | f3/f5 | −0.46 |
| V2 + V3 + V6 + V7 | 223.9 | f5/f6 | −4.51 |
| V4/N4 | 11.65 | f5/f7 | 4.81 |
| (CT3 + CT4)/T34 | 7.82 | f6/R11 + f6/R12 | 0.44 |
| (CT4 + CT5)/T45 | 1.21 | Y72/Y11 | 2.15 |
| CT1/|f1| + CT2/|f2| | 0.04 | Yc61/Y61 | 0.65 |
| CT5/T67 | 0.66 | Yc62/Y62 | 0.68 |
| TL/ImgH | 1.34 | Yc72/Y72 | 0.44 |
| |R1/f| | 1.43 | — | — |

13th Embodiment

Figure 25:
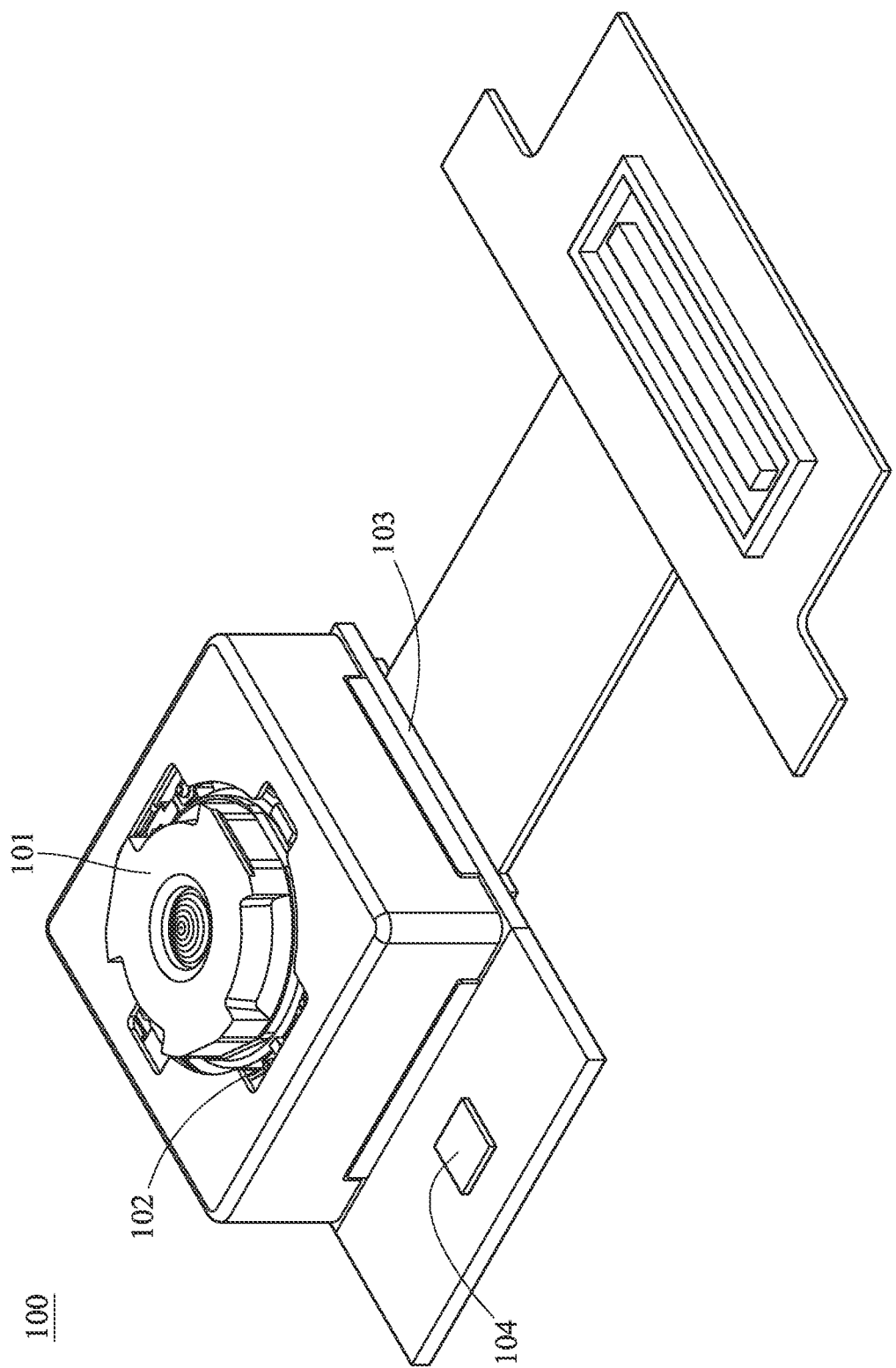
FIG. 25 is a perspective view of an image capturing unit according to the 13th embodiment of the present disclosure.

FIG. 25 is a perspective view of an image capturing unit according to the 13th embodiment of the present disclosure. In this embodiment, an image capturing unit 100 is a camera module including a lens unit 101, a driving device 102, an image sensor 103 and an image stabilizer 104. The lens unit 101 includes the optical photographing system disclosed in the 1st embodiment, a barrel and a holder member (their reference numerals are omitted) for holding the optical photographing system. However, the lens unit 101 may alternatively be provided with the optical photographing system disclosed in other embodiments of the present disclosure, and the present disclosure is not limited thereto. The imaging light converges in the lens unit 101 of the image capturing unit 100 to generate an image with the driving device 102 utilized for image focusing on the image sensor 103, and the generated image is then digitally transmitted to other electronic component for further processing.

The driving device 102 can have auto focusing functionality, and different driving configurations can be obtained through the usages of voice coil motors (VCM), micro electro-mechanical systems (MEMS), piezoelectric systems, or shape memory alloy materials. The driving device 102 is favorable for obtaining a better imaging position of the lens unit 101, so that a clear image of the imaged object can be captured by the lens unit 101 with different object distances. The image sensor 103 (for example, CCD or CMOS), which can feature high photosensitivity and low noise, is disposed on the image surface of the optical photographing system to provide higher image quality.

The image stabilizer 104, such as an accelerometer, a gyro sensor and a Hall Effect sensor, is configured to work with the driving device 102 to provide optical image stabilization (OIS). The driving device 102 working with the image stabilizer 104 is favorable for compensating for pan and tilt of the lens unit 101 to reduce blurring associated with motion during exposure. In some cases, the compensation can be provided by electronic image stabilization (EIS) with image processing software, thereby improving image quality while in motion or low-light conditions.

14th Embodiment

Figure 26:
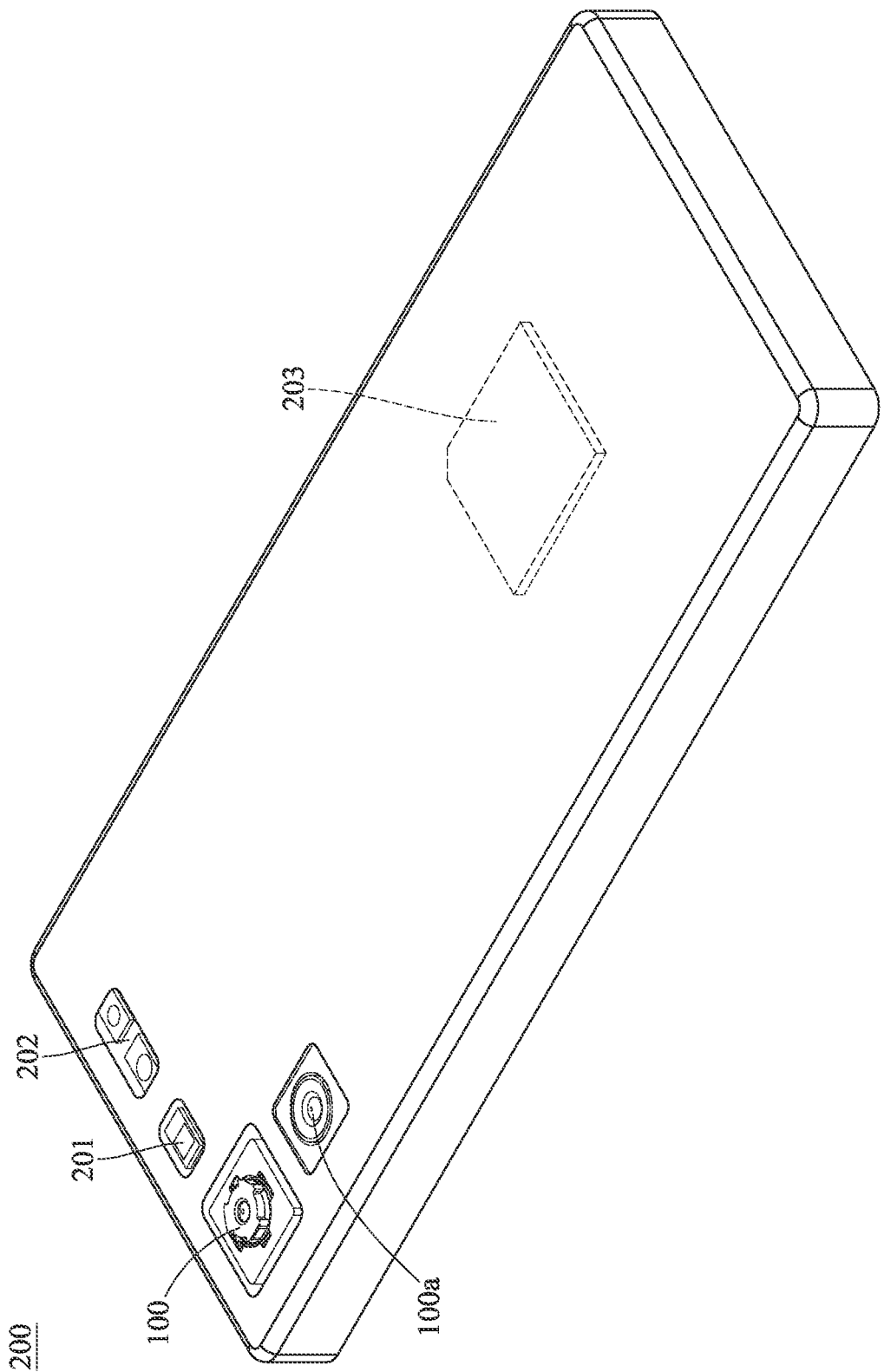
FIG. 26 is one perspective view of an electronic device according to the 14th embodiment of the present disclosure.
Figure 27:
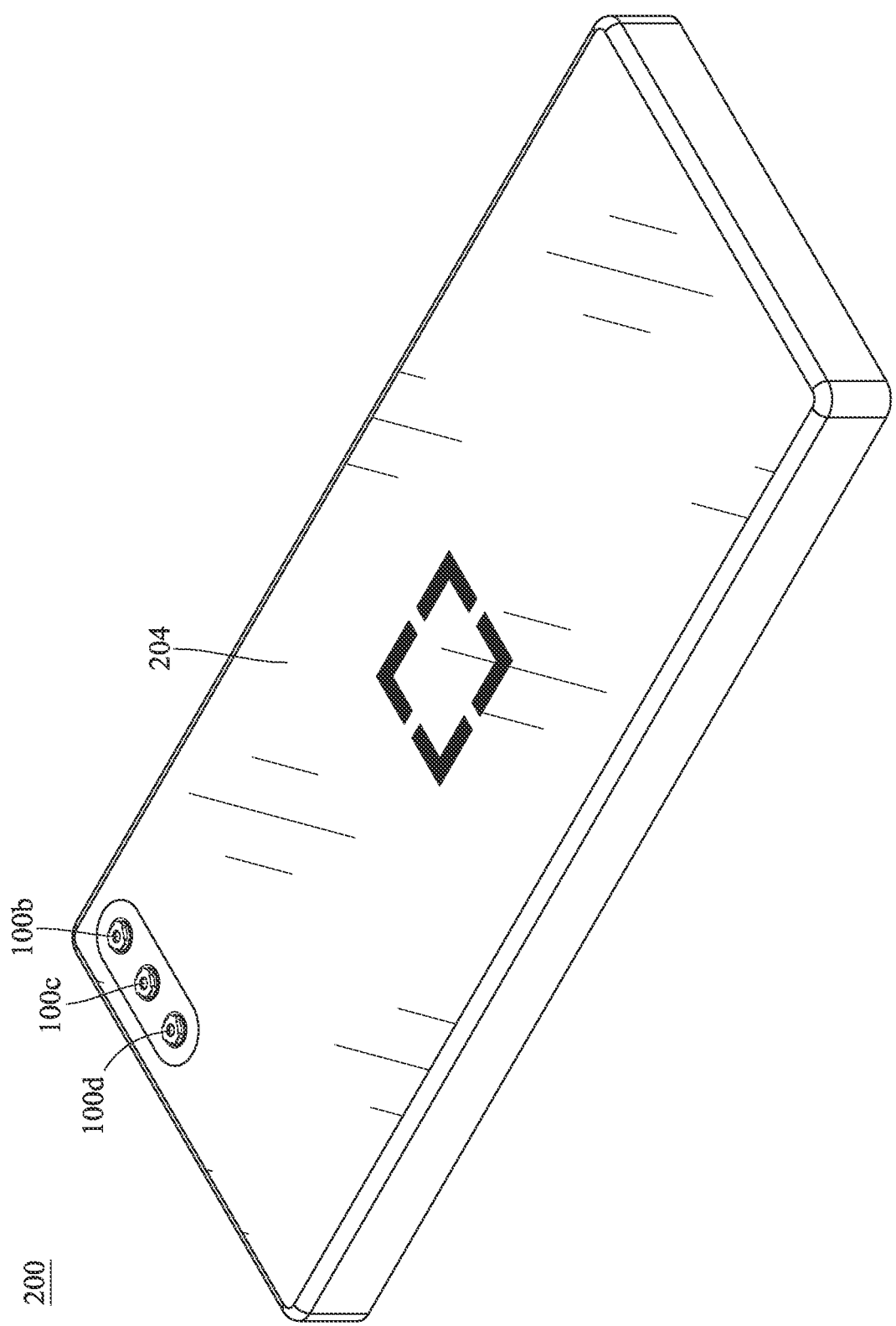
FIG. 27 is another perspective view of the electronic device in FIG. 26.
Figure 28:
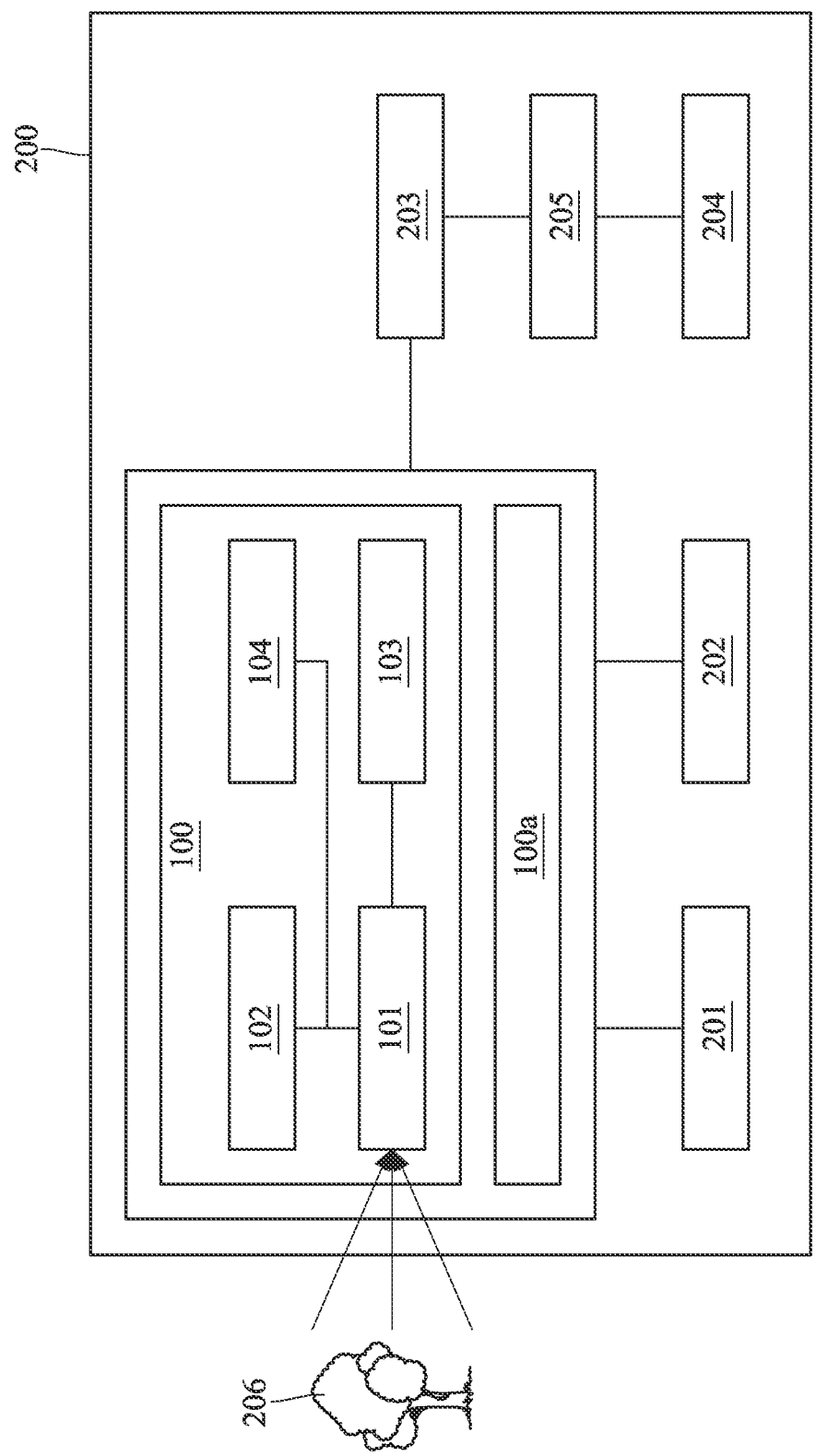
FIG. 28 is a block diagram of the electronic device in FIG. 26.

FIG. 26 is one perspective view of an electronic device according to the 14th embodiment of the present disclosure. FIG. 27 is another perspective view of the electronic device in FIG. 26. FIG. 28 is a block diagram of the electronic device in FIG. 26.

In this embodiment, an electronic device 200 is a smartphone including the image capturing unit 100 disclosed in the 13th embodiment, an image capturing unit 100a, an image capturing unit 100b, an image capturing unit 100c, an image capturing unit 100d, a flash module 201, a focus assist module 202, an image signal processor 203, a display module 204 and an image software processor 205. The image capturing unit 100 and the image capturing unit 100a are disposed on the same side of the electronic device 200. The focus assist module 202 can be a laser rangefinder or a ToF (time of flight) module, but the present disclosure is not limited thereto. The image capturing unit 100b, the image capturing unit 100c, the image capturing unit 100d and the display module 204 are disposed on the opposite side of the electronic device 200, and the display module 204 can be a user interface, such that the image capturing units 100b, 100c, 100d can be front-facing cameras of the electronic device 200 for taking selfies, but the present disclosure is not limited thereto. Furthermore, each of the image capturing units 100a, 100b, 100c and 100d can include the optical photographing system of the present disclosure and can have a configuration similar to that of the image capturing unit 100. In detail, each of the image capturing units 100a, 100b, 100c and 100d can include a lens unit, a driving device, an image sensor and an image stabilizer, and each of the lens unit can include an optical lens assembly such as the optical photographing system of the present disclosure, a barrel and a holder member for holding the optical lens assembly.

The image capturing unit 100 is a wide-angle image capturing unit, the image capturing unit 100a is an ultra-wide-angle image capturing unit, the image capturing unit 100b is a wide-angle image capturing unit, the image capturing unit 100c is an ultra-wide-angle image capturing unit, and the image capturing unit 100d is a ToF image capturing unit. In this embodiment, the image capturing units 100, 100a, 100b and 100c have different fields of view, such that the electronic device 200 can have various magnification ratios so as to meet the requirement of optical zoom functionality. In addition, the image capturing unit 100d can determine depth information of the imaged object. In this embodiment, the electronic device 200 includes multiple image capturing units 100, 100a, 100b, 100c and 100d, but the present disclosure is not limited to the number and arrangement of image capturing units.

When a user captures images of an object 206, the light rays converge in the image capturing unit 100 or the image capturing unit 100a to generate images, and the flash module 201 is activated for light supplement. The focus assist module 202 detects the object distance of the imaged object 206 to achieve fast auto focusing. The image signal processor 203 is configured to optimize the captured image to improve image quality. The light beam emitted from the focus assist module 202 can be either conventional infrared or laser. In addition, the light rays may converge in the image capturing unit 100b, 100c or 100d to generate images. The display module 204 can include a touch screen, and the user is able to interact with the display module 204 and the image software processor 205 having multiple functions to capture images and complete image processing. Alternatively, the user may capture images via a physical button. The image processed by the image software processor 205 can be displayed on the display module 204.

15th Embodiment

Figure 29:
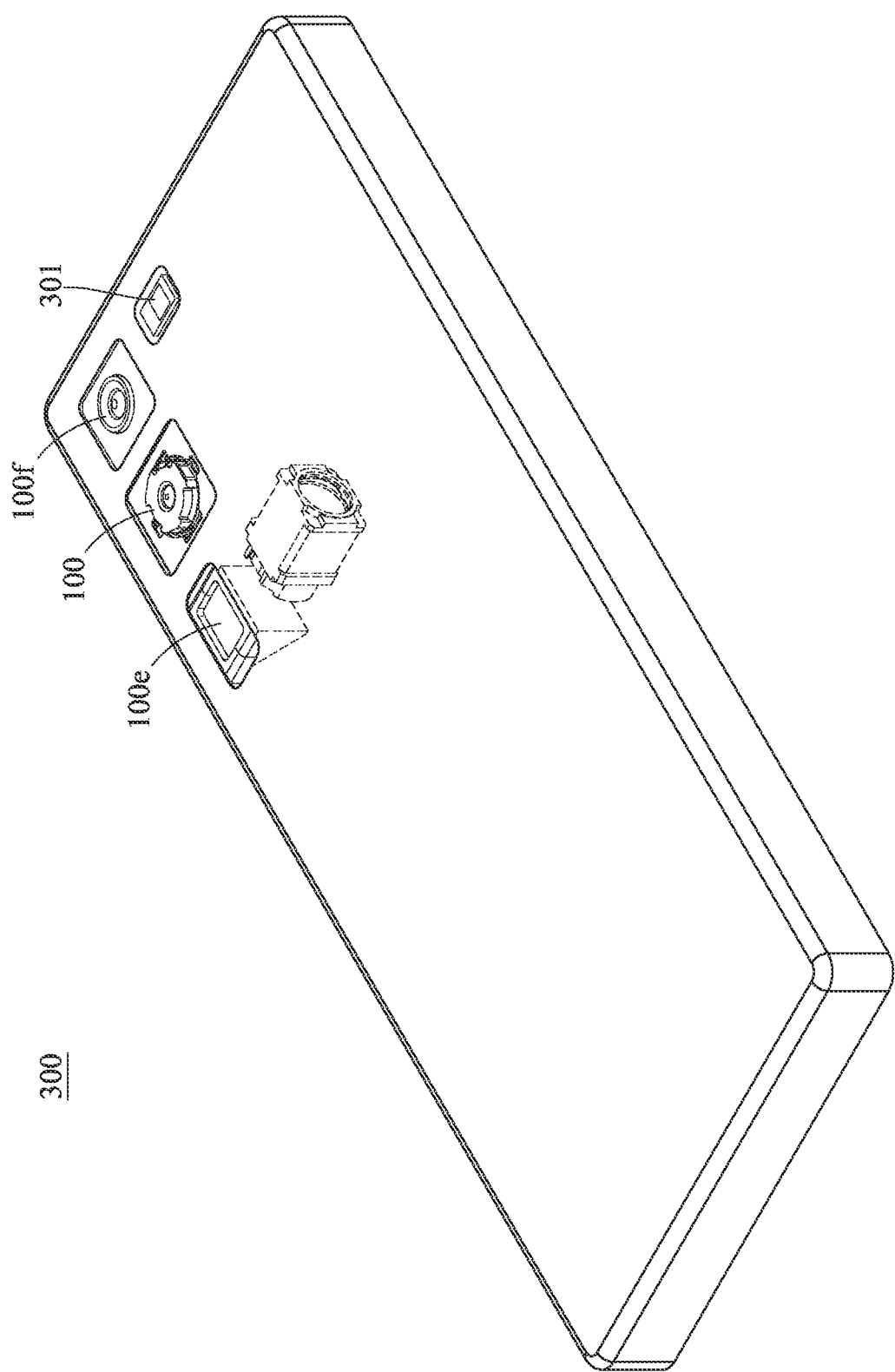
FIG. 29 is one perspective view of an electronic device according to the 15th embodiment of the present disclosure.

FIG. 29 is one perspective view of an electronic device according to the 15th embodiment of the present disclosure.

In this embodiment, an electronic device 300 is a smartphone including the image capturing unit 100 disclosed in the 13th embodiment, an image capturing unit 100e, an image capturing unit 100f, a flash module 301, a focus assist module, an image signal processor, a display module and an image software processor (not shown). The image capturing unit 100, the image capturing unit 100e and the image capturing unit 100f are disposed on the same side of the electronic device 300, while the display module is disposed on the opposite side of the electronic device 300. Furthermore, each of the image capturing units 100e and 100f can include the optical photographing system of the present disclosure and can have a configuration similar to that of the image capturing unit 100, and the details in this regard will not be provided again.

The image capturing unit 100 is a wide-angle image capturing unit, the image capturing unit 100e is a telephoto image capturing unit, and the image capturing unit 100f is an ultra-wide-angle image capturing unit. In this embodiment, the image capturing units 100, 100e and 100f have different fields of view, such that the electronic device 300 can have various magnification ratios so as to meet the requirement of optical zoom functionality. Moreover, the image capturing unit 100e can be a telephoto image capturing unit having a light-folding element configuration, such that the total track length of the image capturing unit 100e is not limited by the thickness of the electronic device 300. Moreover, the light-folding element configuration of the image capturing unit 100e can be similar to, for example, one of the structures shown in FIG. 32 to FIG. 34, which can be referred to foregoing descriptions corresponding to FIG. 32 to FIG. 34, and the details in this regard will not be provided again. In this embodiment, the electronic device 300 includes multiple image capturing units 100, 100e and 100f, but the present disclosure is not limited to the number and arrangement of image capturing units. When a user captures images of an object, light rays converge in the image capturing unit 100, 100e or 100f to generate images, and the flash module 301 is activated for light supplement. Further, the subsequent processes are performed in a manner similar to the abovementioned embodiment, so the details in this regard will not be provided again.

16th Embodiment

Figure 30:
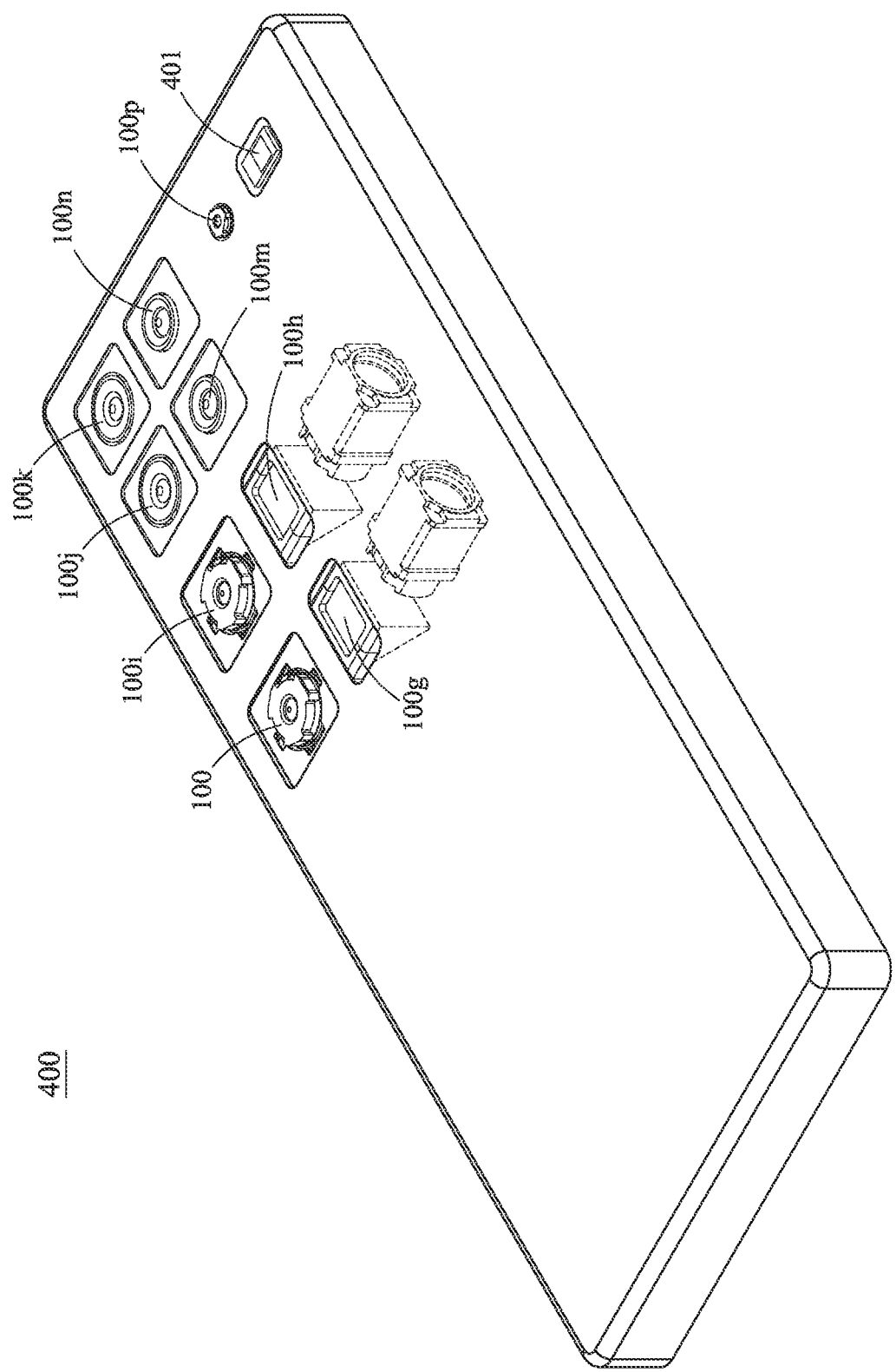
FIG. 30 is one perspective view of an electronic device according to the 16th embodiment of the present disclosure.

FIG. 30 is one perspective view of an electronic device according to the 16th embodiment of the present disclosure.

In this embodiment, an electronic device 400 is a smartphone including the image capturing unit 100 disclosed in the 13th embodiment, an image capturing unit 100g, an image capturing unit 100h, an image capturing unit 100i, an image capturing unit 100j, an image capturing unit 100k, an image capturing unit 100m, an image capturing unit 100n, an image capturing unit 100p, a flash module 401, a focus assist module, an image signal processor, a display module and an image software processor (not shown). The image capturing units 100, 100g, 100h, 100i, 100j, 100k, 100m, 100n and 100p are disposed on the same side of the electronic device 400, while the display module is disposed on the opposite side of the electronic device 400. Furthermore, each of the image capturing units 100g, 100h, 100i, 100j, 100k, 100m, 100n and 100p can include the optical photographing system of the present disclosure and can have a configuration similar to that of the image capturing unit 100, and the details in this regard will not be provided again.

The image capturing unit 100 is a wide-angle image capturing unit, the image capturing unit 100g is a telephoto image capturing unit, the image capturing unit 100h is a telephoto image capturing unit, the image capturing unit 100i is a wide-angle image capturing unit, the image capturing unit 100j is an ultra-wide-angle image capturing unit, the image capturing unit 100k is an ultra-wide-angle image capturing unit, the image capturing unit 100m is a telephoto image capturing unit, the image capturing unit 100n is a telephoto image capturing unit, and the image capturing unit 100p is a ToF image capturing unit. In this embodiment, the image capturing units 100, 100g, 100h, 100i, 100j, 100k, 100m and 100n have different fields of view, such that the electronic device 400 can have various magnification ratios so as to meet the requirement of optical zoom functionality. Moreover, each of the image capturing units 100g and 100h can be a telephoto image capturing unit having a light-folding element configuration. Moreover, the light-folding element configuration of each of the image capturing unit 100g and 100h can be similar to, for example, one of the structures shown in FIG. 32 to FIG. 34, which can be referred to foregoing descriptions corresponding to FIG. 32 to FIG. 34, and the details in this regard will not be provided again. In addition, the image capturing unit 100p can determine depth information of the imaged object. In this embodiment, the electronic device 400 includes multiple image capturing units 100, 100g, 100h, 100i, 100j, 100k, 100m, 100n and 100p, but the present disclosure is not limited to the number and arrangement of image capturing units. When a user captures images of an object, the light rays converge in the image capturing unit 100, 100g, 100h, 100i, 100j, 100k, 100m, 100n or 100p to generate images, and the flash module 401 is activated for light supplement. Further, the subsequent processes are performed in a manner similar to the abovementioned embodiments, and the details in this regard will not be provided again.

The smartphone in this embodiment is only exemplary for showing the image capturing unit of the present disclosure installed in an electronic device, and the present disclosure is not limited thereto. The image capturing unit can be optionally applied to optical systems with a movable focus. Furthermore, the optical photographing system of the image capturing unit features good capability in aberration corrections and high image quality, and can be applied to 3D (three-dimensional) image capturing applications, in products such as digital cameras, mobile devices, digital tablets, smart televisions, network surveillance devices, dashboard cameras, vehicle backup cameras, multi-camera devices, image recognition systems, motion sensing input devices, wearable devices and other electronic imaging devices.

The foregoing description, for the purpose of explanation, has been described with reference to specific embodiments. It is to be noted that TABLES 1-24 show different data of the different embodiments; however, the data of the different embodiments are obtained from experiments. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the present disclosure to the precise forms disclosed. Many modifications and variations are possible in view of the above teachings.

What is claimed is:

1. An optical photographing system comprising seven lens elements, the seven lens elements being, in order from an object side to an image side along an optical path, a first lens element, a second lens element, a third lens element, a fourth lens element, a fifth lens element, a sixth lens element and a seventh lens element, and each of the seven lens elements having an object-side surface facing toward the object side and an image-side surface facing toward the image side;
   wherein the object-side surface of the fourth lens element is concave in a paraxial region thereof, the image-side surface of the fourth lens element is convex in a paraxial region thereof, the sixth lens element has positive refractive power, the object-side surface of the sixth lens element is convex in a paraxial region thereof, the image-side surface of the sixth lens element is concave in a paraxial region thereof, the object-side surface of the seventh lens element is convex in a paraxial region thereof, and at least one of the object-side surface and the image-side surface of at least one lens element of the optical photographing system has at least one inflection point;
   wherein a central thickness of the fourth lens element is CT4, a central thickness of the fifth lens element is CT5, an axial distance between the fourth lens element and the fifth lens element is T45, an Abbe number of the second lens element is V2, an Abbe number of the third lens element is V3, an Abbe number of the sixth lens element is V6, an Abbe number of the seventh lens element is V7, a focal length of the optical photographing system is f, a composite focal length of the fourth lens element and the fifth lens element is f45, and the following conditions are satisfied:

$4.0<(CT4+CT5)/T45<90;$ $205.0<V2+V3+V6+V7<260.0;$ and $-1.0<f/f45<-0.55.$

2. The optical photographing system of claim 1, wherein the central thickness of the fourth lens element is CT4, the central thickness of the fifth lens element is CT5, the axial distance between the fourth lens element and the fifth lens element is T45, and the following condition is satisfied:

$5.5<(CT4+CT5)/T45<60.$

3. The optical photographing system of claim 1, wherein the Abbe number of the second lens element is V2, the Abbe number of the third lens element is V3, the Abbe number of the sixth lens element is V6, the Abbe number of the seventh lens element is V7, and the following condition is satisfied:

$210.0<V2+V3+V6+V7<240.0.$

4. The optical photographing system of claim 1, wherein an axial distance between the object-side surface of the first lens element and an image surface is TL, a maximum image height of the optical photographing system is ImgH, half of a maximum field of view of the optical photographing system is HFOV, and the following conditions are satisfied:

$1.0<TL/ImgH<1.6;$ and $42.5[\text{deg.}]<HFOV<70.0[\text{deg.}].$

5. The optical photographing system of claim 1, wherein the focal length of the optical photographing system is f, a composite focal length of the sixth lens element and the seventh lens element is f67, and the following condition is satisfied:

$0.36<f/f67<1.2.$

6. The optical photographing system of claim 1, wherein a focal length of the third lens element is f3, a focal length of the fifth lens element is f5, and the following condition is satisfied:

$-2.2<f3/f5<-0.20.$

7. The optical photographing system of claim 1, wherein the object-side surface of the second lens element is convex in a paraxial region thereof, and the image-side surface of the third lens element is convex in a paraxial region thereof.

8. The optical photographing system of claim 7, wherein a central thickness of the first lens element is CT1, a central thickness of the second lens element is CT2, a focal length of the first lens element is f1, a focal length of the second lens element is f2, a focal length of the sixth lens element is f6, a curvature radius of the object-side surface of the sixth lens element is R11, a curvature radius of the image-side surface of the sixth lens element is R12, and the following conditions are satisfied:

$CT1/|f1|+CT2/|f2|<0.10;$ and $0<f6/R11+f6/R12<4.0.$

9. The optical photographing system of claim 7, wherein a central thickness of the third lens element is CT3, the central thickness of the fourth lens element is CT4, an axial distance between the third lens element and the fourth lens element is T34, and the following condition is satisfied:

$1.65<(CT3+CT4)/T34<25.0.$

10. The optical photographing system of claim 1, further comprising an aperture stop, wherein the aperture stop is located between the first lens element and the second lens element, the image-side surface of the second lens element is concave in a paraxial region thereof, the third lens element has positive refractive power, a vertical distance between a convex critical point on the image-side surface of the sixth lens element and an optical axis is Yc62, a maximum effective radius of the image-side surface of the sixth lens element is Y62, and at least one convex critical point on the image-side surface of the sixth lens element in an off-axis region satisfies the following condition:

$0.40<Yc62/Y62<0.85.$

11. The optical photographing system of claim 1, wherein the fifth lens element has negative refractive power, a focal length of the fifth lens element is f5, a focal length of the sixth lens element is f6, and the following condition is satisfied:

$-9.0<f5/f6<0.$

12. The optical photographing system of claim 1, wherein the fifth lens element has negative refractive power, the seventh lens element has negative refractive power, the image-side surface of the seventh lens element is concave in a paraxial region thereof, a focal length of the fifth lens element is f5, a focal length of the seventh lens element is f7, and the following condition is satisfied:

$0.25<f5/f7<9.0.$

13. An image capturing unit, comprising:
the optical photographing system of claim 1; and
an image sensor disposed on an image surface of the optical photographing system.

14. An electronic device, comprising:
the image capturing unit of claim 13.

15. An optical photographing system comprising seven lens elements, the seven lens elements being, in order from an object side to an image side along an optical path, a first lens element, a second lens element, a third lens element, a fourth lens element, a fifth lens element, a sixth lens element and a seventh lens element, and each of the seven lens elements having an object-side surface facing toward the object side and an image-side surface facing toward the image side;
wherein the object-side surface of the first lens element is convex in a paraxial region thereof, the object-side surface of the second lens element is convex in a paraxial region thereof, the image-side surface of the third lens element is convex in a paraxial region thereof, the object-side surface of the fourth lens element is concave in a paraxial region thereof, the image-side surface of the fourth lens element is convex in a paraxial region thereof, the object-side surface of the fifth lens element is concave in a paraxial region thereof, the sixth lens element has positive refractive power, the object-side surface of the sixth lens element is convex in a paraxial region thereof, the seventh lens element has negative refractive power, the object-side surface of the seventh lens element is convex in a paraxial region thereof, the image-side surface of the seventh lens element is concave in a paraxial region thereof, and at least one of the object-side surface and the image-side surface of at least one lens element of the optical photographing system has at least one inflection point;
wherein a central thickness of the fourth lens element is CT4, a central thickness of the fifth lens element is CT5, an axial distance between the fourth lens element and the fifth lens element is T45, a curvature radius of the object-side surface of the first lens element is R1, a focal length of the optical photographing system is f, a composite focal length of the sixth lens element and the seventh lens element is f67, and the following conditions are satisfied:

$4.0 < (CT4+CT5)/T45 < 90;$ $0.90 < R1/f < 40;$ and $0.36 < f/f67 < 1.2.$

16. The optical photographing system of claim 15, wherein the central thickness of the fourth lens element is CT4, the central thickness of the fifth lens element is CT5, the axial distance between the fourth lens element and the fifth lens element is T45, the curvature radius of the object-side surface of the first lens element is R1, the focal length of the optical photographing system is f, and the following conditions are satisfied:

$5.5 < (CT4+CT5)/T45 < 60;$ and $1.0 < |R1|/f < 30.$

17. The optical photographing system of claim 15, wherein the focal length of the optical photographing system is f, a composite focal length of the fourth lens element and the fifth lens element is f45, and the following condition is satisfied:

$-1.0 < f/f45 < -0.55.$

18. The optical photographing system of claim 15, wherein an Abbe number of the fourth lens element is V4, a refractive index of the fourth lens element is N4, an f-number of the optical photographing system is Fno, a maximum effective radius of the object-side surface of the first lens element is Y11, a maximum effective radius of the image-side surface of the seventh lens element is Y72, and the following conditions are satisfied:

$5.5 < V4/N4 < 12;$ $1.2 < Fno < 2.0;$ and $1.6 < Y72/Y11 < 3.5.$

19. The optical photographing system of claim 15, wherein the fifth lens element has negative refractive power, a vertical distance between a convex critical point on the image-side surface of the seventh lens element and an optical axis is Yc72, a maximum effective radius of the image-side surface of the seventh lens element is Y72, and at least one convex critical point on the image-side surface of the seventh lens element in an off-axis region satisfies the following condition:

$0.25 < Yc72/Y72 < 0.65.$

20. An optical photographing system comprising seven lens elements, the seven lens elements being, in order from an object side to an image side along an optical path, a first lens element, a second lens element, a third lens element, a fourth lens element, a fifth lens element, a sixth lens element and a seventh lens element, and each of the seven lens elements having an object-side surface facing toward the object side and an image-side surface facing toward the image side;
wherein the second lens element has positive refractive power, the object-side surface of the second lens element is convex in a paraxial region thereof, the image-side surface of the third lens element is convex in a paraxial region thereof, the fourth lens element has negative refractive power, the object-side surface of the fourth lens element is concave in a paraxial region thereof, the object-side surface of the sixth lens element is convex in a paraxial region thereof, the seventh lens element has negative refractive power, and at least one of the object-side surface and the image-side surface of at least one lens element of the optical photographing system has at least one inflection point;
wherein a central thickness of the fourth lens element is CT4, a central thickness of the fifth lens element is CT5, an axial distance between the fourth lens element and the fifth lens element is T45, an Abbe number of the second lens element is V2, an Abbe number of the third lens element is V3, an Abbe number of the sixth lens element is V6, an Abbe number of the seventh lens element is V7, and the following conditions are satisfied:

$0.70 < (CT4+CT5)/T45 < 1.4;$ and $205.0 < V2+V3+V6+V7 < 260.0.$

21. The optical photographing system of claim 20, wherein the central thickness of the fourth lens element is CT4, the central thickness of the fifth lens element is CT5, the axial distance between the fourth lens element and the fifth lens element is T45, the Abbe number of the second lens element is V2, the Abbe number of the third lens element is V3, the Abbe number of the sixth lens element is V6, the Abbe number of the seventh lens element is V7, and the following conditions are satisfied:

$1.0 < (CT4+CT5)/T45 < 1.4$; and $210.0 < V2+V3+V6+V7 < 240.0$.

22. The optical photographing system of claim 20, wherein the central thickness of the fifth lens element is CT5, an axial distance between the sixth lens element and the seventh lens element is T67, and the following condition is satisfied:

$0.55 < CT5/T67 < 1.5$;

wherein a vertical distance between a concave critical point on the object-side surface of the sixth lens element and an optical axis is Yc61, a maximum effective radius of the object-side surface of the sixth lens element is Y61, and at least one concave critical point on the object-side surface of the sixth lens element in an off-axis region satisfies the following condition:

$0.40 < Yc61/Y61 < 0.85$.

* * * * *

UNITED STATES PATENT AND TRADEMARK OFFICE
CERTIFICATE OF CORRECTION

PATENT NO. : 12,099,257 B2
APPLICATION NO. : 17/537870
DATED : September 24, 2024
INVENTOR(S) : Jin Sen Wang et al.

It is certified that error appears in the above-identified patent and that said Letters Patent is hereby corrected as shown below:

In the Claims

Column 73, Line 51 (Claim 15) delete:
"$0.90 < R1/f < 40$; and"
And insert therefor:
--$0.90 < |R1/f| < 40$; and--

Column 73, Line 67 (Claim 16) delete:
"$1.0 < |R1/f < 30$."
And insert therefor:
--$1.0 < |R1/f| < 30$.--

Signed and Sealed this
Twelfth Day of November, 2024

Katherine Kelly Vidal
*Director of the United States Patent and Trademark Office*